United States Patent
Onuki et al.

(10) Patent No.: US 9,001,262 B2
(45) Date of Patent: Apr. 7, 2015

(54) IMAGE SENSOR AND IMAGE CAPTURING APPARATUS

(75) Inventors: Ichiro Onuki, Kawasaki (JP); Koichi Fukuda, Tokyo (JP); Akihiro Nishio, Yokohama (JP); Hideaki Yamamoto, Kawasaki (JP); Ryo Yamasaki, Tokyo (JP); Makoto Oikawa, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 158 days.

(21) Appl. No.: 13/476,161

(22) Filed: May 21, 2012

(65) Prior Publication Data

US 2012/0300104 A1    Nov. 29, 2012

(30) Foreign Application Priority Data

May 26, 2011   (JP) ................................. 2011-118397
Mar. 1, 2012   (JP) ................................. 2012-045788

(51) Int. Cl.
- G03B 13/00    (2006.01)
- H04N 5/232    (2006.01)
- H04N 5/228    (2006.01)
- H04N 3/14     (2006.01)
- H04N 5/335    (2011.01)
- H04N 13/02    (2006.01)
- H04N 5/369    (2011.01)

(52) U.S. Cl.
CPC ....... *H04N 13/0217* (2013.01); *H04N 5/23212* (2013.01); *H04N 5/3696* (2013.01)

(58) Field of Classification Search
USPC ................ 250/208.1; 348/266–324, 335–357
See application file for complete search history.

(56) References Cited

U.S. PATENT DOCUMENTS

| 6,781,632 B1* | 8/2004 | Ide ................................ 348/345 |
| 6,819,360 B1* | 11/2004 | Ide et al. ........................ 348/340 |
| 7,711,261 B2* | 5/2010 | Kusaka ......................... 396/111 |
| 7,715,703 B2* | 5/2010 | Utagawa et al. .............. 396/111 |
| 7,978,255 B2* | 7/2011 | Suzuki .......................... 348/350 |
| 8,036,523 B2* | 10/2011 | Kusaka ......................... 396/128 |

(Continued)

FOREIGN PATENT DOCUMENTS

| CN | 101158743 A | 4/2008 |
| CN | 101630110 A | 1/2010 |

(Continued)

OTHER PUBLICATIONS

Jan. 21, 2015 Chinese Office Action, issued in Chinese Patent Application No. 201210170098.6.

*Primary Examiner* — Michael Osinski
(74) *Attorney, Agent, or Firm* — Cowan, Liebowitz & Latman, P.C.

(57) ABSTRACT

An image sensor comprises a first imaging pixel and a second imaging pixel each of which detects an object image formed by a photographing optical system and generates a recording image. Each of the first imaging pixel and the second imaging pixel comprises a plurality of photoelectric conversion units segmented in a first direction, the plurality of photoelectric conversion units have an ability of photoelectrically converting images formed by split light beams out of a light beam from the photographing optical system and outputting focus detection signals to be used to detect a phase difference. A base-line length of photoelectric conversion units to be used to detect the phase difference included in the first imaging pixel is longer than that of photoelectric conversion units to be used to detect the phase difference included in the second imaging pixel.

7 Claims, 30 Drawing Sheets

(56) References Cited

U.S. PATENT DOCUMENTS

| | | | |
|---|---|---|---|
| 8,049,801 B2* | 11/2011 | Kusaka | 348/302 |
| 8,072,529 B2* | 12/2011 | Murakami | 348/335 |
| 8,098,321 B2* | 1/2012 | Shimoda et al. | 348/349 |
| 8,139,144 B2* | 3/2012 | Utagawa | 348/352 |
| 8,218,962 B2* | 7/2012 | Fujii et al. | 396/100 |
| 8,304,708 B2* | 11/2012 | Shimoda et al. | 250/208.1 |
| 8,305,483 B2* | 11/2012 | Fujii et al. | 348/345 |
| 8,405,760 B2* | 3/2013 | Yamasaki | 348/349 |
| 8,416,336 B2* | 4/2013 | Utagawa et al. | 348/345 |
| 8,441,545 B2* | 5/2013 | Hoda et al. | 348/222.1 |
| 8,466,998 B2* | 6/2013 | Suzuki | 348/350 |
| 8,614,755 B2* | 12/2013 | Takamiya et al. | 348/277 |
| 2002/0036257 A1* | 3/2002 | Yamashita et al. | 250/208.1 |
| 2007/0206940 A1* | 9/2007 | Kusaka | 396/128 |
| 2008/0084483 A1* | 4/2008 | Kusaka | 348/222.1 |
| 2008/0259202 A1* | 10/2008 | Fujii | 348/345 |
| 2009/0140122 A1* | 6/2009 | Suzuki | 250/201.2 |
| 2009/0148147 A1* | 6/2009 | Fujii et al. | 396/128 |
| 2009/0174806 A1* | 7/2009 | Utagawa | 348/345 |
| 2009/0295964 A1* | 12/2009 | Utagawa et al. | 348/302 |
| 2010/0176273 A1* | 7/2010 | Shimoda et al. | 250/208.1 |
| 2010/0238330 A1* | 9/2010 | Hirota | 348/273 |
| 2010/0238343 A1* | 9/2010 | Kawarada | 348/345 |
| 2011/0169997 A1* | 7/2011 | Nagano et al. | 348/340 |
| 2011/0228145 A1* | 9/2011 | Kimura | 348/247 |
| 2011/0317042 A1* | 12/2011 | Goto | 348/241 |
| 2012/0249846 A1* | 10/2012 | Nishio et al. | 348/294 |
| 2013/0021517 A1* | 1/2013 | Ui et al. | 348/345 |
| 2013/0076970 A1* | 3/2013 | Kishi | 348/349 |
| 2013/0076972 A1* | 3/2013 | Okita | 348/360 |
| 2013/0140663 A1* | 6/2013 | Fukuda | 257/432 |
| 2013/0250164 A1* | 9/2013 | Aoki | 348/348 |
| 2013/0258170 A1* | 10/2013 | Tamaki | 348/349 |
| 2013/0335608 A1* | 12/2013 | Kono | 348/302 |
| 2014/0001589 A1* | 1/2014 | Fukuda | 257/432 |

FOREIGN PATENT DOCUMENTS

| | | |
|---|---|---|
| CN | 101854473 A | 6/2010 |
| JP | 09-046596 | 2/1997 |
| JP | 2007-158692 | 6/2007 |
| JP | 2007-279312 | 10/2007 |
| JP | 2009-015164 | 1/2009 |
| WO | 2010/131725 A | 11/2010 |

* cited by examiner

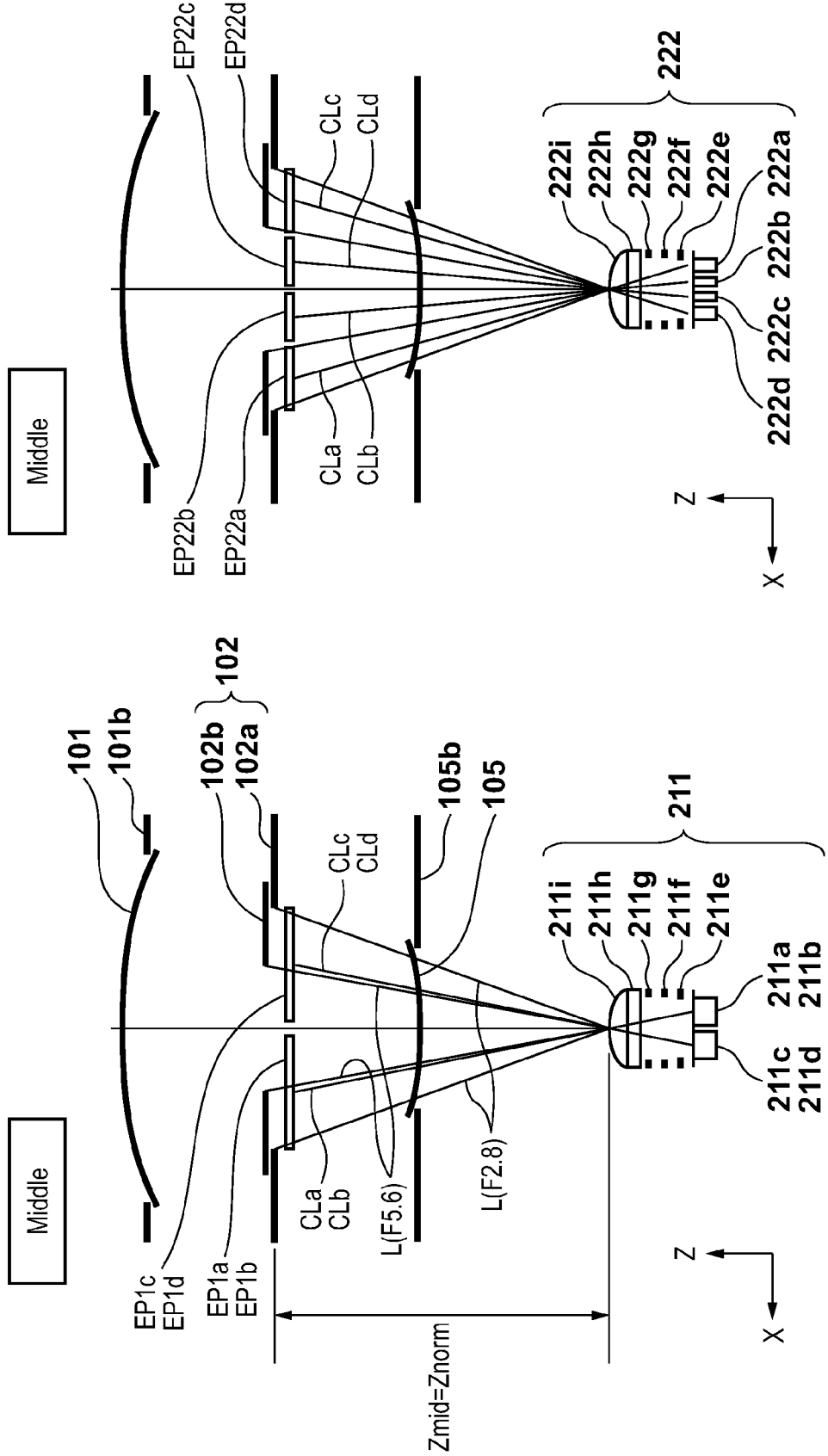

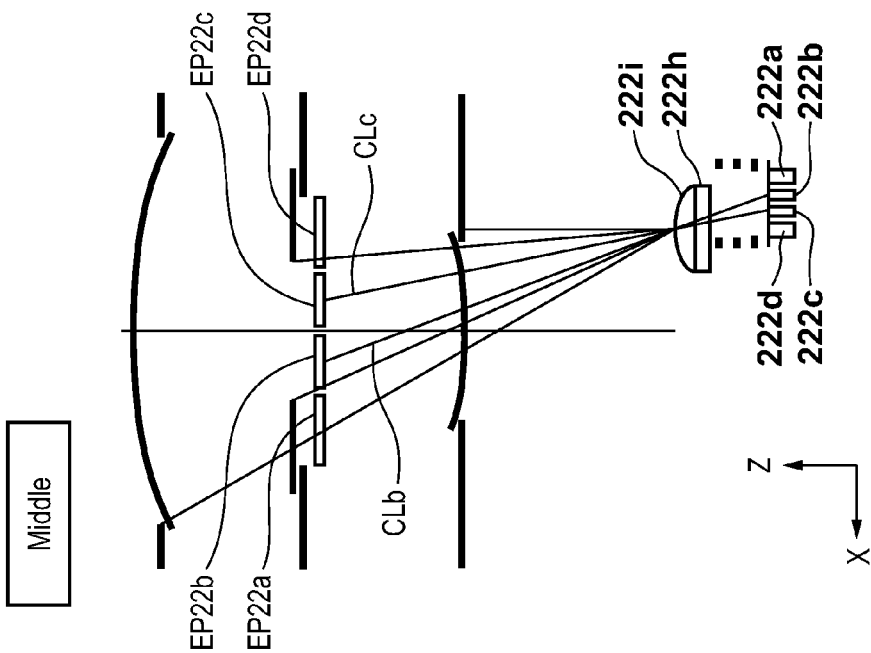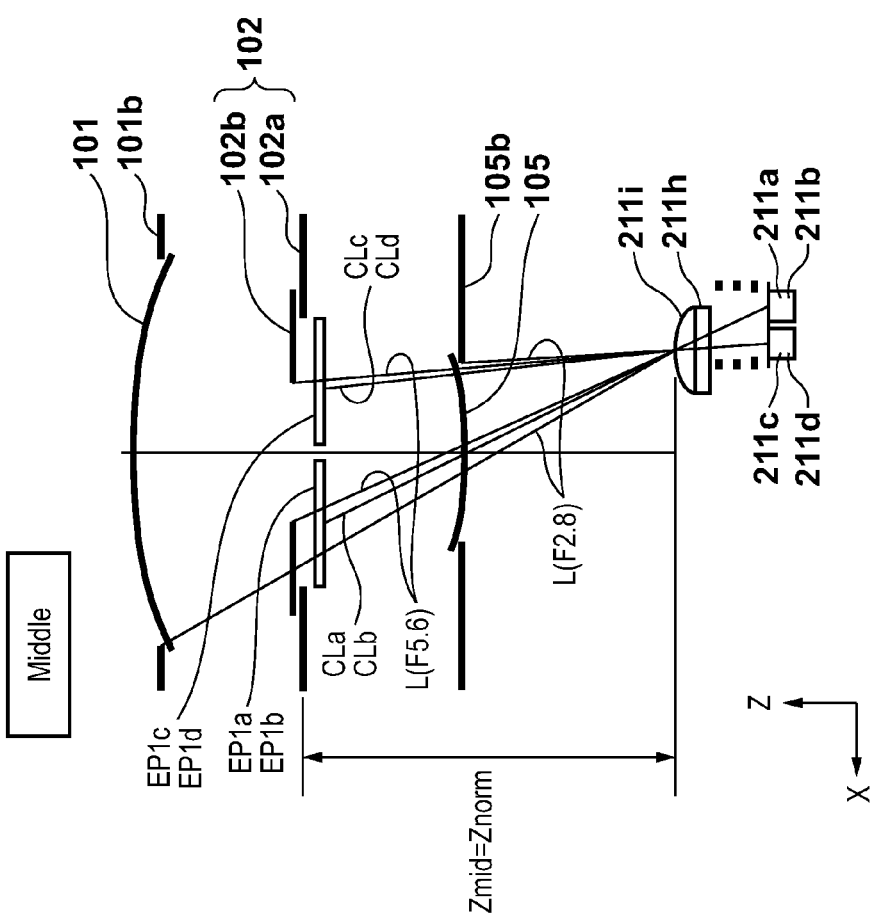

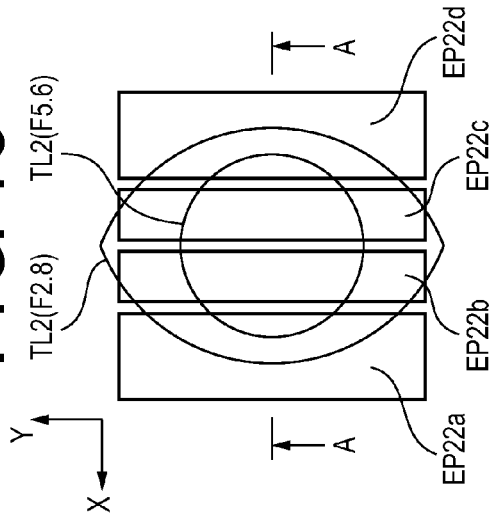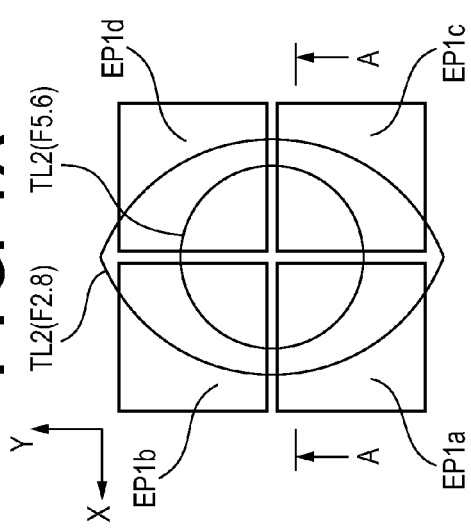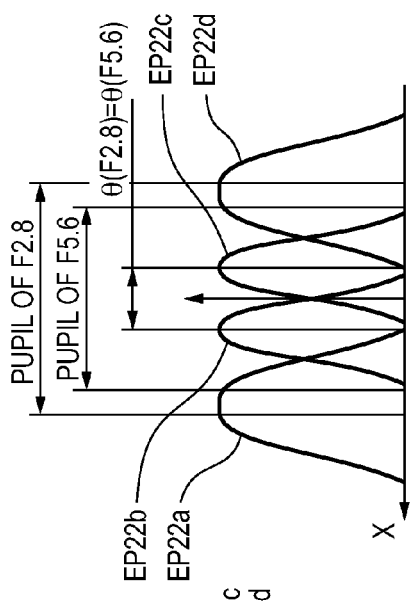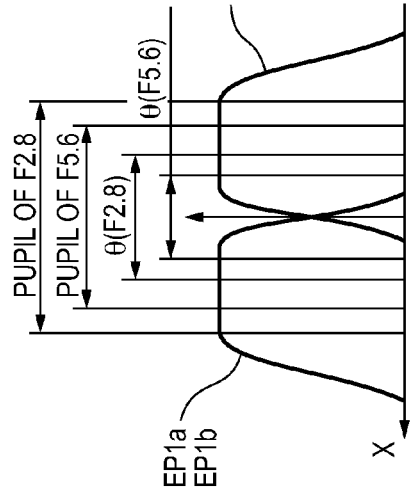

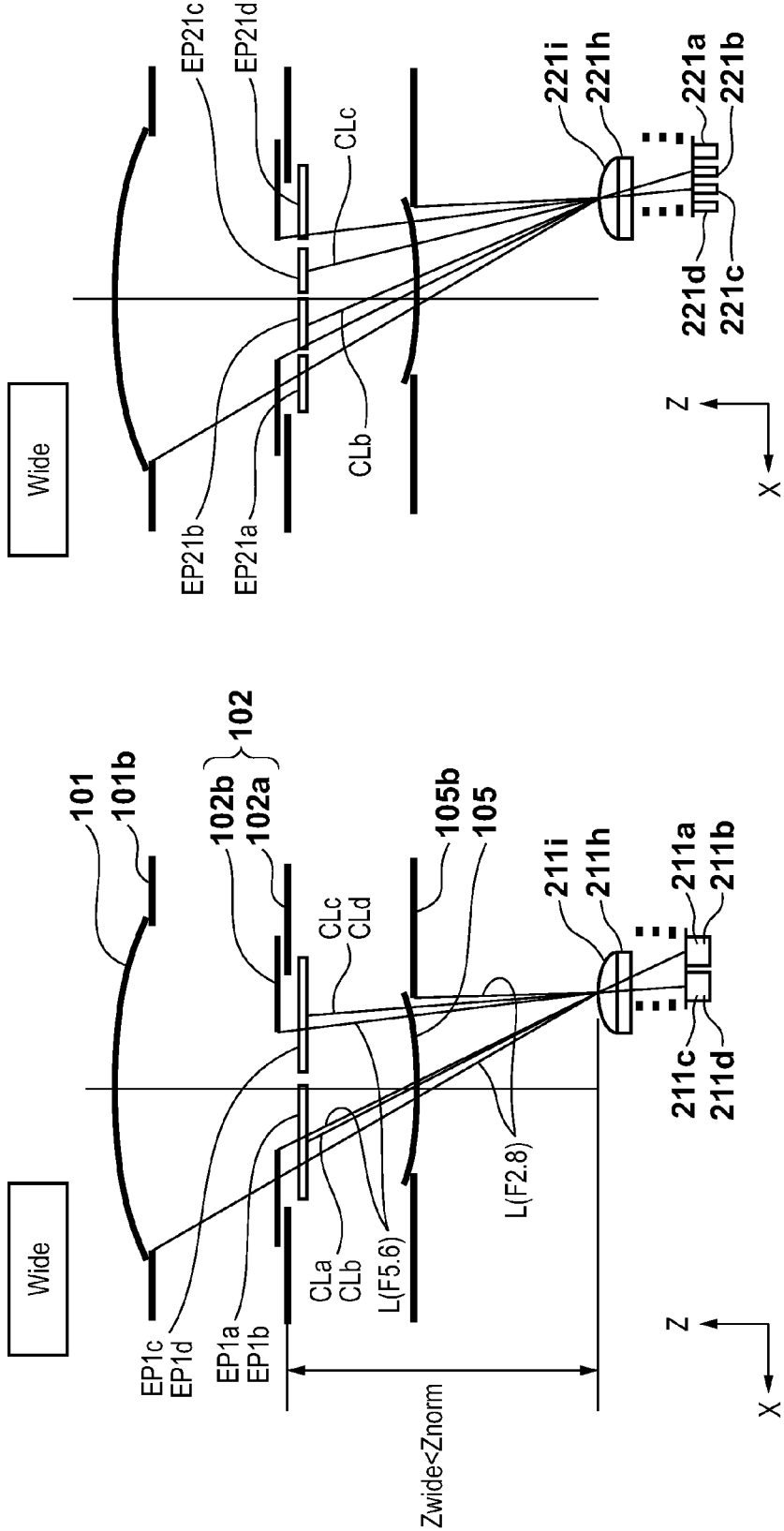

F I G. 12
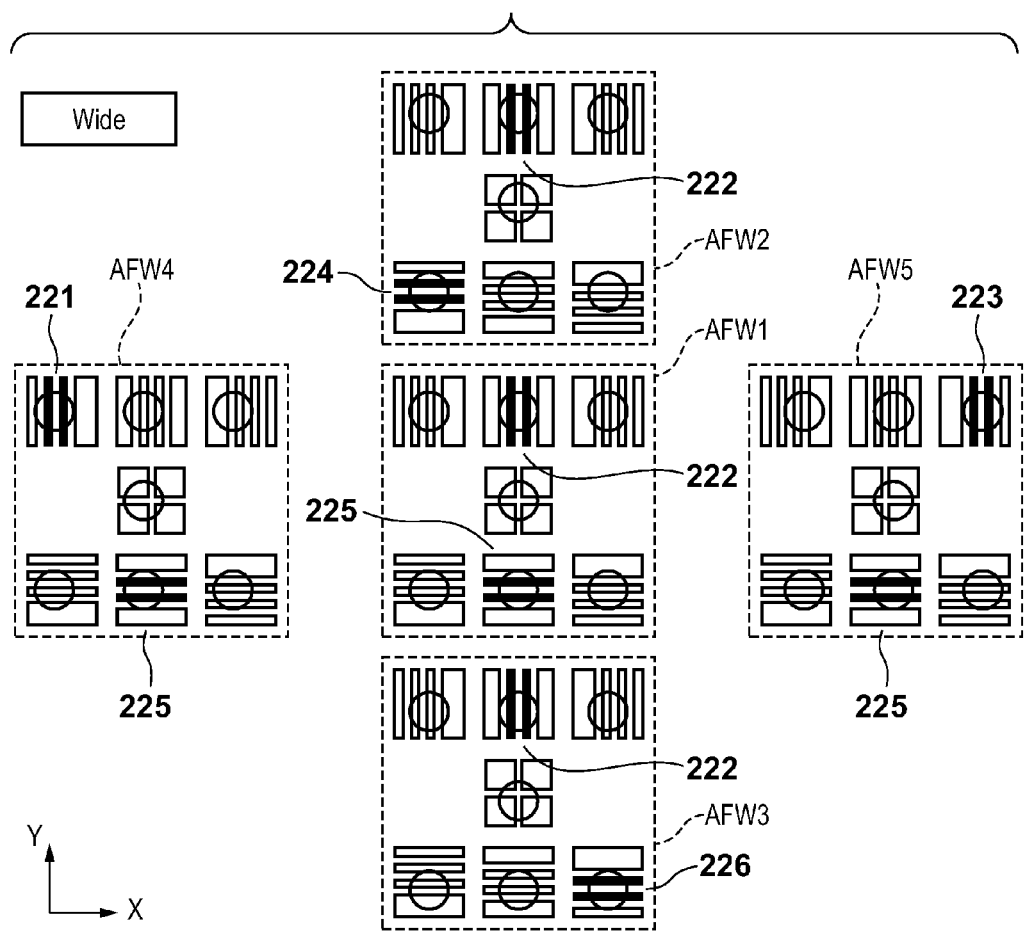

F I G. 13
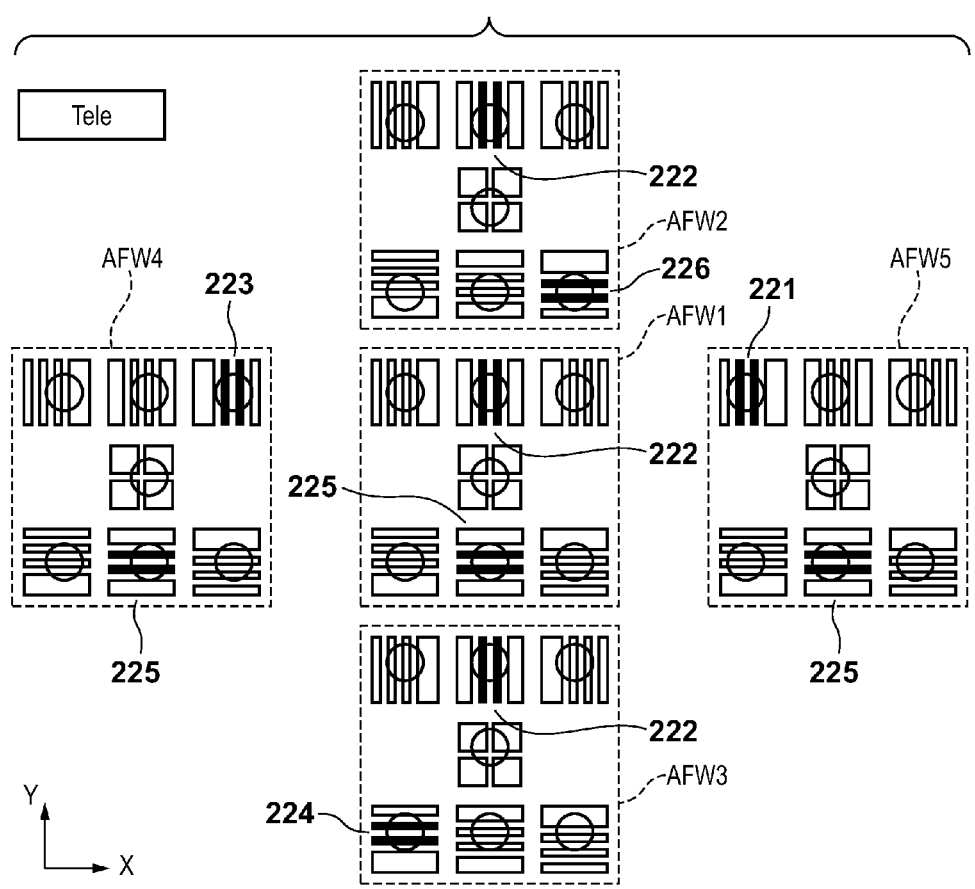

F I G. 19
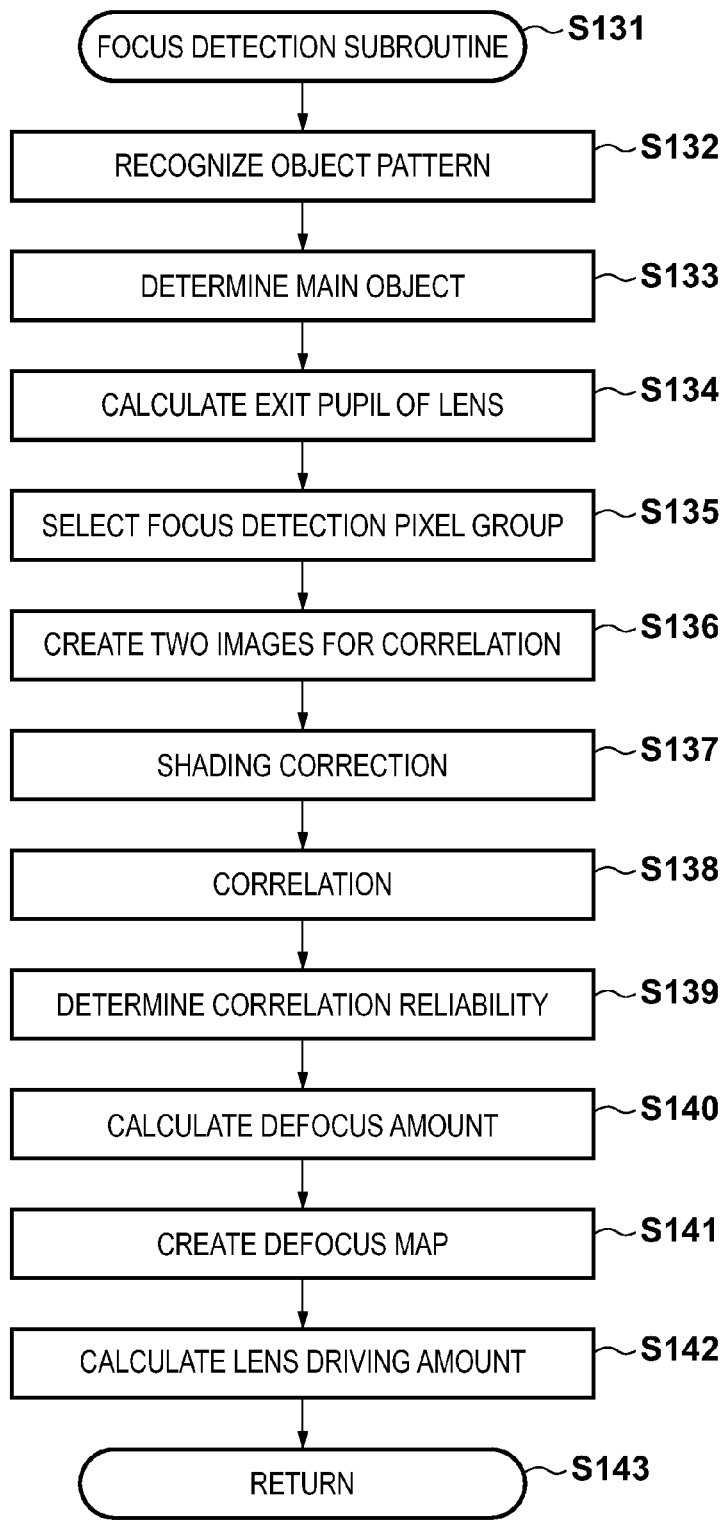

BEFORE COMPOSITION

WITHOUT PUPIL DECENTERING

WITH PUPIL DECENTERING

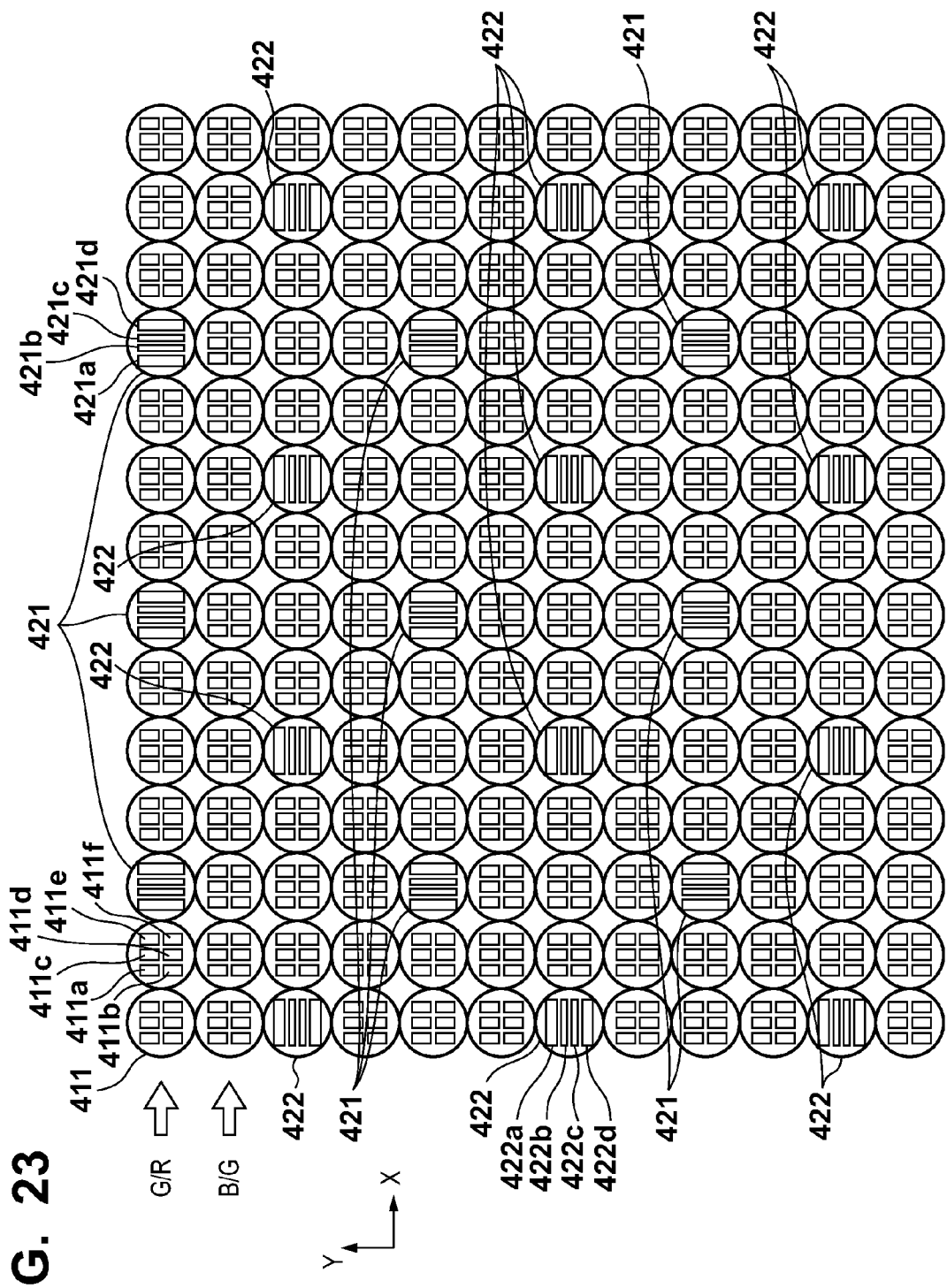

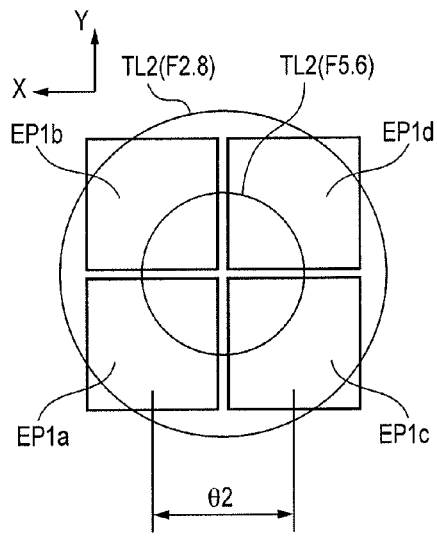
FIG. 26A
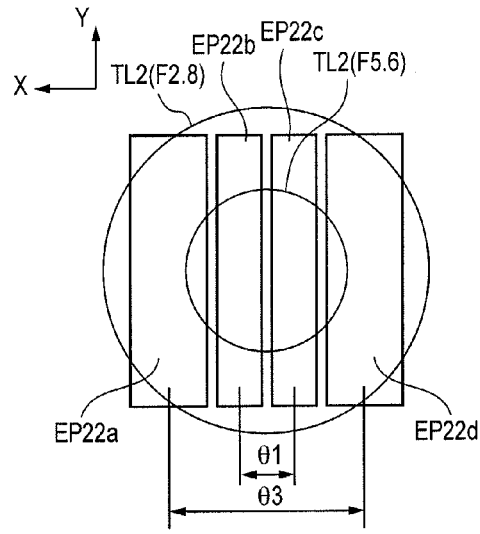
FIG. 26B
FIG. 27A
WEIGHTING COEFFICIENT C(FN) BY F-NUMBER
|  | F2.8 | F4 | F5.6 | F8 | F11 |  |
|---|---|---|---|---|---|---|
| DEF(θ1) | 1 | 4 | 5 | 6 | 7 | ←C1(FN) |
| DEF(θ2) | 3 | 4 | 4 | 4 | 3 | ←C2(FN) |
| DEF(θ3) | 6 | 2 | 1 | 0 | 0 | ←C3(FN) |
FIG. 27B
WEIGHTING COEFFICIENT C(DF) BY DEFOCUS AMOUNT
|  | |Def| ≤ 0.5 | 0.5 < |Def| ≤ 2 | 2 < |Def| ≤ 5 | 5 < |Def| |  |
|---|---|---|---|---|---|
| DEF(θ1) | 1 | 2 | 4 | 7 | ←C1(DF) |
| DEF(θ2) | 4 | 4 | 4 | 3 | ←C2(DF) |
| DEF(θ3) | 5 | 4 | 2 | 0 | ←C3(DF) |

FIG. 29

WEIGHTING COEFFICIENT C(FN) BY F-NUMBER

|  | F2.8 | F4 | F5.6 | F8 | F11 |
|---|---|---|---|---|---|
| DEF(θ1) | 0 | 0 | 1 | 1 | 1 |
| DEF(θ2) | 0 | 1 | 0 | 0 | 0 |
| DEF(θ3) | 1 | 0 | 0 | 0 | 0 |

FIG. 30

WEIGHTING COEFFICIENT C(FN) BY DEFOCUS AMOUNT

|  | $|Def| \leq 0.5$ | $0.5 < |Def| \leq 2$ | $2 < |Def| \leq 5$ | $0.5 < |Def|$ |
|---|---|---|---|---|
| DEF(θ1) | 0 | 0 | 1 | 1 |
| DEF(θ2) | 0 | 1 | 0 | 0 |
| DEF(θ3) | 1 | 0 | 0 | 0 |

FIG. 31

WEIGHTING COEFFICIENT C(SN)
BY NUMBER OF TIMES OF PHASE DIFFERENCE DETECTION

|  | FIRST TIME | SECOND TIME | THIRD TIME |  |
|---|---|---|---|---|
| DEF(θ1) | 1 | 0 | 0 | ←C1(SN) |
| DEF(θ2) | 0 | 1 | 0 | ←C2(SN) |
| DEF(θ3) | 0 | 0 | 1 | ←C3(SN) |

FIG. 33

WEIGHTING COEFFICIENT C(SN)
BY NUMBER OF TIME OF PHASE DIFFERENCE DETECTION

|              | FIRST TIME | SECOND TIME | THIRD TIME |
|--------------|------------|-------------|------------|
| DEF($\theta1$) | 8          | 2           | 1          |
| DEF($\theta2$) | 2          | 5           | 3          |
| DEF($\theta3$) | 0          | 3           | 6          |

IMAGE SENSOR AND IMAGE CAPTURING APPARATUS

BACKGROUND OF THE INVENTION

1. Field of the Invention

The present invention relates to an image sensor and an image capturing apparatus having the image sensor and, more specifically, to an image sensor capable of capturing a still image and/or a moving image using a number of photoelectric conversion units that are arranged two-dimensionally, and an image capturing apparatus for performing phase difference focus detection using the image sensor.

2. Description of the Related Art

For an electronic camera capable of recording a moving image or a still image, there has been proposed a technique of implementing focus detection by a phase difference detection method using an image sensor for image recording. In the phase difference detection method, a light beam that has passed through the exit pupil of a photographing optical system is split into two light beams. The two split light beams are received by a set of light-receiving element groups for focus detection. The shift amount between the signal waveforms of a pair of images which are two images output in accordance with the light receiving amounts, that is, the relative positional shift amount generated in the pupil division direction of the light beam is detected, thereby obtaining the focus shift amount (defocus amount) of the photographing optical system. The focus detection characteristic of this method depends on the array of the focus detection pixels or the pupil division characteristic shapes of the pixels. Hence, various techniques have been proposed concerning the intra-pixel structure or array to improve the focus detection characteristic.

On the other hand, the image sensor is anticipated to acquire a high-resolution image containing little noise. For this purpose, each pixel of the image sensor preferably receives a light beam having passed through a region as wide as possible in the exit pupil of the photographing optical system. However, using the light beam in the wide pupil region may conflict with improving the performance in phase difference focus detection. To satisfy both the image capturing ability and the phase difference detection ability, the following techniques have been proposed.

In, for example, Japanese Patent Laid-Open No. 2007-158692, each pixel of the image sensor has a first photoelectric conversion unit arranged in the central region of the pixel and a second photoelectric conversion unit arranged around it. An image signal is generated using the output of the first photoelectric conversion unit, and phase difference focus detection is performed using the output of the second photoelectric conversion unit.

In Japanese Patent Laid-Open No. 2009-015164, a plurality of pixel groups having different split center positions of photoelectric conversion units are provided to ensure redundancy for a change in the exit pupil position of the photographing optical system. An optimum pixel group is selected in accordance with the exit pupil position, thereby reducing unbalance of the light receiving amount of the focus detection signal.

In Japanese Patent Laid-Open No. 2007-279312, two types of focus detection pixels are provided independently of imaging pixels. A distance w3 between the gravity centers of distance measurement pupils in the pupil arrangement direction of one type of focus detection pixels is made different from a distance w3 between the gravity centers of distance measurement pupils in the pupil arrangement direction of the other type of focus detection pixels. There is disclosed selecting one of the two types of focus detection pixels based on the magnitude of the defocus amount.

However, in the technique disclosed in Japanese Patent Laid-Open No. 2007-158692, since the pixel arrangement emphasizes the image capturing characteristic, a satisfactory focus detection characteristic is not necessarily obtained. For example, for a photographing optical system having a large f-number, that is, a small exit pupil diameter, the light beam to the photoelectric conversion unit for focus detection is vignetted, and focus detection may be impossible. In addition, in the peripheral portion of the image sensor, that is, in the region with a large image height, the exit pupil diameter becomes small due to vignetting of the photographing optical system. The vignetting state changes depending on the model of the photographing optical system, the zoom state and focus state. Hence, a focus-detectable region also changes depending on these states, making stable focus detection difficult.

In the technique disclosed in Japanese Patent Laid-Open No. 2009-015164, since pupil division is limited in one direction, focus detection cannot be performed for an object having a luminance distribution only in a direction orthogonal to it. To increase the device sensitivity for image acquisition, the area of the photoelectric conversion unit needs to be large. However, in a large defocus state, the blur of the focus detection image also becomes large, and the focus-detectable defocus range narrows.

In Japanese Patent Laid-Open No. 2007-279312, the two types of focus detection pixels do not serve as imaging pixels and therefore become defective pixels when acquiring an image.

On the other hand, when an image sensor having a pupil division ability is used, a 3D image having parallax information can be acquired. However, how to optimize both the focus detection ability and the 3D image acquisition ability is unknown even when the techniques described in Japanese Patent Laid-Open Nos. 2007-158692 and 2009-015164 are used.

SUMMARY OF THE INVENTION

The present invention has been made in consideration of the above situation, and widens a focus-detectable defocus range and improves the detection accuracy in a near in-focus state.

The present invention further widens a focus-detectable defocus range and improves the detection accuracy in a near in-focus state independently of the direction of the luminance distribution of an object.

The present invention further optimizes both a focus detection ability and a 3D image acquisition ability.

According to the present invention, provided is an image sensor comprising: a first imaging pixel and a second imaging pixel each of which detects an object image formed by a photographing optical system and generates a recording image, wherein each of the first imaging pixel and the second imaging pixel comprises a plurality of photoelectric conversion units segmented in a first direction, the plurality of photoelectric conversion units have an ability of photoelectrically converting a plurality of images formed by split light beams out of a light beam from the photographing optical system and outputting focus detection signals to be used to detect a phase difference, and a base-line length of photoelectric conversion units to be used to detect the phase difference out of the plurality of photoelectric conversion units included in the first imaging pixel is longer than a base-line length of photoelectric conversion units to be used to detect the phase difference out of the plurality of photoelectric conversion units included in the second imaging pixel.

Further, according to the present invention, provided is an image sensor comprising: an imaging pixel which detects an object image formed by a photographing optical system and generates a recording image, wherein the imaging pixel comprises 2n (n is an integer not less than 2) photoelectric conversion units divided in a first direction, each of the 2n photoelectric conversion units has an ability of photoelectrically converting an image formed by a split light beam out of a light beam from the photographing optical system and outputting a focus detection signal to be used to detect a phase difference, and the image sensor has a mode in which the phase difference is detected using two photoelectric conversion units having a small base-line length and arranged inside out of the 2n photoelectric conversion units included in the imaging pixel and a mode in which the phase difference is detected using two photoelectric conversion units having a large base-line length and arranged outside the two photoelectric conversion units having the small base-line length out of the 2n photoelectric conversion units included in the imaging pixel.

Furthermore, according to the present invention, provided is an image capturing apparatus including one of the foregoing image sensors.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

FIGS. 4A and 4B are explanatory views of the projection relationship of the photoelectric conversion units of pixels at the center of the screen when the zoom state is the Middle state;

FIGS. 6A and 6B are explanatory views of the projection relationship of the photoelectric conversion units of pixels at the periphery of the screen when the zoom state is the Middle state;

FIGS. 7A to 7D are views showing the projected images of the pixels at the periphery of the screen on the exit pupil plane when the zoom state is the Middle state;

FIGS. 8A and 8B are explanatory views of the projection relationship of the photoelectric conversion units of pixels at the periphery of the screen when the zoom state is the Wide state;

FIG. 12 is a view for explaining the positional relationship between the photoelectric conversion units and the projected images of the exit pupil when the zoom state is the Wide state;

FIG. 13 is a view for explaining the positional relationship between the photoelectric conversion units and the projected images of the exit pupil when the zoom state is the Tele state;

FIG. 19 is a flowchart of a focus detection subroutine according to the first embodiment;

FIG. 23 is a view showing the pixel array of an image sensor according to a third embodiment;

FIGS. 26A and 26B are views for explaining a plurality of base-line lengths of an image sensor according to a fifth embodiment;

FIGS. 27A and 27B are tables showing weighting coefficients for three kinds of defocus amounts according to the fifth embodiment;

FIG. 29 is a table showing weighting coefficients for three kinds of defocus amounts according to a modification of the fifth embodiment;

FIG. 30 is a table showing weighting coefficients for three kinds of defocus amounts according to another modification of the fifth embodiment;

FIG. 31 is a table showing weighting coefficients for three kinds of defocus amounts according to a sixth embodiment;

FIG. 33 is a table showing weighting coefficients for three kinds of defocus amounts according to a modification of the sixth embodiment.

DESCRIPTION OF THE EMBODIMENTS

The best mode for carrying to the present invention will now be described in detail below with reference to the accompanying drawings.

<First Embodiment>

Figure 1:
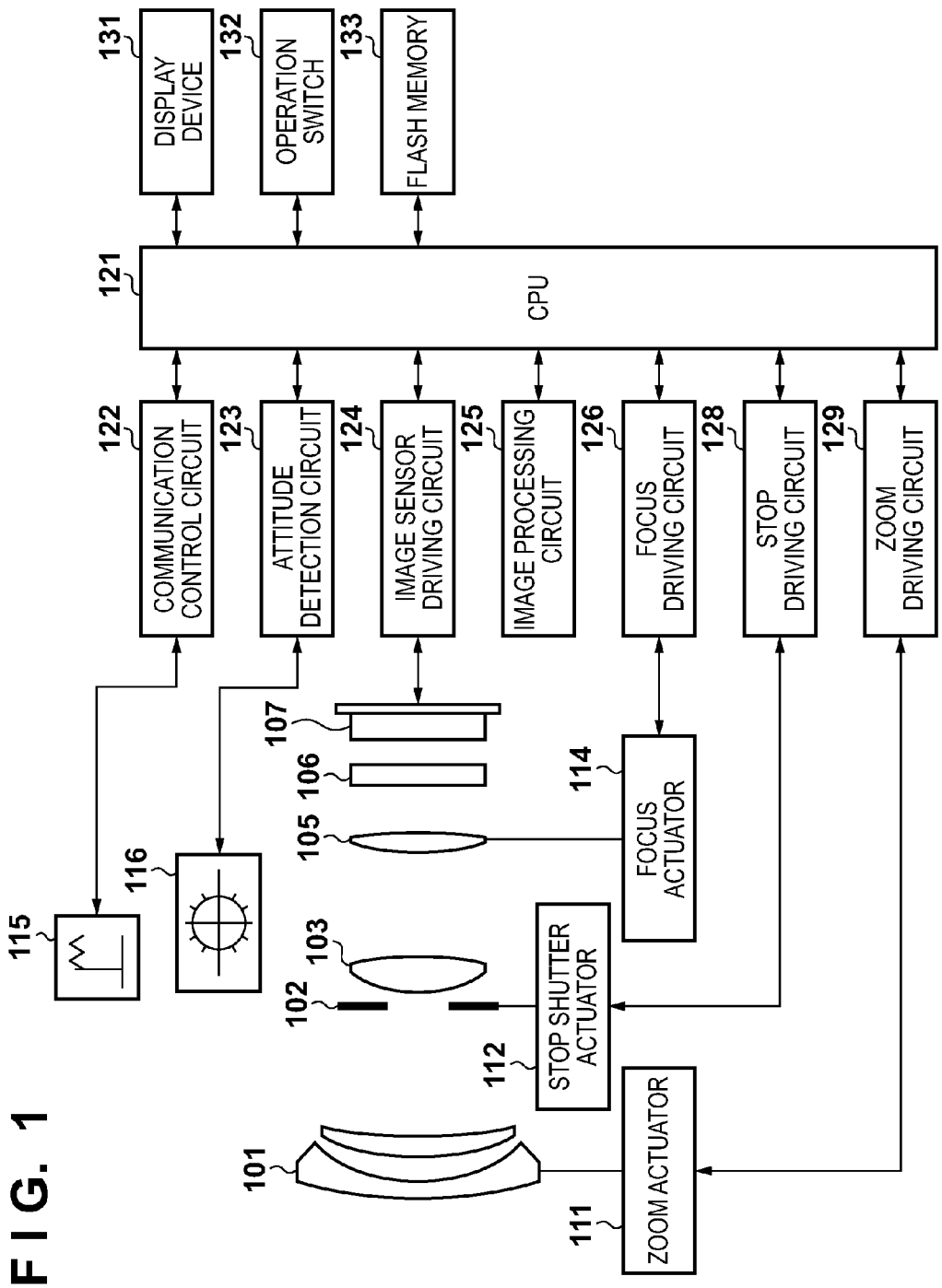
FIG. 1 is a block diagram showing the schematic arrangement of an image capturing apparatus according to a first embodiment of the present invention.

FIG. 1 shows the schematic arrangement of a digital camera serving as an image capturing apparatus including an image sensor according to the present invention. FIG. 1 illustrates a digital camera formed by integrating or connecting a camera body including an image sensor and a photographing optical system. The digital camera can record moving images and still images. Referring to FIG. 1, a first lens group 101 is arranged at the end of the photographing optical system (imaging optical system) and held such that it can move reciprocally in the optical axis direction. A stop 102 adjusts its aperture diameter to adjust the light amount at the time of photographing, and also has an ability as an exposure time control shutter when photographing a still image. Reference numeral 103 denotes a second lens group. The stop 102 and the second lens group 103 integrally move reciprocally in the optical axis direction in synchronism with the reciprocal movement of the first lens group 101, thereby implementing a scaling ability (zoom ability).

A third lens group 105 moves reciprocally in the optical axis direction to adjust focus. An optical low-pass filter 106 is an optical element that reduces the false color or moiré of a captured image. An image sensor 107 is formed from a two-dimensional CMOS sensor and peripheral circuits thereof. The image sensor 107 uses a two-dimensional single multi-color sensor in which M horizontal pixels and N vertical pixels are arranged in a matrix, and on-chip primary color mosaic filters are formed in a Bayer arrangement. Note that the arrangement of the image sensor 107 will be described later in detail.

A zoom actuator 111 makes a cam tube (not shown) rotate manually or by an actuator so as to reciprocally move the first lens group 101 to the third lens group 105 in the optical axis direction, thereby performing the scaling operation. A stop shutter actuator 112 controls the aperture diameter of the stop 102 to adjust the photographing light amount and also controls the exposure time when photographing a still image. A focus actuator 114 reciprocally moves the third lens group 105 in the optical axis direction to adjust focus.

A wireless communication unit 115 includes an antenna and a signal processing circuit to communicate with a server computer via a network such as the Internet. An attitude detection unit 116 of the camera uses an electronic level to determine the photographing attitude of the camera, that is, landscape orientation photographing or portrait orientation photographing.

An intra-camera CPU 121 performs various kinds of control of the camera body and includes an arithmetic unit, a ROM, a RAM, an A/D converter, a D/A converter, a communication interface circuit, and the like. The CPU 121 drives various kinds of circuits provided in the camera and executes a series of operations including AF, photographing, and image processing and recording, and the like based on a predetermined program stored in the ROM.

A communication control circuit 122 transmits a captured image from the camera to the server computer via the communication unit 115 or receives an image or various kinds of information from the server computer. An attitude detection circuit 123 determines the attitude of the camera based on the output signal of the attitude detection unit 116. An image sensor driving circuit 124 controls the image capturing operation of the image sensor 107, and also A/D-converts an acquired image signal and transmits it to the CPU 121. An image processing circuit 125 performs processing such as γ conversion, color interpolation, and JPEG compression of an image acquired by the image sensor 107.

A focus driving circuit 126 drives and controls the focus actuator 114 based on a focus detection result so as to reciprocally drive the third lens group 105 in the optical axis direction, thereby adjusting focus. A stop driving circuit 128 drives and controls the stop shutter actuator 112 to control opening of the stop 102. A zoom driving circuit 129 drives the zoom actuator 111 in accordance with the zoom operation of the user.

A display device 131 such as an LCD displays information concerning the photographing mode of the camera, a preview image before photographing and an image for check after photographing, an in-focus state display image upon focus detection, attitude information of the camera, and the like. An operation switch group 132 includes a power switch, a photographing start switch, a zoom operation switch, a photographing mode selection switch, and the like. A detachable flash memory 133 records captured images.

Figure 2:
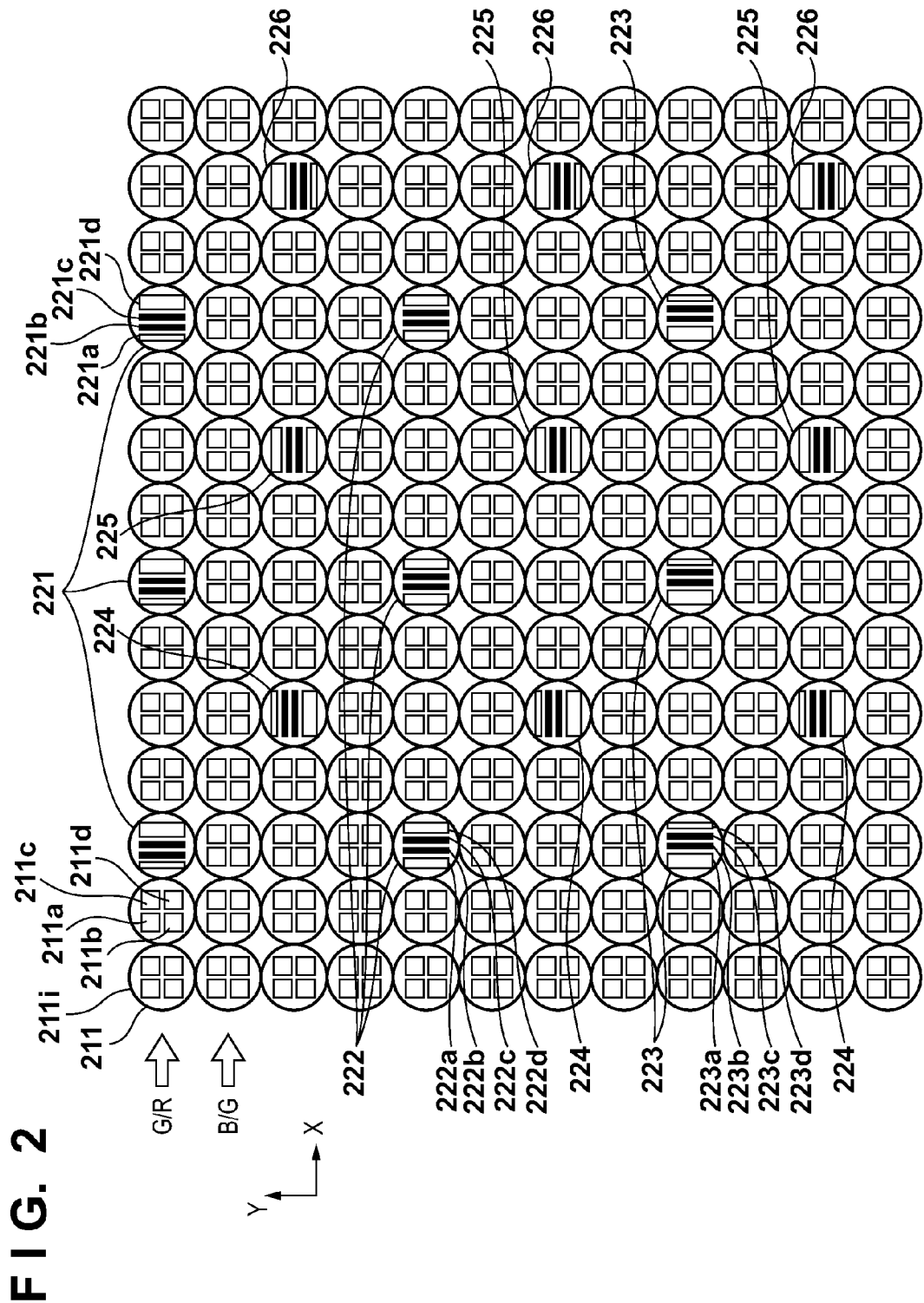
FIG. 2 is a view showing the pixel array of an image sensor according to the first embodiment.

FIG. 2 shows the pixel array of the image sensor 107 according to the first embodiment, which is manufactured using the technique disclosed in Japanese Patent Laid-Open No. 09-046596 applied by the present inventor. FIG. 2 shows a state in which a range of 12 rows in the vertical direction (Y direction) and 14 columns in the horizontal direction (X direction) of a two-dimensional CMOS area sensor is observed from the photographing optical system side. The Bayer arrangement is applied to the color filters. Green and red color filters are alternately provided on the pixels of the odd-numbered rows. Blue and green color filters are alternately provided on the pixels of the even-numbered rows. A circle 211i represents an on-chip microlens. Each of a plurality of rectangles arranged inside the on-chip microlens 211i represents a photoelectric conversion unit.

In the present invention, every pixel includes a plurality of photoelectric conversion units segmented into m parts in the X direction and n parts in the Y direction (m and n are integers of 1 or more), and photoelectric conversion signals of the photoelectric conversion units can be read independently. It should noted that the segmentation patterns of photoelectric conversion units in pixels are not the same, and the image sensor includes a plurality of pixels having different segmentation patterns. The features of these pixels will be described below. Note that in the following explanation, the shape of a plurality of segmented photoelectric conversion units which are connected and regarded as one photoelectric conversion unit will be referred to as a connected shape, and the center of the connected shape will be referred to as a connection center hereinafter.

A first pixel 211 has a total of four photoelectric conversion units 211a to 211d segmented into two parts (integer m1=2) in the X direction and two parts (integer n1=2) in the Y direction. The four photoelectric conversion units 211a to 211d are segmented to have line symmetry about the X- and Y-axes passing through the pixel center. That is, each of the segmented photoelectric conversion units has a square planar shape. The connected shape of the four photoelectric conversion units is also square. The first pixel 211 have the same segmented shape at all positions on the image plane. The outputs of the first pixel 211 are used for recording image generation and focus detection in a near in-focus state. Recording images include not only a normal 2D (2-Dimensional) image defined by a format such as JPEG but also a 3D (3-Dimensional) image formed from a plurality of images having parallax information. Both a moving image and a still image are included. Note that the other pixels having the same structure and arranged in the image sensor 107 will also be referred to as the first pixels 211 hereinafter.

Second pixels 221 to 223 are discretely arranged among the first pixels 211 in accordance with a predetermined array rule. Each of the second pixels has a total of four photoelectric conversion units segmented into four parts (integer m2=4) in the X direction but not segmented (integer n2=1) in the Y direction. The connected shape of the photoelectric conversion units is square in the second pixels 221 to 223 as well. The outputs of the second pixels 221 to 223 are used for recording image generation and focus detection in a large defocus state (when the focus shift amount is large). In FIG. 2, out of the four segmented photoelectric conversion units, the two photoelectric conversion units (indicated by suffixes b and c) at the center are used for focus detection. Referring to FIG. 2, the focus detection photoelectric conversion units are indicated as solid parts, although their basic structure and characteristics are the same as those of the photoelectric conversion units (indicated by suffixes a and d) on both sides. Note that the pixels having the same structure and arranged in the image sensor 107 will also be referred to as second pixels 221 to 223 hereinafter. The connected shape of the four photoelectric conversion units is square even in the second pixels 221 to 223. However, the second pixels 221 to 223 are further classified into three types by the planar shape difference between the segmented individual photoelectric conversion units, as will be described below.

In the second pixel 222, photoelectric conversion units 222b and 222c are arranged to be bilaterally symmetrical about the pixel center. That is, the connection center of photoelectric conversion units 222a to 222d matches that of the photoelectric conversion units 222b and 222c at the center. The X-direction size of the photoelectric conversion units 222b and 222c (the width of the photoelectric conversion units) is set to be smaller (narrower) than the X-direction size of the outer photoelectric conversion units 222a and 222d. This segmented shape is common to all second pixels 222 arranged on the image plane.

A composition of the outputs of the photoelectric conversion units 222b of the second pixels 222 arranged on the same row within a predetermined range is defined as a B image for AF, and a composition of the outputs of the photoelectric conversion units 222c is defined as a C image for AF. The relative shift amount between the B image and the C image for AF is detected by correlation, thereby detecting the focus shift amount, that is, the defocus amount in the predetermined area.

In the second pixel 221, the connection center of photoelectric conversion units 221b and 221c is shifted in the negative direction on the X-axis with respect to that of photoelectric conversion units 221a to 221d. However, the X-direction size of the photoelectric conversion units 221b and 221c is set to be equal to that of the photoelectric conversion units 222b and 222c. As a result, the X-direction size of the outer photoelectric conversion unit 221a is smaller than that of the photoelectric conversion unit 222a. The X-direction size of the other photoelectric conversion unit 221d is larger than that of the photoelectric conversion unit 222d.

In the second pixel 223, the connection center of photoelectric conversion units 223b and 223c is shifted in the positive direction on the X-axis with respect to that of photoelectric conversion units 223a to 223d. However, the X-direction size of the photoelectric conversion units 223b and 223c is set to be equal to that of the photoelectric conversion units 222b and 222c. As a result, the X-direction size of the outer photoelectric conversion unit 223a is larger than that of the photoelectric conversion unit 222a. The X-direction size of the other photoelectric conversion unit 223d is smaller than that of the photoelectric conversion unit 222d.

The reason why the photoelectric conversion units 221b, 221c, 222b, 222c, 223b, and 223c of the second pixels 221, 222, and 223 are smaller in the X direction is as follows. In the phase difference detection type focus detection system, pupil division of a focus detection light beam is done on the exit pupil of the photographing optical system. If the pupil size in the pupil division direction is large, the blur of an AF image in a non-focus state is large, and the focus detectable range becomes narrow, that is, the focus detection capability in a large defocus state degrades. In addition, when the f-number of the photographing optical system is large, the focus detection light beam is conspicuously vignetted. This degrades the similarity between a pair of AF image signals or increase the unbalance of the light amount. Since this vignetting phenomenon depends on the defocus amount, the focus detection ability in the large defocus state further degrades.

The focus detection pupil on the exit pupil of the photographing optical system and the photoelectric conversion units of each pixel of the image sensor have a conjugated relation through the on-chip microlenses. Hence, making the photoelectric conversion units 221b, 221c, 222b, 222c, 223b, and 223c to be used for focus detection smaller in the X direction allows to narrow the width of the focus detection pupil and thus avoid the decrease in the focus detection performance in the large defocus state.

On the other hand, in a near in-focus state, that is, when the defocus amount is small, the blur of the image is small even if the size of the focus detection pupil is large. Hence, upon determining a near in-focus state, the outputs of the first pixels 211 are also used for focus detection. This enables to increase the information amount of the AF image signal to be used for focus detection, reduce the influence of noise of the pixel outputs, and thus improve the focus detection accuracy. Details will be described later.

The above-described second pixels 221 to 223 are pixels for pupil division in the X direction and are used for an object having a luminance distribution in the X direction, that is, an object having a vertical-striped pattern. To the contrary, third pixels 224 to 226 are pixels for pupil division in the Y direction and are used for an object having a luminance distribution in the Y direction, that is, an object having a lateral-striped pattern. The third pixels 224 to 226 are also segmented into four photoelectric conversion units in the Y direction. The third pixels are further classified into three types in accordance with the segmented shape of the photoelectric conversion units. These patterns are equivalent to those of the second pixels 221 to 223 rotated by 90°, and a detailed description thereof will be omitted. A suitable one of the second pixels 221 to 223 and the third pixels 224 to 226 is used in accordance with the luminance distribution pattern of a focus detection target object, thereby reducing the probability that focus detection is impossible.

Figure 3:
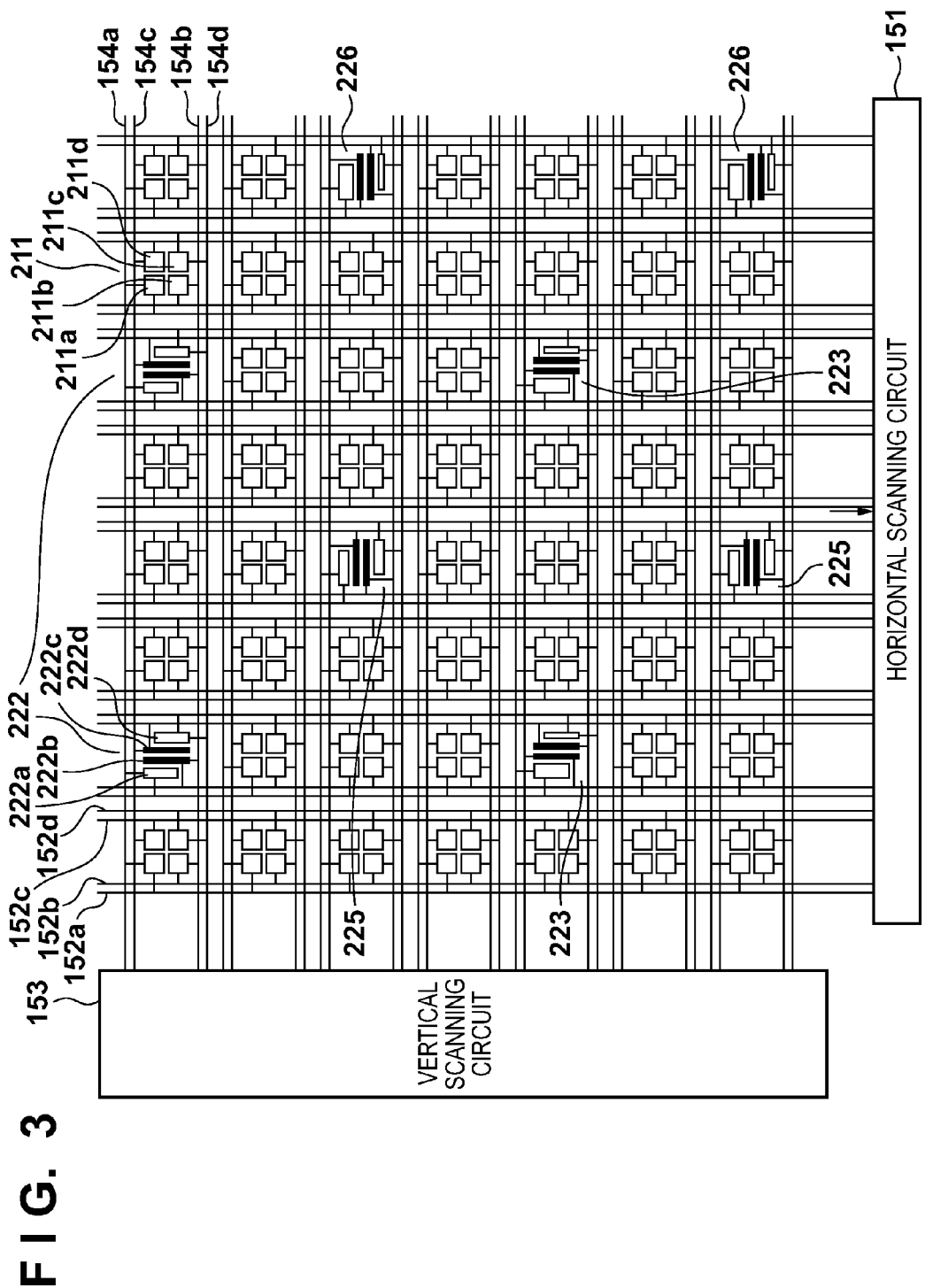
FIG. 3 is a view showing the arrangement of the read circuit of the image sensor according to the first embodiment.

FIG. 3 shows the arrangement of the read circuit of the image sensor 107 according to the present invention. Reference numeral 151 denotes a horizontal scanning circuit; and 153, a vertical scanning circuit. Horizontal scanning lines 152a to 152d and vertical scanning lines 154a to 154d are arranged at the boundaries of the pixels. The signals from the photoelectric conversion units are externally read through these scanning lines.

Note that the image sensor 107 of the present invention has the following two read modes. The first read mode is called a progressive scanning mode to be used to capture a high-resolution still image. In this case, the signals of all pixels are read. The second read mode is called a down sampling mode to be used to record a moving image or only display a preview image. In this case, since the number of necessary pixels is smaller than the total number of pixels, the first pixels 211 down-sampled at a predetermined ratio in both the Y and X directions are read. The focus detection ability is maintained by reading all the second pixels 221 to 223 and the third pixels 224 to 226.

FIGS. 4A and 4B are views for explaining the conjugated relation between the exit pupil plane of the photographing optical system and photoelectric conversion units at an image height of 0, that is, arranged near the center of the image plane of the image sensor in the camera of the present invention. The photoelectric conversion units in the image sensor 107 and the exit pupil plane of the photographing optical system are designed to have a conjugated relation through the on-chip microlenses 211i. In general, the exit pupil plane of the photographing optical system almost matches the plane on which the iris stop 102 for light amount adjustment is placed. The photographing optical system of the present invention is a zoom lens having a scaling ability. Depending on the optical type, performing the scaling operation causes a change in the size of the exit pupil or the distance from the image plane. The photographing optical system shown in FIGS. 4A and 4B represents a state in which the focal length is set at the middle between the wide angle side and the telephoto side, that is, the Middle state. The exit pupil distance in this state is represented by Zmid. Assuming that this distance is a standard exit pupil distance Znorm, the shape of the on-chip microlens is designed.

FIG. 4A is a view showing the conjugated relation between the first pixel 211 and the photographing optical system. Note that the same reference numerals as in FIG. 1 denote the same components in FIG. 4A. Referring to FIG. 4A, a lens barrel member 101b holds the first lens group 101, and a lens barrel member 105b holds the third lens group 105. An opening plate 102a defines the aperture diameter in a full aperture state, and diaphragm blades 102b adjust the aperture diameter in a stopped-down-aperture state. Note that the members 101b, 102a, 102b, and 105b which act to limit the light beam passing through the photographing optical system are illustrated as optical virtual images when observed from the image plane. A composite opening near the stop 102 is defined as the exit pupil of the lens, and the distance from the image plane is defined as Zmid, as described above.

Referring to FIG. 4A, the first pixel 211 includes the photoelectric conversion units 211a to 211d, wiring layers 211e to 211g, a color filter 211h, and the on-chip microlens 211i from the lowermost side. The photoelectric conversion units 211a and 211b overlap in the direction perpendicular to the drawing surface (the Y-axis direction). The photoelectric conversion units 211c and 211d also overlap in a similar manner. These photoelectric conversion units are projected onto the exit pupil plane of the photographing optical system through the on-chip microlens 211i as projected images EP1a to EP1d, respectively.

When the stop 102 is in the full aperture state (for example, F2.8), the outermost portion of the light beam passing through the photographing optical system is represented by L(F2.8). The pupil projected images EP1a to EP1d are not vignetted by the stop opening. On the other hand, when the stop 102 is in the stopped-down-aperture state (for example, F5.6), the outermost portion of the light beam passing through the photographing optical system is represented by L(F5.6). The outer sides of the pupil projected images EP1a to EP1d are vignetted by the stop opening. However, at the center of the image plane, the vignetted states of the projected images EP1a to EP1d are symmetrical about the optical axis, and the amounts of light received by the photoelectric conversion units 211a to 211d are equal.

FIG. 4B is a view showing the conjugated relation between the second pixel 222 and the exit pupil plane of the photographing optical system. FIG. 4B is different from FIG. 4A for explaining the conjugated relation of the first pixel 211 only in the shapes of the photoelectric conversion units of the pixel. That is, the projected images of the photoelectric conversion units 222a to 222d are formed on the exit pupil plane of the photographing optical system as EP22a to EP22d.

As a result, in the full aperture state, sufficient light beams are incident on the four photoelectric conversion units 222a to 222d. In the stopped-down-aperture state, the light beams to the photoelectric conversion units 222a and 222d are almost shielded. However, light beams are incident on the photoelectric conversion units 222b and 222c to some extent. For this reason, focus detection can be performed even in the stopped-down-aperture state.

FIGS. 5A to 5D show images formed by projecting the photoelectric conversion units of a pixel arranged at the center of the image plane onto the exit pupil plane of the photographing optical system.

Figure 5A:
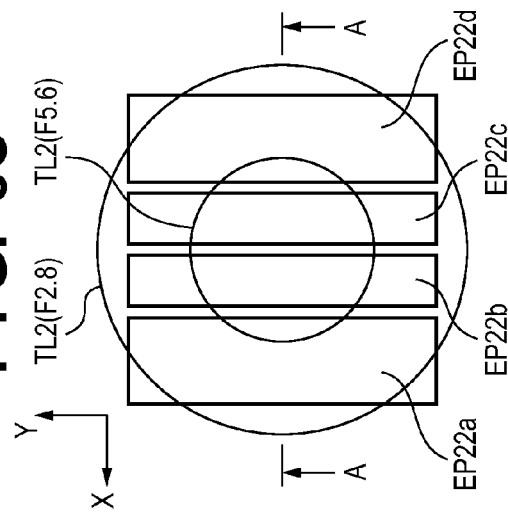
FIGS. 5A to 5D are views showing the projected images of the pixels at the center of the screen on the exit pupil plane when the zoom state is the Middle state.

FIG. 5A is a plan view showing the projected images of the photoelectric conversion units 211a to 211d of the first pixel 211. TL2(F2.8) represents the exit pupil in the full aperture state of the photographing optical system, and TL2(F5.6) represents the exit pupil in the stopped-down-aperture state. EP1a to EP1d are the projected images of the photoelectric conversion units 211a to 211d of the first pixel 211. As described with reference to FIG. 4A, in the pixel arranged at the center of the image plane, the connection center of the four photoelectric conversion units 211a to 211d matches the center of the exit pupil of the photographing optical system. Hence, the four pupil projected images EP1a to EP1d are uniformly eclipsed from the peripheral portion in accordance with the aperture state of the photographing optical system. In the stopped-down-aperture state, the light reception amounts of the photoelectric conversion units 211a to 211d decrease, and the decrease amounts are equal.

Figure 5B:
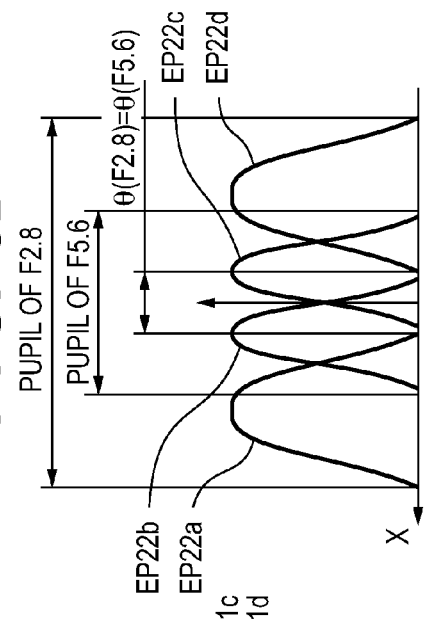

FIG. 5B shows the light reception characteristic on a section taken along a line A-A in FIG. 5A. The abscissa represents the horizontal coordinate on the exit pupil plane of the photographing optical system, and the ordinate represents the light reception efficiency of each photoelectric conversion unit. As described with reference to FIGS. 4A and 4B, the photoelectric conversion units arranged in the pixel and the exit pupil of the photographing optical system have a conjugated relation through the on-chip microlens. This means that only a light beam passing through the common region of the exit pupil TL of the photographing optical system on the exit pupil plane and the projected image EP of a photoelectric conversion unit reaches the photoelectric conversion unit. Hence, the projected image corresponds to the aperture stop unique to the pixel arranged on the exit pupil plane of the photographing optical system, and the ordinate of FIG. 5B represents the transmittance distribution of each aperture stop. The transmittance distribution can be regarded as the light beam reception efficiency of each photoelectric conversion unit. The distribution characteristic of the light beam reception efficiency will be referred to as a "pupil intensity distribution" for the descriptive convenience.

If the projection performance of the on-chip microlens 211i is stigmatic from the viewpoint of geometrical optics, the pupil intensity distribution is represented by a step function having only one of values "0" and "1". However, since the size of each pixel is as small as several μm, the sharpness of the image of a photoelectric conversion unit projected onto the exit pupil plane becomes lower due to diffraction of light. In addition, since the on-chip microlens 211i is normally a spherical lens, the sharpness of the projected image also lowers due to spherical aberration. Hence, the pupil intensity distributions of the pixels also become dull so as to have rounded shoulders and long tails on both sides, as shown in FIG. 5B.

The relationship between the pupil intensity distribution and the focus detection characteristic will be described next. In a pair of pupil intensity distributions in the X-axis direction, the separation distance between the gravity centers of the portions extracted in the exit pupil range of the photographing optical system corresponds to the base-line length in the phase difference focus detection system. In this case, the base-line length is defined by an angle θ (unit: radian) obtained by dividing the gravity center separation distance (unit: mm) on the pupil plane of the photographing optical system by the pupil distance (unit: mm). Letting u (unit: mm) be the horizontal shift amount of a pair of images at the time of focus detection, and DEF (unit: mm) be the defocus amount at that time, the relationship is represented by $$\theta \times DEF = u \quad (1)$$

The angle θ takes a different value for each f-number of the photographing optical system. In FIG. 5B, the base-line lengths for F2.8 and F5.6 are represented by θ(F2.8) and θ(F5.6), respectively. According to equation (1), the larger the base-line length θ is, the larger the horizontal shift amount of the focus detection image for the unit defocus amount is, and the higher the focus detection accuracy is. On the other hand, in the large defocus state, the horizontal shift amount of the pair of images also increases. Hence, if the focus detection area is narrow, the maximum defocus amount that allows focus detection undesirably decreases.

If the pupil intensity distribution largely spreads in the X direction, the light reception amount of each photoelectric conversion unit increases, resulting in little noise when the signal is used as an image signal or an improved low luminance detection limit when the signal is used as a focus detection signal. On the other hand, the image blur in the large defocus state also increases. This lowers the contrast of the focus detection signal and undesirably decreases the maximum defocus amount that allows focus detection. The first pixel 211 is advantageous for highly accurate focus detection when the defocus amount is small because the spread width of the pupil intensity distribution is large, and the base-line length is large.

Figure 5C:
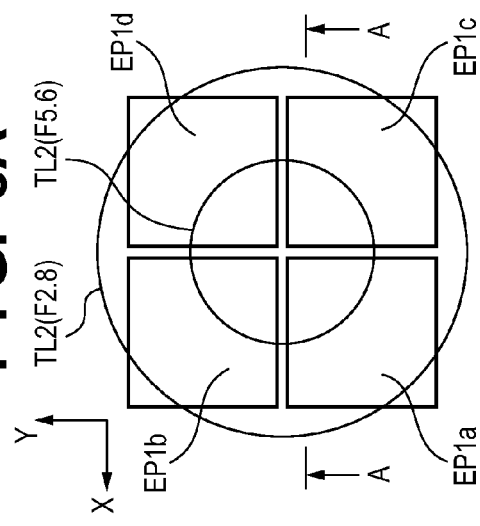

FIG. 5C is a plan view showing the projected states of the photoelectric conversion units 222a to 222d of the second pixel 222. The two circles indicate the exit pupil of the photographing optical system in the full aperture state and that in the stopped-down-aperture state as in FIG. 5A. EP22a to EP22d are the projected images of the photoelectric conversion units 222a to 222d of the second pixel 222.

Figure 5D:
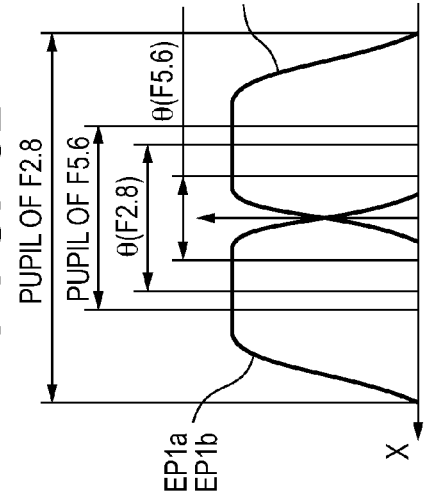

FIG. 5D shows pupil intensity distributions representing the characteristic on a section in FIG. 5C. In the first embodiment, the outputs of the photoelectric conversion units 222b and 222c are used at the time of focus detection. The pupil intensity distributions EP22b and EP22c of the photoelectric conversion units are narrower than those of the first pixel shown in FIG. 5B. Hence, even when the defocus amount is large, the blur of AF images formed by the focus detection pixels is kept small, and focus detection never becomes impossible. In addition, the degree of vignetting is slight in the pupil intensity distributions EP22b and EP22c even in the stopped-down-aperture state of the photographing optical system. Hence, the change in the base-line length is small, that is, θ(F2.8)≈θ(F5.6), and focus detection is possible even in the stopped-down-aperture state. That is, in the second pixel 222, since the spread width of the pupil intensity distribution is small, and the base-line length is small, focus detection is possible even in the stopped-down-aperture state or when the defocus amount is large.

As described above, the base-line length controls the focus detection accuracy and the maximum detection defocus amount, however these characteristics have trade-off relationship. The width of the pupil intensity distribution controls the light reception amount and the image blur, and these characteristics also have trade-off relationship. In the present invention, the first pixel 211 and the second pixel 222, which have different characteristics, are selectively used in accordance with the focus detection condition, as will be described later, thereby improving the focus detection capability.

FIGS. 6A and 6B are views showing the conjugated relation between the photoelectric conversion units of a pixel at the peripheral image height and the exit pupil plane of the photographing optical system when the zoom state is the Middle state. The individual light beam shielding members at the peripheral image height portion are almost equal to those at the center of the image plane. However, since a plurality of virtual openings having different distances are viewed from an oblique direction, the exit pupil shape as the composite opening changes to cause so-called vignetting. For example, in the full aperture state, the outer light beam L(F2.8) called a lower line is regulated by the lens barrel member 101b, and the outer light beam L(F2.8) called an upper line is regulated by the lens barrel member 105b. Hence, the size of the composite opening in the X-direction on the exit pupil plane of a pixel at the peripheral image height is smaller than the opening size of a pixel at the center image height. On the other hand, in the stopped-down-aperture state, the opening portion of the diaphragm blades 102b serves as the exit pupil without any influence of vignetting.

The arrangement of the image sensor at the peripheral image height will be described next. A pixel arranged at a position with a large image height obliquely receives the light beam from the exit pupil. Hence, the on-chip microlens needs to decenter toward the image plane center with respect to the connection center of the photoelectric conversion regions of the pixel. The optimum decentering amount depends on the image height and the distance to the exit pupil of the photographing optical system. For the dependence of the decentering amount on the image height, a decentering amount proportional to the image height is generally given. On the other hand, since the distance of the exit pupil changes depending on the zoom state or focus state of the photographing optical system, it is necessary to uniquely determine a representative state. In the first embodiment, the representative state of the zoom state is the Middle state, and the representative state of the focus state is the in-focus state for an infinite object. The exit pupil distance at this state is defined as Znorm.

FIG. 6A shows the projection relationship of the first pixel 211. The connection center of the four pupil projected images EP1a to EP1d is projected onto the exit pupil plane at a distance Zmid (=Znorm) from the image plane without decentering with respect to the center of the exit pupil.

As a result, in the full aperture state, the light reception amount of the pixel decreases due to vignetting, and the decrease amount is almost the same between the four photoelectric conversion units. In the stopped-down-aperture state, the light amount is almost the same as that of the pixel arranged at the center of the image plane shown in FIG. 4A.

FIG. 6B shows the conjugated relation between the second pixel 222 and the exit pupil plane of the photographing optical system. The vignetting of the photographing optical system and the decentering state of the on-chip microlens of the pixel are the same as in FIG. 6A. Hence, the projected images of the photoelectric conversion units 222a to 222d are formed on the exit pupil plane at the distance Zmid from the image plane as EP22a to EP22d.

As a result, in the full aperture state as well, most of the light beams to the outer photoelectric conversion units 222a and 222d are shielded by vignetting. In the stopped-down-aperture state, the light beams are almost completely shielded. On the other hand, since light beams enter the photoelectric conversion units 222b and 222c to some extent in both the full aperture state and the stopped-down-aperture state, focus detection is possible even in the stopped-down-aperture state.

FIGS. 7A to 7D show the projected images of the photoelectric conversion units of the pixel arranged at the peripheral image height portion on the exit pupil plane of the photographing optical system.

FIG. 7A is a plan view showing the projected images of the photoelectric conversion units 211a to 211d of the first pixel 211. TL2(F2.8) represents the exit pupil in the full aperture state of the photographing optical system. The exit pupil has a shape formed by combining a plurality of arcs because of the effects of vignetting described with reference to FIGS. 6A and 6B. TL2(F5.6) represents the exit pupil in the stopped-down-aperture state. The exit pupil has a circular opening without any influence of vignetting. EP1a to EP1d are the projected images of the photoelectric conversion units 211a to 211d of the first pixel 211. In the pixel at the peripheral image height, the pupil projected images EP1a to EP1d are vignetted not only in the stopped-down-aperture state but also in the full aperture state. The connection center of the four photoelectric conversion units 211a to 211d matches the center of the exit pupil of the photographing optical system. Hence, the pupil projected images EP1a to EP1d are vignetted symmetrically about the axis. For this reason, the light reception amounts of the photoelectric conversion units 211a to 211d decrease, and the decrease amounts are equal.

FIG. 7B is a graph for explaining the pupil intensity distributions in FIG. 7A. The pupil intensity distributions of the pupil projected images EP1a to EP1d are the same as those in FIG. 5B. On the other hand, since the exit pupil width of the photographing optical system in the full aperture state becomes smaller, the base-line length θ(F2.8) is shorter than in FIG. 5B.

FIG. 7C is a plan view showing the projected images of the photoelectric conversion units 222a to 222d of the second pixel 222. FIG. 7D shows the pupil intensity distributions of the projected images. In FIG. 7D as well, the pupil intensity distributions EP22a to EP22d of the photoelectric conversion units 222a to 222d and their pupil intensity distributions are almost the same as those in FIG. 5D. In addition, the exit pupil width of the photographing optical system is the same as in FIG. 7A. Hence, the pupil intensity distributions EP22b and EP22c for focus detection are not vignetted by the exit pupil in the full aperture state and the stopped-down-aperture state. Hence, the base-line lengths maintain the relation θ(F2.8)=θ (F5.6), and focus detection is possible even in the stopped-down-aperture state.

FIGS. 8A and 8B are views showing the conjugated relation between the photoelectric conversion units of a pixel at the peripheral image height and the exit pupil plane of the photographing optical system when the zoom state is Wide (wide angle side). In the photographing optical system of the first embodiment, the exit pupil distance from the image plane changes depending on the zoom state. In the Wide state, the distance between the image plane and the exit pupil is shorter than the above-described standard distance Znorm. On the other hand, as described with reference to FIGS. 6A and 6B, the decentering amount of the on-chip microlens is optimized based on the exit pupil distance, that is, Znorm when the zoom state is Middle. In the Wide state, the decentering amount of the on-chip microlens does not have the optimum value. The connection center of the projected images of the photoelectric conversion units of the pixel at the peripheral image height decenters with respect to the center of the exit pupil of the photographing optical system.

FIG. 8A shows the projection relationship of the first pixel 211. The projected images of the four photoelectric conversion units 211a to 211d are formed on the exit pupil plane at a distance Zwide from the image plane as EP1a to EP1d. The connection center of the four pupil projected images EP1a to EP1d decenters in the negative direction on the X-axis with respect to the center of the exit pupil of the photographing optical system. As a result, in the full aperture state, the light reception amount of the pixel decreases due to vignetting, and the decrease amount is nonuniform between the four photoelectric conversion units 211a to 211d. The nonuniformity of the light reception amount becomes more conspicuous as the stop aperture diameter decreases.

FIG. 8B is a view showing the conjugated relation between the second pixel 221 and the exit pupil plane of the photographing optical system. When the zoom state of the photographing optical system is Middle, the second pixel 222 is used, as shown in FIG. 6B. When the zoom state is Wide, the second pixel 221 is used. As for the photoelectric conversion units 221a to 221d of the second pixel 221, the connection center of the photoelectric conversion units 221b and 221c is shifted in the negative direction on the X-axis, as shown in FIGS. 2 and 8B. On the other hand, the exit pupil distance Zwide of the photographing optical system is shorter than the standard distance Znorm. Hence, the connection center of the photoelectric conversion units 221b and 221c is projected on the exit pupil plane without decentering.

Figure 9A:
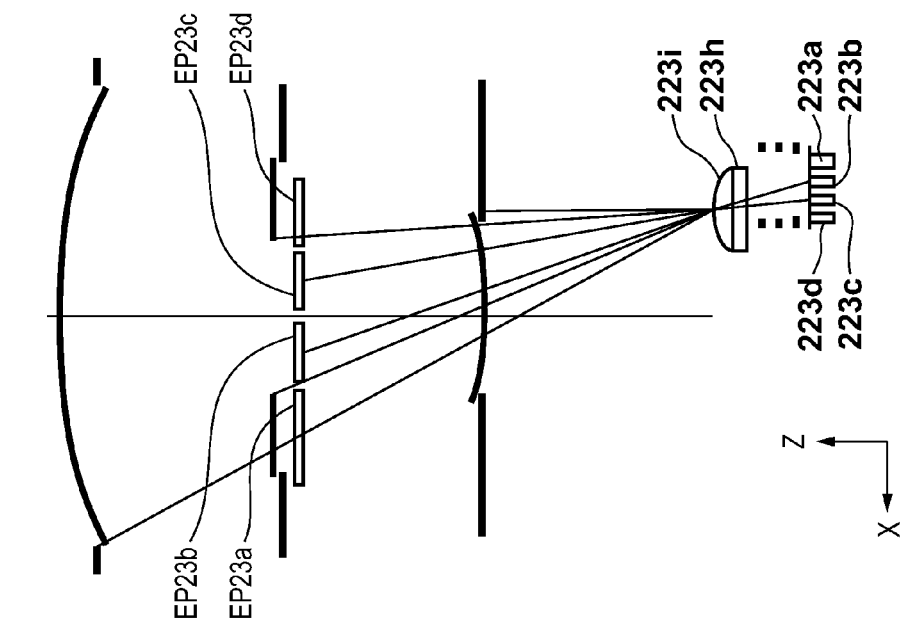
FIGS. 9A and 9B are explanatory views of the projection relationship of the photoelectric conversion units of pixels at the periphery of the screen when the zoom state is the Tele state.
Figure 9B:
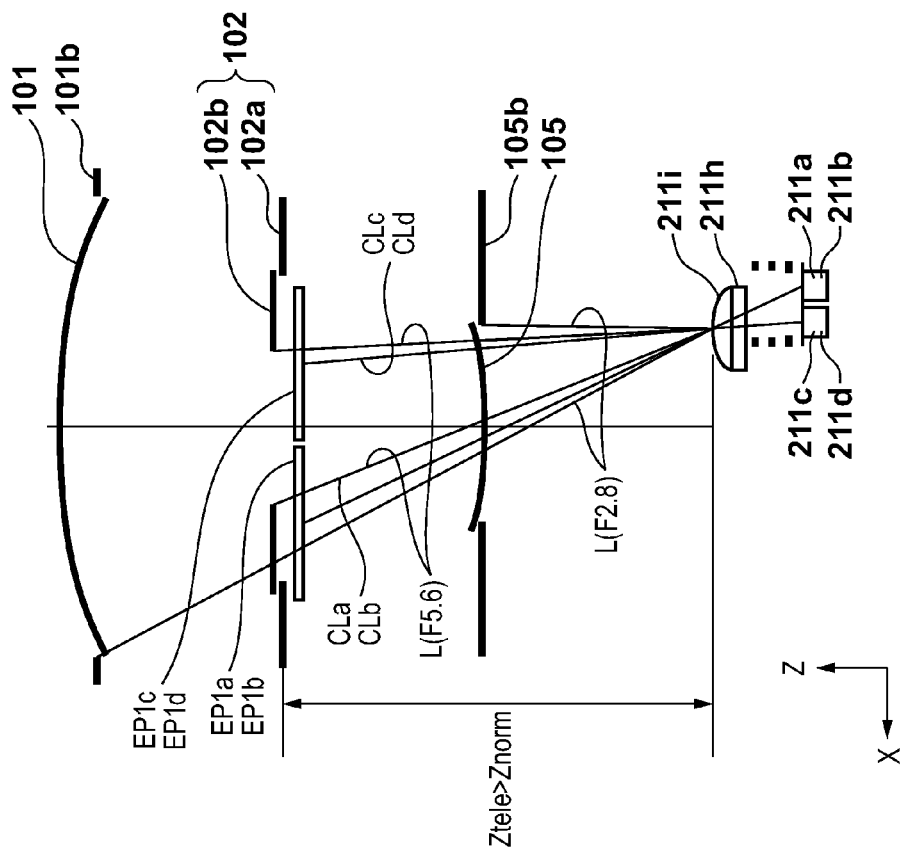

FIGS. 9A and 9B are views showing the conjugated relation between the photoelectric conversion units of a pixel at the peripheral image height and the exit pupil plane of the photographing optical system when the zoom state is Tele (telephoto side). In the Tele state, the distance between the image plane and the exit pupil is longer than the standard distance Znorm, contrary to the Wide state shown in FIGS. 8A and 8B. Hence, the connection center of the projected images of the photoelectric conversion units of the pixel at the peripheral image height decenters with respect to the center of the exit pupil of the photographing optical system, and the decentering direction is reverse to that in the Wide state.

FIG. 9A shows the projection relationship of the first pixel 211. The projected images of the four photoelectric conversion units 211a to 211d are formed on the exit pupil plane at a distance Ztele from the image plane as EP1a to EP1d. The connection center of the four pupil projected images EP1a to EP1d decenters in the positive direction on the X-axis with respect to the center of the exit pupil of the photographing optical system. As a result, in the full aperture state, the light reception amount of the pixel decreases due to vignetting, and the decrease amount is nonuniform between the four photoelectric conversion units 211a to 211d. The nonuniformity of the light reception amount becomes more conspicuous as the stop aperture diameter decreases.

FIG. 9B is a view showing the conjugated relation between the second pixel 223 and the exit pupil plane of the photographing optical system. When the zoom state of the photographing optical system is Tele, the second pixel 223 is used. As for the photoelectric conversion units 223a to 223d of the second pixel 223, the connection center of the photoelectric conversion units 223b and 223c is shifted in the positive direction on the X-axis, as shown in FIGS. 2 and 9B. On the other hand, the exit pupil distance Ztele of the photographing optical system is longer than the standard distance Znorm. Hence, the connection center of the photoelectric conversion units 223b and 223c is projected on the exit pupil plane without decentering.

FIGS. 10A to 13 are views for explaining the projection position relationship between the photoelectric conversion units of the pixels and the exit pupil of the photographing optical system in five focus detection areas on the image sensor 107.

Figure 10A:
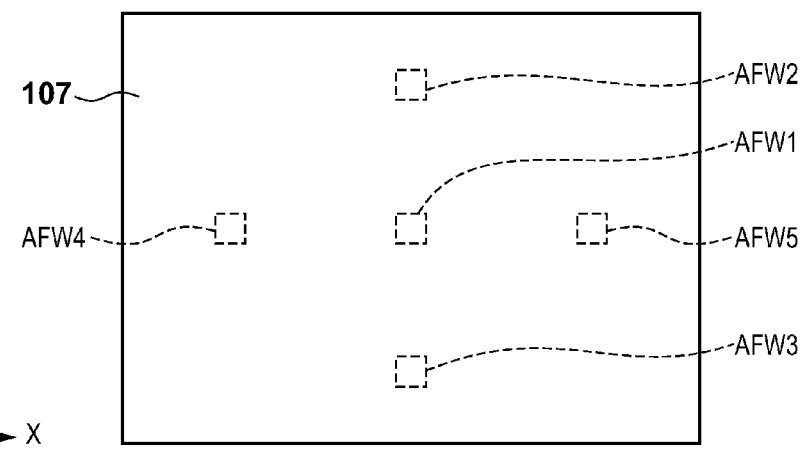
FIGS. 10A and 10B are views for explaining the arrangement of the photoelectric conversion units of the pixels at specific positions on the screen.

FIG. 10A is a view of the image sensor 107 viewed from the photographing optical system side. In the image sensor of the present invention, the focus detection pixels are discretely arranged all over the imaging area, as described with reference to FIG. 2. For this reason, focus detection is possible at an arbitrary position. However, since the exit pupil distance of the photographing optical system changes depending on the zoom state, the conjugated relation between the photoelectric conversion units and the exit pupil changes depending on the position (image height) on the image sensor, as described with reference to FIGS. 4A to 9B. The projection relationship will be described here by exemplifying five points on the image sensor 107, as shown in FIG. 10A. AFW1 to AFW5 indicate the representative positions of the center, upper, lower, left, and right focus detection areas, respectively.

Figure 10B:
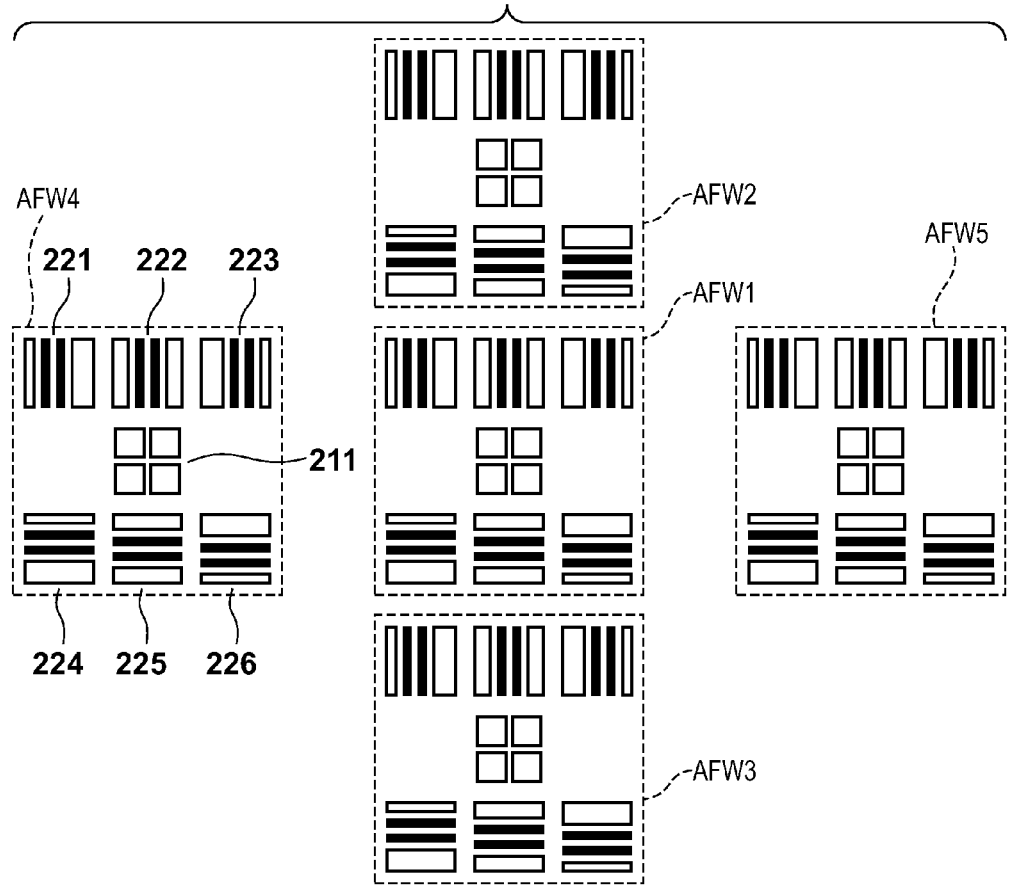

FIG. 10B shows only the photoelectric conversion units of the first pixels 211, the second pixels 221 to 223, and the third pixels 224 to 226 extracted in the five focus detection areas AFW1 to AFW5 shown in FIG. 10A. Solid rectangles indicate the photoelectric conversion units to be used for focus detection. Not all the photoelectric conversion units are used simultaneously, and they are selectively used in accordance with the zoom state of the photographing optical system, as will be described later.

Figure 11:
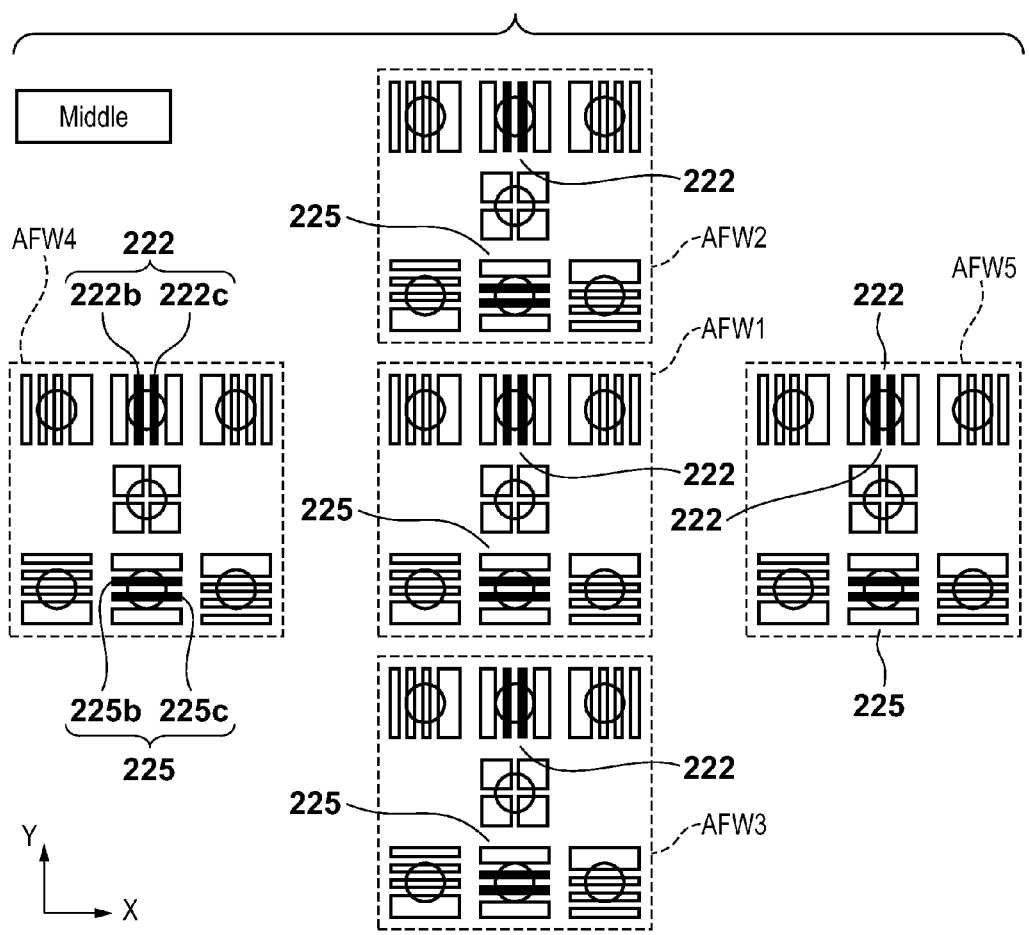
FIG. 11 is a view for explaining the positional relationship between the photoelectric conversion units and the projected images of the exit pupil when the zoom state is the Middle state.

FIG. 11 shows the projected images of the exit pupil on the photoelectric conversion units when the zoom state of the photographing optical system is Middle. FIGS. 5A and 5B and FIGS. 7A and 7B show the projected images of the photoelectric conversion units on the exit pupil plane of the photographing optical system. To the contrary, FIG. 11 shows the projected images of the exit pupil of the photographing optical system on the uppermost surfaces of the photoelectric conversion units. These drawings actually explain the same situation because the exit pupil and the photoelectric conversion units have the conjugated relation through the on-chip microlenses. FIGS. 5A to 5D and FIGS. 7A to 7D show two f-numbers of the photographing optical system, that is, F2.8 (full aperture state) and F5.6 (stopped-down-aperture state). FIG. 11 shows only the exit pupil when the f-number is F5.6.

Referring to FIG. 11, the exit pupil distance Zmid of the photographing optical system equals the standard distance Znorm. Hence, independently of the position on the image sensor 107, the connection centers of the photoelectric conversion units 211a to 211d of the first pixels 211 match the pupil projected images EP1a to EP1d of the exit pupil without being decentering. For focus detection, out of the second pixels 221 to 223 and the third pixels 224 to 226, the second pixels 222 and the third pixels 225 in which the connection centers of the focus detection photoelectric conversion units are not shifted are selected independently of the position on the image sensor 107.

FIG. 12 shows the projected images of the exit pupil on the photoelectric conversion units when the zoom state of the photographing optical system is Wide. In the Wide state, the exit pupil distance Zwide of the photographing optical system is shorter than the standard distance Znorm. Hence, the centers of the projected images of the exit pupil on the photoelectric conversion units decenter isotropically outward from the central position of the image sensor, and the decentering amount is proportional to the image height. In, for example, the focus detection area AFW2, the exit pupil decenters in the positive direction of the Y-axis. For this reason, out of the second pixels 221 to 223, the second pixel 222 in which the connection center of the focus detection photoelectric conversion units is not shifted is selected. In addition, out of the third pixels 224 to 226, the third pixel 224 in which the connection center of the focus detection photoelectric conversion units is shifted in the positive direction of the Y-axis is selected. In the focus detection area AFW4, the exit pupil decenters in the negative direction of the X-axis. For this reason, out of the second pixels 221 to 223, the second pixel 221 in which the connection center of the focus detection photoelectric conversion units is shifted in the negative direction of the X-axis is selected. In addition, out of the third pixels 224 to 226, the third pixel 225 in which the connection center of the focus detection photoelectric conversion units is not shifted in the Y-axis direction is selected.

It should be noted here that the pixels selected from the second pixels 221 to 223 and the third pixels 224 to 226 change depending on the position of the focus detection area. That is, the different kinds of second pixels 221, 222, and 223 are selected as the optimum second pixels in the focus detection areas AFW4, AFW1, and AFW5 having the same Y-coordinate, respectively. In addition, the different kinds of third pixels 224, 225, and 226 are selected as the optimum third pixels in the focus detection areas AFW2, AFW1, and AFW3 having the same X-coordinate, respectively.

FIG. 13 shows the projected images of the exit pupil on the photoelectric conversion units when the zoom state of the photographing optical system is Tele. In the Tele state, the exit pupil distance Ztele of the photographing optical system is longer than the standard distance Znorm. Hence, the centers of the projected images of the exit pupil on the photoelectric conversion units decenter isotropically inward from the central position of the image sensor, and the decentering amount is proportional to the image height. In, for example, the focus detection area AFW2, the exit pupil decenters in the negative direction of the Y-axis. For this reason, out of the second pixels 221 to 223, the second pixel 222 in which the connection center of the focus detection photoelectric conversion units is not shifted is selected. In addition, out of the third pixels 224 to 226, the third pixel 226 in which the connection center of the focus detection photoelectric conversion units is shifted in the negative direction of the Y-axis is selected. In the focus detection area AFW4, the exit pupil decenters in the positive direction of the X-axis. For this reason, out of the second pixels 221 to 223, the second pixel 223 in which the connection center of the focus detection photoelectric conversion units is shifted in the positive direction of the X-axis is selected. In addition, out of the third pixels 224 to 226, the third pixel 225 in which the connection center of the focus detection photoelectric conversion units is not shifted in the Y-axis direction is selected.

Although the selected focus detection pixels change depending on the position of the focus detection area, as in FIG. 12, the direction is reversed. That is, the different kinds of second pixels 223, 222, and 221 are selected as the optimum second pixels in the focus detection areas AFW4, AFW1, and AFW5 having the same Y-coordinate, respectively. In addition, the different kinds of third pixels 226, 225, and 224 are selected as the optimum third pixels in the focus detection areas AFW2, AFW1, and AFW3 having the same X-coordinate, respectively.

Figure 14A:
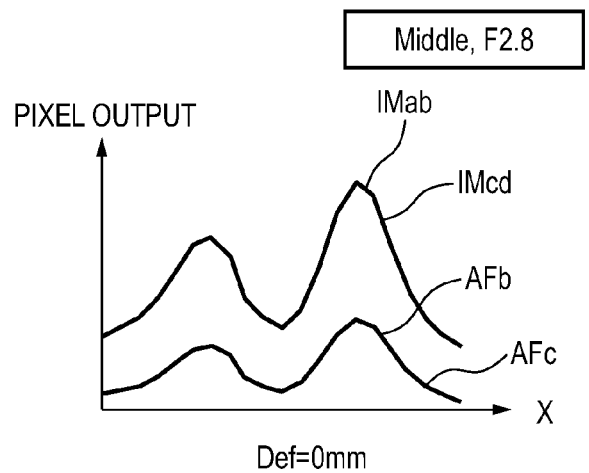
FIGS. 14A to 14C are graphs for explaining changes in the output signals of a first pixel and a second pixel caused by defocus.
Figure 14B:
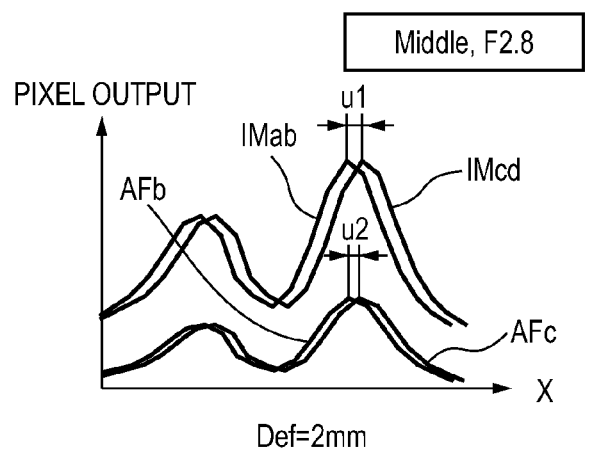
Figure 14C:
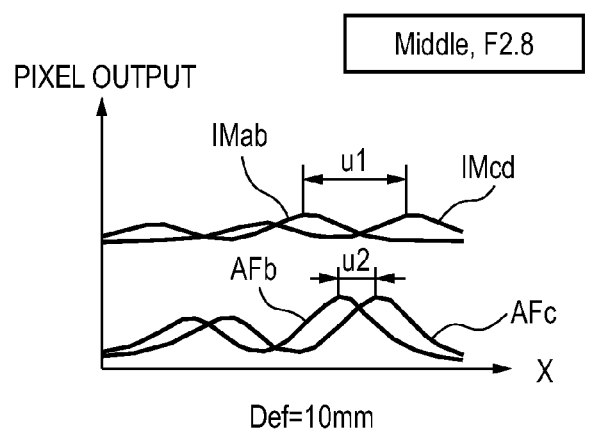

FIGS. 14A to 14C show the output waveforms of the first pixels 211 and the second pixels 222 at the time of focus detection. The abscissa represents the X-coordinate of the pixel, and the ordinate represents the pixel signal output. The zoom state is Middle. The f-number is the full aperture state (F2.8). The focus detection area is AFW1 at the center of the image plane. The object has a vertical-striped pattern having a luminance change in the X-axis direction but no luminance change in the Y-axis direction. In this case, the second pixels 222 that divide the pupil in the X-axis direction is used for focus detection. In the second pixels 222, the outputs of the photoelectric conversion units 222b and 222c at the center are used for focus detection, as shown in FIG. 2 or 11. The output waveforms are indicated by AFb and AFc in FIGS. 14A to 14C. In the first pixels 211, the sum signal of the photoelectric conversion units 211a and 211b juxtaposed in the Y-axis direction and the sum signal of the photoelectric conversion units 211c and 211d are usable as a pair of focus detection signals. The pair of image signals are indicated by IMab and IMcd.

FIG. 14A shows the waveforms when the defocus amount is 0, that is, in the in-focus state. In the in-focus state, all the signals IMab and IMcd of the first pixels 211 and the signals AFb and AFc of the second pixels 222 are in phase in the X direction without any lateral shift. The signal strength is proportional to the light reception amount of each pixel. As described with reference to FIGS. 5A and 5C, the light reception amounts of the second pixels 222 is smaller than those of the first pixels 211 when the f-number is F2.8. Hence, in FIG. 14A, the signal strengths hold a relationship given by $$IMab=IMcd>AFb=AFc \qquad (2)$$

FIG. 14B shows the waveforms when the focus shift amount is relatively small, for example, when the defocus amount is 2 mm. The pair of image signals IMab and IMcd obtained from the first pixel 211 generates an image shift amount u1. The pair of image signals AFb and AFc obtained from the second pixel 222 generates an image shift amount u2. Since the base-line length of each of the first pixels 211 is larger, the relationship between the image shift amounts is represented by u1>u2. On the other hand, when the defocus amount is small, the decrease in the contrast caused by the blur of each focus detection image is slight (the contrast is equal to or higher than a predetermined threshold), and all image signals hold sufficient contrast information. Hence, when the defocus amount is small, as shown in FIG. 14B, focus detection is possible by both the first pixels 211 and the second pixels 222. However, since each of the first pixels 211 has a larger base-line length and a higher focus detection accuracy, the in-focus state is preferably controlled preferentially using the image shift amount u1.

FIG. 14C shows the waveforms when the focus shift amount is relatively large, for example, when the defocus amount is 10 mm. In this case as well, the pair of image signals IMab and IMcd obtained from the first pixels 211 generates the image shift amount u1. The pair of image signals AFb and AFc obtained from the second pixels 222 generates the image shift amount u2. The relationship between them is represented by u1>u2. However, since the pupil intensity distribution of the first pixels 211 largely spreads, the image blur is large, and the contrast of the focus detection signals greatly lowers (that is, the contrast is lower than the predetermined threshold). Hence, the reliability of correlation for detecting the lateral shift amount of the pair of images also lowers, and the possibility of detection errors increases. On the other hand, since the second pixels 222 have a sharp pupil intensity distribution, the image blur is small, and the contrast of the focus detection signals maintains a relatively high value. For this reason, when the defocus amount is large, the in-focus state is preferably controlled preferentially using the image shift amount u2 of the second pixels 222.

A case in which the focus detection area is located at the center has been described with reference to FIGS. 14A to 14C. When the zoom state is Middle, the projection relationship between the photoelectric conversion units of the pixels and the exit pupil of the photographing optical system have no image height dependence. Hence, in the focus detection areas at the periphery of the screen, basically, the same characteristics as in FIGS. 14A to 14C can be obtained, although the strengths of the output waveforms IMab and IMcd of the first pixels 211 slightly lower due to the decrease in the light amount caused by vignetting of the photographing optical system.

Figure 15A:
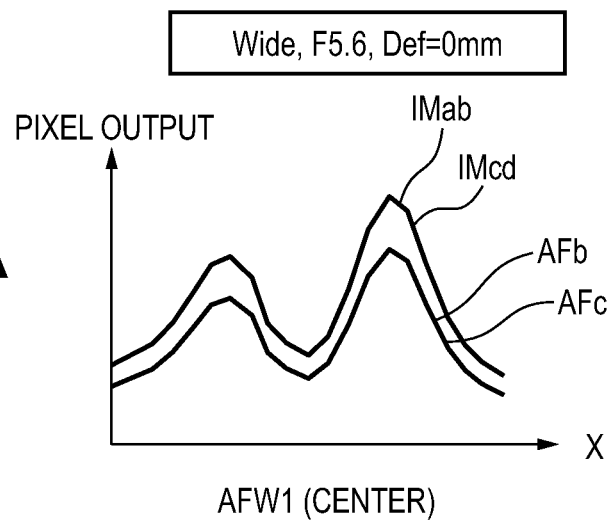
FIGS. 15A and 15B are graphs for explaining the difference in the output signal between the first pixel and the second pixel depending on the focus detection area.
Figure 15B:
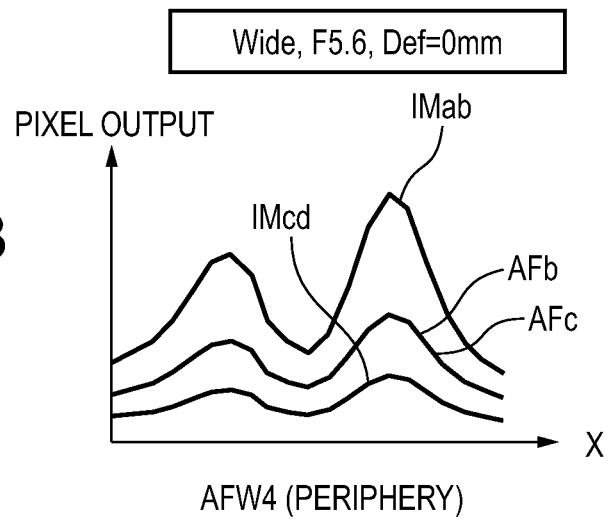

FIGS. 15A and 15B show the output waveforms when the conjugated relation between the photoelectric conversion units of a pixel and the exit pupil of the photographing optical system changes depending on the image height. The zoom state is Wide. The f-number is the stopped-down-aperture state (F.5.6). The focus state is in-focus (the defocus amount is 0). As the focus detection areas, AFW1 at the center and AFW4 at the periphery are shown.

FIG. 15A shows the output waveforms in the focus detection area AFW1 at the center, which correspond to the signals output from the first pixels 211 and the second pixels 222 in the focus detection area AFW1 shown in FIG. 12. In this case, the signals IMab and IMcd obtained from the first pixels 211 match. The signals AFb and AFc obtained from the second pixels 222 also match. The relationship between the signal strengths is determined by the shape of each photoelectric conversion unit and the area of the projected image of the exit pupil corresponding to F5.6 on the photoelectric conversion unit. In the first embodiment, the relationship is given by $$IMab=IMcd \geq AFb=AFc \qquad (3)$$

Hence, in this state, almost the same focus detection accuracy can be obtained using either of the signals of the first and second pixels.

FIG. 15B shows the output waveforms in the focus detection area AFW4 at the periphery, which correspond to the signals output from the first pixels 211 and the second pixels 221 in the focus detection area AFW4 shown in FIG. 12. In this case, since the second pixels 221 in which the decentering of the projected image of the exit pupil of the photographing optical system is minimum is selected, the outputs AFb and AFc match. On the other hand, in the first pixels 211, the decentering of the exit pupil cannot be canceled, and the pair of signals IMab and IMcd has a large difference. Hence, a relationship is as follows.

$$IMab>AFb=AFc>IMcd \qquad (4)$$

That is, since the strength of the signal IMcd, which is one of the signals obtained from the first pixels 211, largely lowers, the reliability of focus detection calculation using the signal is low. Hence, in this state, focus detection is preferably performed using the signals of the second pixels 221.

Figure 16A:
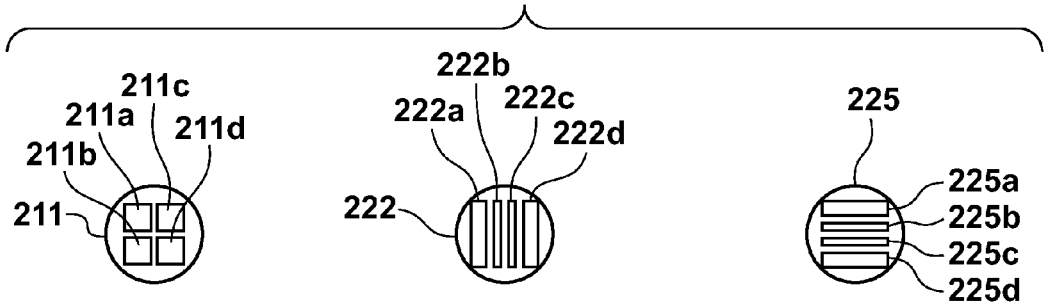
FIGS. 16A to 16C are conceptual views for explaining a method of adding the outputs of photoelectric conversion units when creating a 3D image according to the first embodiment.
Figure 16B:
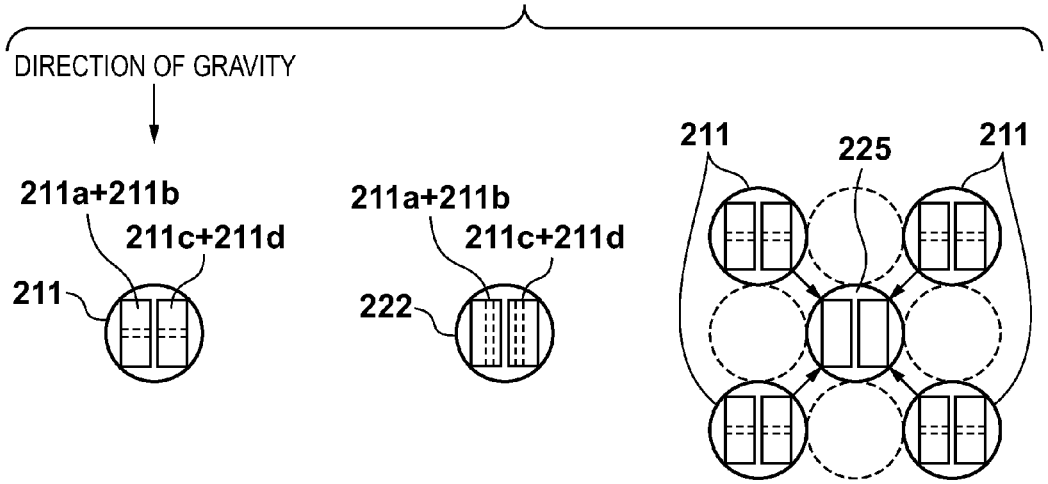
Figure 16C:
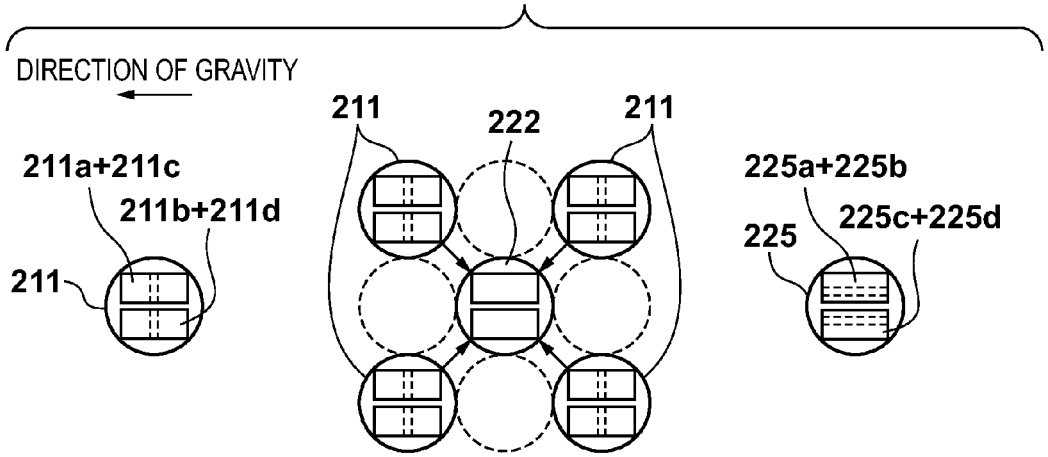

FIGS. 16A to 16C conceptually illustrate a method of adding the outputs of the photoelectric conversion units and a pixel interpolation method when creating a 3D image. In the first embodiment, each pixel has a plurality of photoelectric conversion units all over the image sensor 107 so that a parallax image can be obtained. Hence, a 3D image can be created by the following method.

FIG. 16A shows the arrangements of three kinds of pixels and illustrates the shapes of the photoelectric conversion units of the first pixel 211, the second pixel 222, and the third pixel 225 from the left.

FIG. 16B is a view for explaining a pixel signal processing method when the user holds the camera in the landscape orientation, that is, when the user holds the camera to make the negative direction of the Y-axis of the image sensor 107 shown in FIG. 2 match the direction of gravity. The human eyes are arranged along the horizontal axis orthogonal to the direction of gravity. For this reason, to create a 3D image, the extended line of the base line for generating a parallax is preferably parallel to the horizontal axis. Hence, when the attitude detection unit 116 shown in FIG. 1 detects the attitude of the camera, and it is consequently determined that the direction of gravity is directed downward in FIG. 16B, the signals of the photoelectric conversion units are processed in the following way.

For the first pixel 211, the sum of the signals of the photoelectric conversion units 211a and 211b serves as one signal of the parallax image, and the sum of the signals of the photoelectric conversion units 211c and 211d serves as the other signal. For the second pixel 222, the sum of the signals of the photoelectric conversion units 222a and 222b serves as one signal of the parallax image, and the sum of the signals of the photoelectric conversion units 222c and 222d serves as the other signal. This operation allows to obtain a 3D image signal equivalent to the first pixel 211. On the other hand, in the other second pixels 221 and 223, the segmented shape of the photoelectric conversion units is asymmetrical in the X direction. It is therefore impossible to obtain a 3D image signal equivalent to the first pixel 211 by performing the same addition as in the second pixel 222. For the second pixels 221 and 223, a 3D image signal is created by the same interpolation calculation as in the third pixels to be described next.

The third pixel 225 has no parallax information in the horizontal axis direction. Hence, a pair of parallax signals is created by interpolation from the four first pixels 211 adjacent in diagonal directions at an angle of 45°. This also applies to the other third pixels 224 and 226. With the above-described processing, a pair of signals can be obtained in every pixel. Note that all the above-described processes are executed by the CPU 121 of the camera.

FIG. 16C is a view for explaining a pixel signal processing method when the user holds the camera in the portrait orientation, that is, when the user holds the camera to make the negative direction of the X-axis of the image sensor 107 shown in FIG. 2 match the direction of gravity. In this case, the addition processing of the photoelectric conversion units is performed in a direction orthogonal to that in FIG. 16B. For the first pixel 211, the sum of the signals of the photoelectric conversion units 211a and 211c serves as one signal of the parallax image, and the sum of the signals of the photoelectric conversion units 211b and 211d serves as the other signal. The second pixels have no parallax information in the horizontal axis direction, that is, in the vertical direction of FIG. 16C. Hence, a pair of parallax signals is created by interpolation from the four first pixels 211 adjacent in diagonal directions at an angle of 45°. For the third pixel 225, the sum of the signals of the photoelectric conversion units 225a and 225b serves as one signal of the parallax image, and the sum of the signals of the photoelectric conversion units 225c and 225d serves as the other signal.

With the above-described processing, the direction of gravity acting on the camera is detected, and a 3D image is created based on the result. Note that the user can select in advance whether to switch the combination of signals to be added in accordance with the direction of gravity, and this will be described later with reference to flowcharts.

Figure 17A:
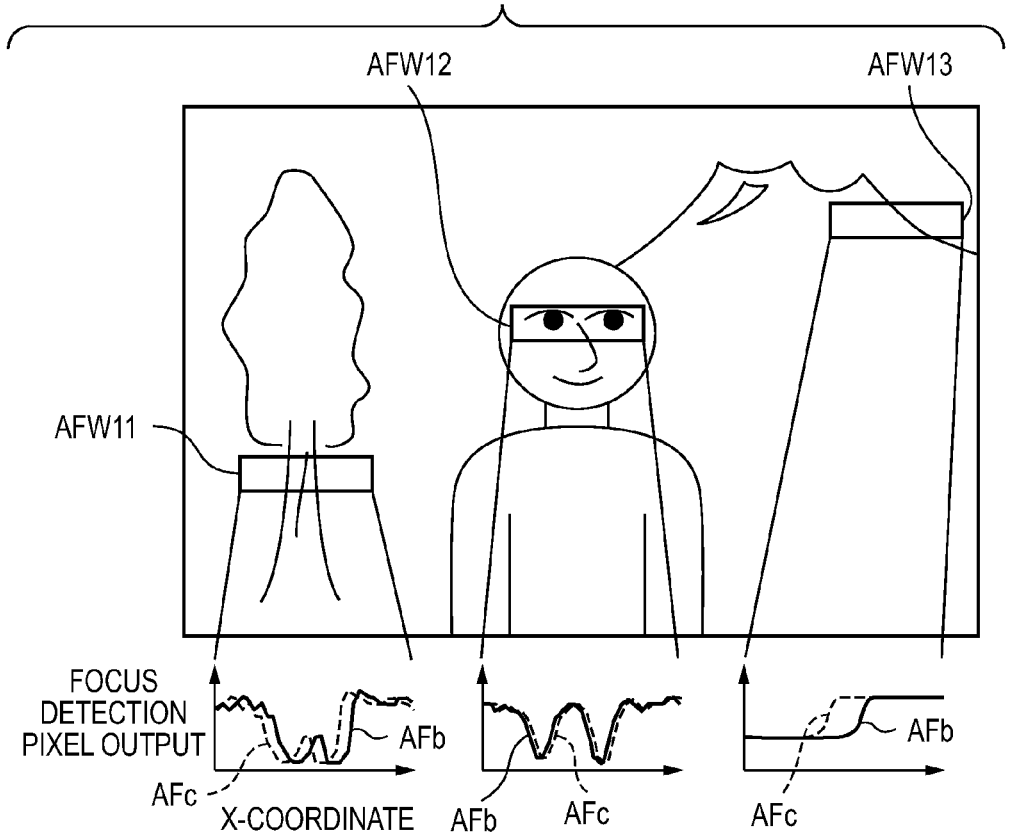
FIGS. 17A and 17B are views showing examples of an image, focus detection signals, and a defocus map at the time of focus detection.
Figure 17B:
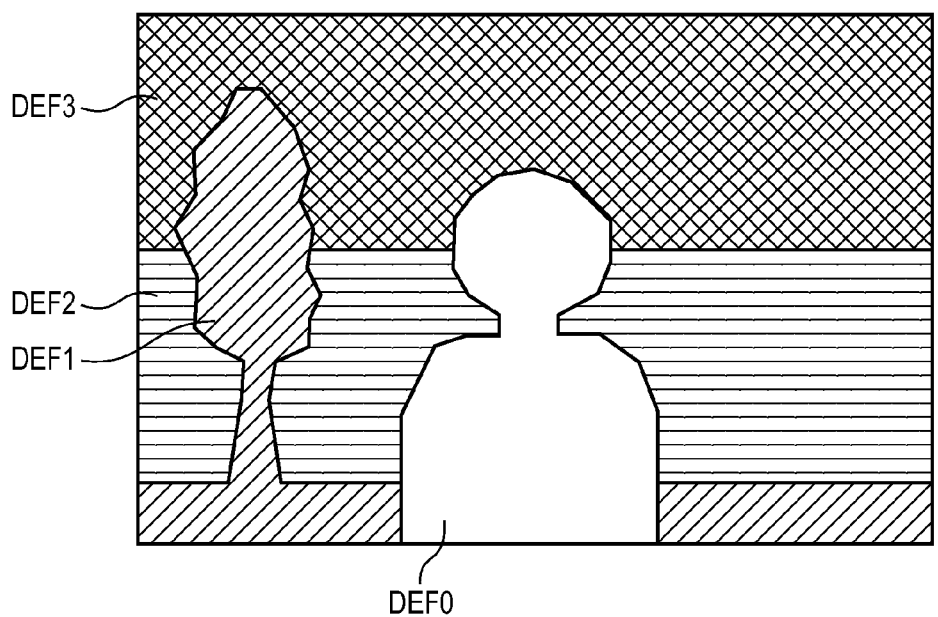

FIGS. 17A and 17B are views for explaining an image and focus detection signals acquired at the time of focus detection and a defocus map obtained from the focus detection result. Referring to FIG. 17A, the object image formed in the imaging plane includes a person at a close distance in the middle, a tree at an intermediate distance on the left side, and a mountain at a far distance on the upper right side. A case will be explained in which the signals of the second pixels 222 are employed as the focus detection signals of the image shown in FIG. 17A.

In FIG. 17A, the face of the person exists at the center of the screen. When the presence of the face is detected by a known face recognition technique, the pair of focus detection signals AFb and AFc of the second pixels 222 are obtained about the face region. For regions other than the face region, focus detection areas are set all over the photographing screen at a predetermined pitch. A focus detection area corresponding to the tree trunk and the signals thereof are shown on the left side of FIG. 17A. A focus detection area corresponding to the mountain ridgeline and the signals thereof are shown on the right side of FIG. 17A. Since a pair of signals obtained in each focus detection area is laterally shifted, a lateral shift amount u is calculated by known correlation, and the defocus amount is calculated using equation (1).

After that, for the main object, that is, the face region located at the center in FIGS. 17A and 17B, the focus lens of the photographing optical system is driven so that the defocus amount becomes 0, and the focus detection is performed again.

With the above-described focus adjustment process, focus shift information, that is, a so-called defocus map in the entire photographing screen can be acquired. An example is shown in FIG. 17B. FIG. 17B illustrates an example in which the defocus amounts are integrated, based on a predetermined resolution, into DEF0 to DEF3 sequentially from the region with a small defocus amount.

Figure 18:
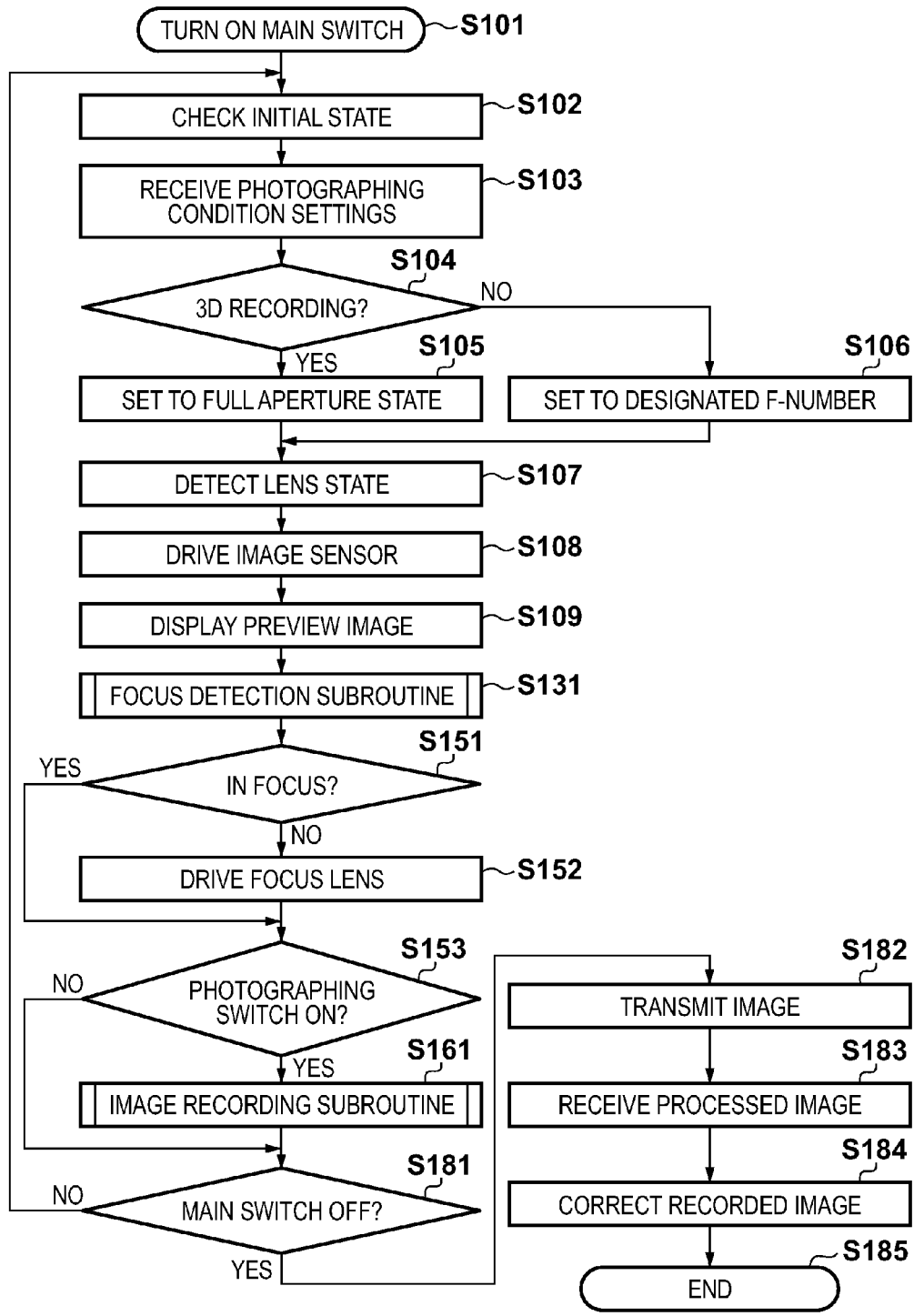
FIG. 18 is a flowchart showing the main procedure of a camera at the time of photographing according to the first embodiment.
Figure 20:
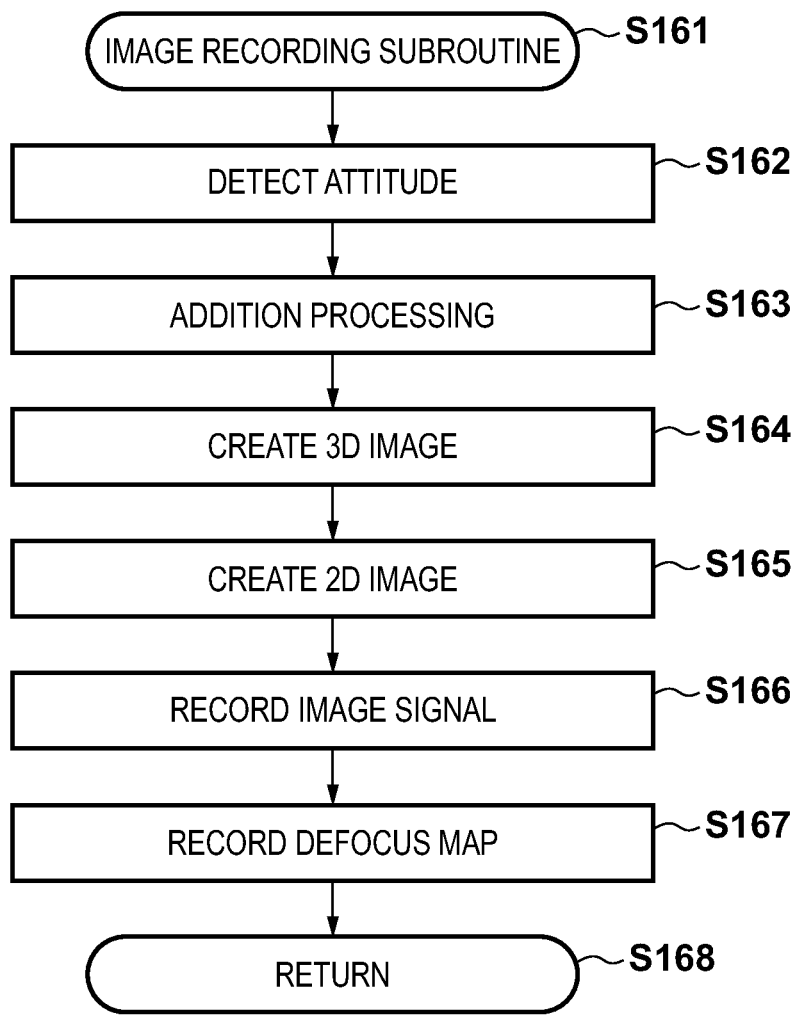
FIG. 20 is a flowchart of an image recording subroutine according to the first embodiment.

FIGS. 18 to 20 are flowcharts for explaining focus adjustment processing and photographing processing of the camera according to the first embodiment of the present invention. The processing will be described below also with reference to FIGS. 1 to 17B described above.

FIG. 18 is a flowchart showing the procedure of photographing processing according to the first embodiment. In step S101, the user turns on the power switch of the camera. In step S102, the CPU 121 checks the operations of the actuators and the image sensor 107 in the camera, initializes the memory contents and execution programs, and executes a prephotographing operation.

In step S103, the CPU receives photographing condition settings. More specifically, the CPU 121 receives the exposure adjustment mode, the focus adjustment mode, the image mode (2D or 3D), the image quality (the number of recording pixels, compression ratio, and the like), and the like set by the user.

In step S104, it is determined whether the 3D recording mode is set. If the 3D recording mode is set, the CPU 121 fixes the f-number at the time of photographing to the full aperture state in step S105. For the 3D recording, a pair of images needs to have appropriate parallax information, and the parallax information decreases when the stop of the photographing optical system is set in the stopped-down-aperture state to adjust the light amount. Hence, in the 3D recording mode, the stop is fixed in the full aperture state, and the exposure amount is adjusted by the accumulation time of the image sensor 107. Upon determining in step S104 that the 2D mode is set, the CPU 121 controls the f-number to a designated value in step S106. The designated value here is an f-number selected by the user in aperture priority AE or a preset f-number based on the exposure control program in program AE.

In step S107, the zoom state, focus lens state, and stop state of the photographing optical system are detected, and pieces of information such as the size of the exit pupil and the exit pupil distance are read out from the ROM. In step S108, the image sensor 107 starts the image capturing operation and reads pixel signals. In step S109, a reduced image for display is created from the read pixel signals and displayed on the display device 131 provided on the rear surface of the camera. The user can determine the composition or perform the zoom operation while visually checking the preview image.

In step S131, a focus detection subroutine to be described later is executed. In step S151, the CPU 121 determines whether the focus lens driving amount calculated in step S131 is equal to or smaller than a predetermined value. If the focus lens driving amount is equal to or smaller than the predetermined value, the CPU 121 determines that the in-focus state is obtained, and the process advances to step S153. If the focus lens driving amount exceeds the predetermined value, the focus lens is driven in step S152.

In step S153, the CPU 121 determines whether the photographing switch is on. If the switch is not on, the process advances to step S181. If the switch is on, the CPU executes, in step S161, an image recording subroutine to be described later.

In step S181, the CPU 121 determines the state of the main switch. If the on state is maintained, the process returns to step S102 to repetitively execute the processing of steps S102 to S161 described above. Upon determining in step S181 that the main switch is off, processing from step S182 is executed.

In step S182, the image recorded in step S161 is transmitted to the server computer via an Internet connection. Then, the server computer executes processing of large calculation scale such as reconstruction of the parallax information of the 3D image and accurate defocus map calculation. In step S183, the image processed by the server computer is received. In step S184, a corrected portion processed by the server computer is added or replacement correction is performed for the original image recorded in step S161. In step S185, the photographing ends.

FIG. 19 is a flowchart of the focus detection subroutine to be performed in step S131 of FIG. 18. In step S132, the object pattern is recognized from the preview image, and face image determination, contrast analysis of the entire photographing screen, and the like are performed. In step S133, the main object to be focused is determined based on the recognition result in step S132. In step S134, the exit pupil of the photographing optical system is calculated based on the lens information acquired in step S107 of FIG. 18. More specifically, the size of the exit pupil and its distance from the image plane are calculated, and vignetting for each image height is calculated. In step S135, pixels which are less affected by the vignetting and to be used for focus detection are selected in each focus detection area based on the exit pupil information calculated in step S134. In step S136, a pair of images to be used for correlation is created from the outputs of the photoelectric conversion units of each selected pixel. Note that only one type of pixels is not necessarily selected in step S136, and a plurality of types of pixels are selected if they are less affected by vignetting.

In step S137, so-called shading correction is performed for the created focus detection signals to reduce the unbalance of the light amounts caused by vignetting. This allows to reduce the strength difference between two images and improve the focus detection accuracy. In step S138, correlation is performed to calculate the lateral shift amount u of the two images that have undergone the shading correction. In step S139, the reliability of the image shift detection result is determined based on the level of matching between the two images calculated in the correlation process of step S138. A value with a low reliability is not employed.

In step S140, the defocus amount is calculated using equation (1) from the reliable image shift amount u obtained in steps S138 and S139 and the base-line lengths θ of the pixels used for focus detection. In step S141, the defocus map in the entire photographing region is created. Note that the resolution (in the planar direction and the depth direction) of the defocus map is set to such a value that does not affect the recording rate of a moving image because the higher the resolution is, the longer the calculation time is. If a detailed defocus map is necessary, the calculation is done in a high-performance server computer, as described concerning step S182 of FIG. 18. In step S142, the focus lens driving amount is calculated based on the main object region determined in step S133 and the defocus map created in step S141. In step S143, the process returns to the main routine.

FIG. 20 is a flowchart of the image recording subroutine to be performed in step S161 of FIG. 18. When the photographing switch is turned on, the attitude of the camera is detected in step S162. In step S163, addition of the photoelectric conversion units and pixel interpolation processing are performed based on the attitude detection result using the methods described with reference to FIGS. 16A to 16C. In step S164, a 3D image complying with a predetermined format is created. In step S165, a normal 2D image is created by erasing the parallax information from the image created in step S164. The 2D image without the parallax information can be obtained by, for example, adding the pixel information at the same coordinates in a pair of images. In step S166, predetermined compression processing is performed for the images created in steps S164 and S165, and the images are recorded in the flash memory 133.

In step S167, the defocus map created in step S141 of FIG. 19 is recorded in association with the images. In step S168, the process returns to the main routine.

As described above, according to the first embodiment, the first pixel includes 2×2 photoelectric conversion units arranged in the X and Y directions. The second pixel includes 4×1 photoelectric conversion units arranged only in the X direction. The third pixel includes 1×4 photoelectric conversion units arranged only in the Y direction. At the time of focus adjustment, the signals from the first pixels are used under the condition that the allowable value (in-focus accuracy standard) of focus detection errors is small, and highly accurate distance measurement is necessary. The signals from the second pixels and the third pixels are used under the condition that focus detection is difficult to perform using the signals from the first pixels, for example, when the exit pupil distance of the photographing optical system is not appropriate, or the defocus amount is large. Hence, selectively using the first pixels, the second pixels, and the third pixels in accordance with the condition allows to reduce the probability that focus detection is impossible and acquire a high-quality in-focus image.

The total number of photoelectric conversion units is four in all the first pixel, the second pixel, and the third pixel. Hence, the pixels are structurally different only in the shapes of the photoelectric conversion units and those of local electrodes for deriving electric charges from there and can have the same structure except these portions. Hence, the first pixel, the second pixel, and the third pixel have almost the same electrical characteristics. Since the electrical characteristics can be substantially equal, it is possible to eliminate the sensitivity unevenness or the like between the pixels and obtain a high-quality image. In addition, the circuit pattern of the image sensor is easy to design.

Upon focus detection, when all photoelectric conversion units of the first pixel are used, the base-line length increases, and highly accurate focus detection can be performed. This contributes to an increase in in-focus accuracy. When the photoelectric conversion units of the second pixel and/or the third pixel are partially used, the blur and lateral shift of the focus detection image can be suppressed. This contributes to widening of the detection limit in the large defocus state. It is therefore possible to prevent the in-focus position from being lost and increase the in-focus accuracy even when the focus shift amount is large.

The second pixel and the third pixel are especially useful in a large out-of-focus state. However, a largely blurred scene out of a photographed scene corresponds to a transient state, and the in-focus state or almost in-focus state is obtained in most of the photographing time. Therefore, by using a high density array of the first pixels, the focus detection accuracy and stability in the in-focus state or almost in-focus state that takes up most of the photographed scene can be increased, and a high-quality image can be obtained. The image capturing apparatus according to the present invention can acquire a 3D image. To obtain a sufficient parallax in the 3D photographing mode, the photographing optical system having a small f-number is often used near the full aperture state. In this case as well, the first pixel is useful. Hence, a high density array of the first pixels is used, thereby increasing the in-focus accuracy for the main object and obtaining a high definition 3D image. The density of the first pixels is preferably higher even for creation of the defocus map. The resolution of the defocus map can be divided into the resolution in the planar direction and that in the depth direction. In an object area almost in focus, the resolutions can be high in both the planar and depth directions. In an area largely out of focus, the resolutions can be low in both directions. Hence, when the arrangement density of the first pixels is raised, a defocus map that satisfies the above-described characteristics and has a well-balanced data amount and information accuracy can be obtained.

<Second Embodiment>

In the above-described first embodiment, the first pixel 211 includes total of four photoelectric conversion units 211a to 211d segmented into two parts (integer m1=2) in the X direction and two parts (integer n1=2) in the Y direction as well. Each of the second pixels 221 to 223 includes total of four independent photoelectric conversion units segmented into four parts (integer m2=4) in the X direction but not segmented (integer n2=1) in the Y direction.

In the second embodiment to be described below, the number of segments in the X direction is increased in all of a first pixel 211 and second pixels 221 to 223. The pixels included in an image sensor 107 according to the second embodiment will be described below with reference to FIGS. 21 and 22A to 22C. Note that since the arrangement is actually the same as in the first embodiment except the number of photoelectric conversion units, only the different points will be described, and a description of same or similar parts will be omitted.

Figure 21:
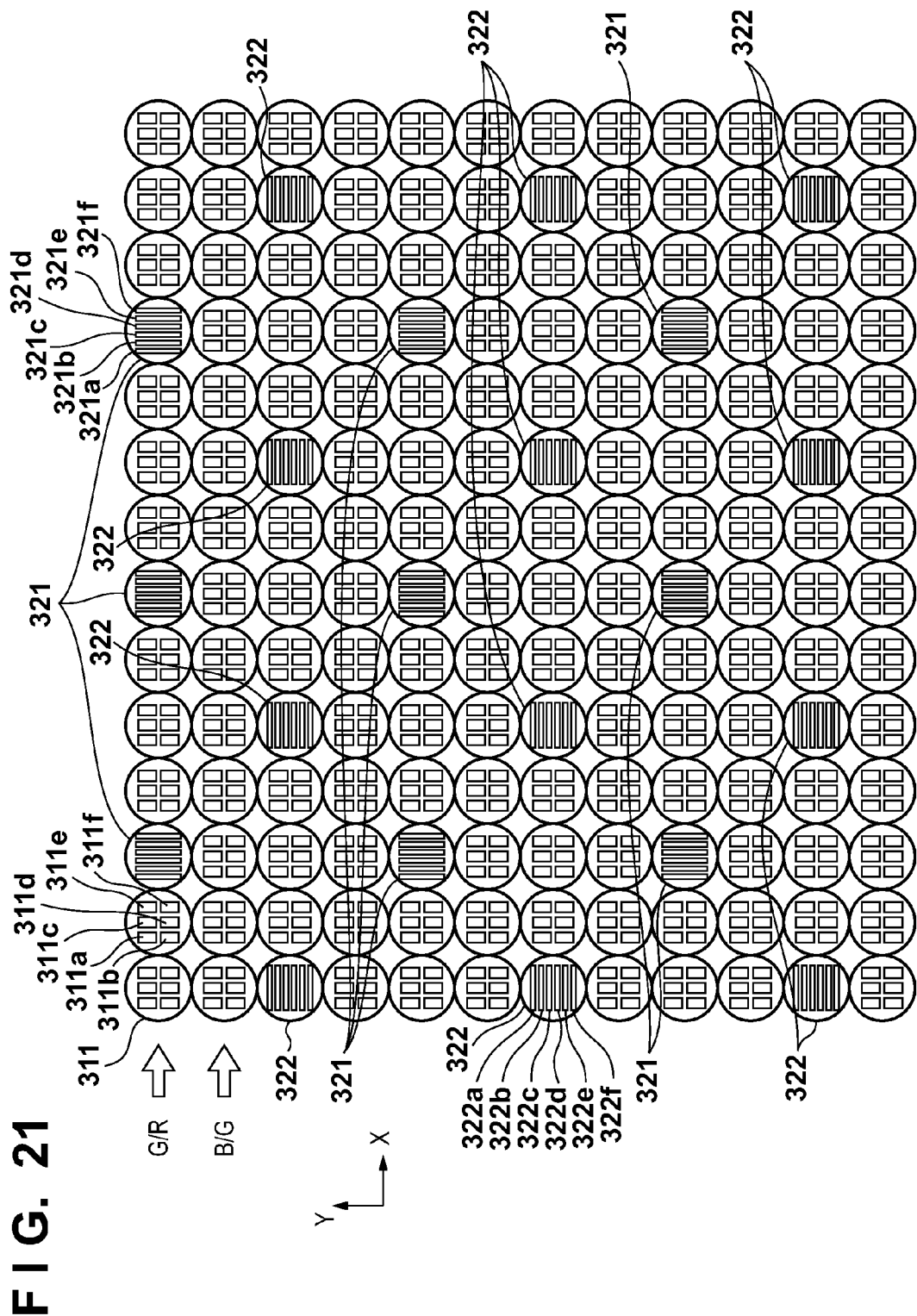
FIG. 21 is a view showing the pixel array of an image sensor according to a second embodiment.

FIG. 21 shows the pixel array of the image sensor 107 according to the second embodiment of the present invention. Note that a description of the same ability as in FIG. 2 will be omitted.

A first pixel 311 includes a total of six photoelectric conversion units 311a to 311f segmented into three parts (integer m1=3) in the X direction and two parts (integer n1=2) in the Y direction. The six photoelectric conversion units 311a to 311f are divided so as to be line symmetry about the X- and Y-axes passing through the pixel center. That is, each of the divided photoelectric conversion units has a rectangular planar shape long in the Y-axis direction. The connected shape of the six regions is square. The photoelectric conversion units have the same segmented shape at all positions on the image plane. The outputs of the first pixel 311 are used for recording image generation and focus detection in a near in-focus state, like those of the first pixel 211 of the above-described first embodiment. Note that the other pixels having the same structure and arranged in the image sensor 107 will also be referred to as the first pixels 311 hereinafter.

Second pixels 321 are discretely arranged among the first pixels 311 in accordance with a predetermined array rule. The second pixel 321 includes a total of six photoelectric conversion units 321a to 321f segmented into six parts (integer m2=6) in the X direction but not segmented (integer n2=1) in the Y direction. The connected shape of the photoelectric conversion units 321a to 321f of the second pixel 321 is also square. The outputs of the second pixel 321 are used for recording image generation and focus detection in a large defocus state (when the focus shift amount is large). In FIG. 21, out of the six divided photoelectric conversion units, predetermined two photoelectric conversion units are used for focus detection. As described above with reference to FIGS. 11 to 13 of the first embodiment, the positions of the exit pupil of the photographing optical system projected onto the photoelectric conversion units 321a to 321f change depending on the exit pupil distance of the photographing optical system and the image height (X-Y coordinates) of the pixel of interest. Hence, the eclipsed state of each of the six photoelectric conversion units 321a to 321f is calculated in accordance with a predetermined equation. Two photoelectric conversion units out of the photoelectric conversion units 321a to 321f, which have the minimum eclipse, are used for focus detection, thereby performing accurate focus detection. That is, in the second pixels 221 to 223 of the first embodiment, the photoelectric conversion units have three segmentation patterns, and optimum photoelectric conversion units are selectively used in accordance with the eclipsed state. By contrast, in the second embodiment, the second pixel 321 has only one segmentation pattern, and the pixel array rule is simplified. Note that the pixels having the same structure and arranged in the image sensor 107 will also be referred to as the second pixels 321 hereinafter.

The second pixel 321 is a pixel for pupil division in the X direction and is used for an object having a luminance distribution in the X direction, that is, an object having a vertical-striped pattern. To the contrary, a third pixel 322 is a pixel for pupil division in the Y direction and is used for an object having a luminance distribution in the Y direction, that is, an object having a lateral-striped pattern. The third pixel 322 includes six photoelectric conversion units 322a to 322f arranged in the Y direction. The pattern is equivalent to that of the second pixel 321 rotated by 90°, and a detailed description thereof will be omitted. The connection shape of the photoelectric conversion units is square in all of the first to third pixels. A suitable one of the second pixel 321 and the third pixel 322 is used in accordance with the luminance distribution pattern of a focus detection target object, thereby reducing the probability that focus detection is impossible.

Figure 22A:
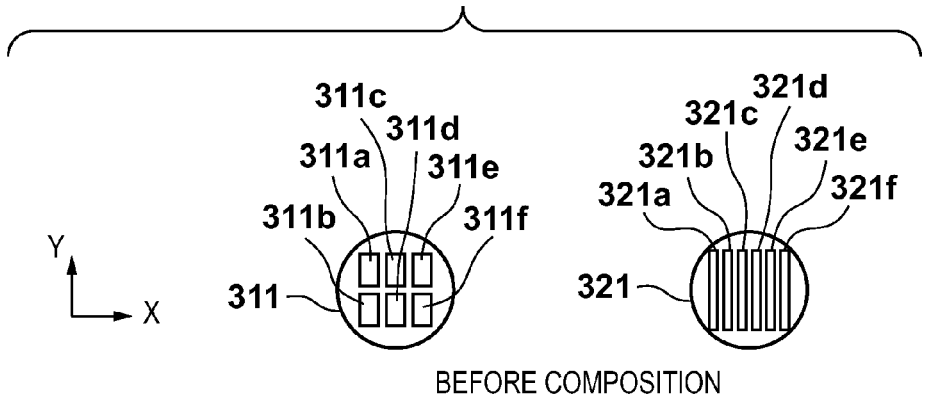
FIGS. 22A to 22C are conceptual views for explaining a method of adding the outputs of photoelectric conversion units when creating a 3D image according to the second embodiment.
Figure 22B:
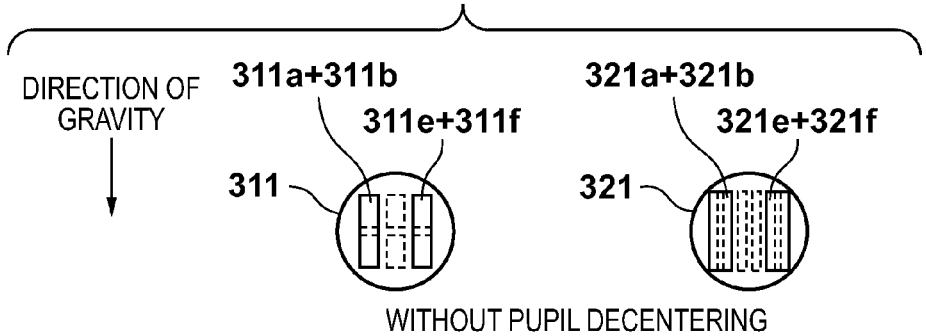
Figure 22C:
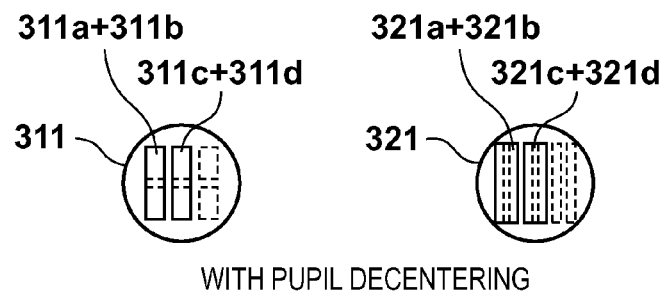

FIGS. 22A to 22C conceptually illustrate a method of adding the outputs of the photoelectric conversion units and a pixel interpolation method when creating a 3D image according to the second embodiment. FIGS. 22A to 22C show the addition method for only a case in which the gravity acts in the Y-axis direction.

FIG. 22A shows the arrangements of the photoelectric conversion units provided in the first pixel 311 and the second pixel 321 anew.

FIGS. 22B and 22C are views for explaining a pixel signal processing method when the user holds the camera in the landscape orientation, that is, when the user holds the camera to make the negative direction of the Y-axis of the image sensor shown in FIG. 21 match the direction of gravity. FIG. 22B shows the addition method when the center of the projected image of the exit pupil of the photographing optical system does not decenter with respect to the connection center of the photoelectric conversion units. In this case, for the first pixel 311, the sum of the signals of the photoelectric conversion units 311a and 311b arranged on the left side serves as one signal of the parallax image, and the sum of the signals of the photoelectric conversion units 311e and 311f arranged on the right side serves as the other signal. The photoelectric conversion units 311c and 311d at the center are not used because they do not contribute to parallax formation.

For the second pixel 321, the sum of the signals of the photoelectric conversion units 321a and 321b to the left serves as one signal of the parallax image, and the sum of the signals of the photoelectric conversion units 321e and 321f to the right serves as the other signal. The parallax information can also be obtained from the two photoelectric conversion units 321c and 321d to the center. However, to make the parallax information have the same characteristics as those obtained from the first pixel 311, the signals of the two photoelectric conversion units 321c and 321d are not used.

The third pixel 322 has no parallax information in the horizontal axis direction. Hence, the parallax signals are created by the same interpolation processing as that described with reference to FIGS. 16A to 16C of the first embodiment, and a description thereof using the drawings will be omitted.

FIG. 22C shows the addition method when the center of the projected image of the exit pupil of the photographing optical system decenters to the left, that is, in the negative direction on the X-axis with respect to the connection center of the photoelectric conversion units. In this case, for the first pixel 311, the sum of the signals of the photoelectric conversion units 311a and 311b arranged on the left side serves as one signal of the parallax image, and the sum of the signals of the photoelectric conversion units 311c and 311d arranged at the center serves as the other signal. The signals of the photoelectric conversion units 311e and 311f on the right side are not used because sufficient amount of light does not enter due to vignetting.

For the second pixel 321, the sum of the signals of the photoelectric conversion units 321a and 321b to the left serves as one signal of the parallax image, and the sum of the signals of the photoelectric conversion units 321c and 321d to the center serves as the other signal. The signals of the two photoelectric conversion units 321e and 321f to the right are not used because sufficient amount of light does not enter due to vignetting. For the third pixel, the same processing as described with reference to FIG. 22B is performed, and a description thereof will be omitted.

Note that when the user holds the camera in the portrait orientation, that is, when the user holds the camera to make the negative direction of the X-axis of the image sensor 107 shown in FIG. 2 match the direction of gravity, the addition processing of the photoelectric conversion units is performed in a direction orthogonal to the addition direction in FIGS. 22B and 22C. The processing is the same as that described with reference to FIGS. 22B and 22C except that the second pixel 321 and the third pixel 322 are used reversely, and a description thereof will be omitted.

The relationship between the number m1 of X-direction segments of the photoelectric conversion units in the first pixel 311 and the number n1 of Y-direction segments is set to m1>n1 for the following reason.

In FIGS. 11 to 13 of the first embodiment, the decentering state of the projected image of the exit pupil of the photographing optical system with respect to the connection center of the photoelectric conversion units has been described. The decentering amount is proportional to the deviation amount from the standard value of the exit pupil distance of the photographing optical system and the image height of the image capturing region. Since the image capturing region has a rectangular shape long in the X direction, the maximum image height has a large X-direction component, and the maximum value of the decentering amount also has a large X-direction component. Hence, increasing the number of X-direction segments makes it possible to increase the degree of freedom of selection at the time of output addition and reliably acquire 3D information at an arbitrary image height.

Increasing the number of segments of the photoelectric conversion units also allows to increase the degree of combination at the time of addition. However, since the amount of image information also increases, the image processing apparatus is required to have high-speed processing performance. Hence, in the second embodiment, the number of Y-direction segments is set to 2, as in the first embodiment. The addition method for obtaining a 3D image from images photographed under the attitude in which the gravity acts in the X-axis direction is the same as that described with reference to FIG. 16C of the first embodiment, and a description thereof will be omitted.

As described above, according to the second embodiment, the numbers of segments of the photoelectric conversion units of the first pixel in the two directions are made to match the direction dependence of the photographing screen size. This allows to reliably obtain 3D information for arbitrary coordinates of the rectangular image capturing region and prevent the amount of image information from becoming excessively large.

<Third Embodiment>

In the above-described first and second embodiments, the numbers of segments of photoelectric conversion units are equal in the first to third pixels. That is, the number of segments is four in the first embodiment, and six in the second embodiment.

In the third embodiment, however, the number of segments of photoelectric conversion units is smaller in the second pixel than in the first pixel. The pixels included in an image sensor 107 according to the third embodiment will be described below with reference to FIG. 23. Note that since the arrangement is actually the same as in the first and second embodiments except the number of segments of photoelectric conversion units, only the different points will be described, and a description of same or similar parts will be omitted.

FIG. 23 shows the pixel array of the image sensor 107 according to the third embodiment of the present invention. Note that a description of the same ability as in FIGS. 2 and 21 will be omitted.

A first pixel 411 includes a total of six photoelectric conversion units 411a to 411f segmented into three parts (integer m1=3) in the X direction and two parts (integer n1=2) in the Y direction, as in the second embodiment. The application purpose of the outputs of the first pixel 411 is the same as that of the first pixel described in the first and second embodiments. Note that the other pixels having the same structure and arranged in the image sensor 107 will also be referred to as the first pixels 411 hereinafter.

Second pixels 421 are discretely arranged among the first pixels 411 in accordance with a predetermined array rule. The second pixel 421 includes a total of four photoelectric conversion units 421a to 421d segmented into four parts (integer m2=4) in the X direction but not segmented (integer n2=1) in the Y direction. Out of the photoelectric conversion units 421a to 421d of each second pixel 421, the regions of the two photoelectric conversion units at the center have a small X-direction size, and the regions of the two outer photoelectric conversion units have a large X-direction size. The connected shape of the photoelectric conversion units 421a to 421d is square. The application purpose of the outputs of the second pixel 421 is the same as that of the second pixel described in the first and second embodiments. Note that the pixels having the same structure and arranged in the image sensor 107 will also be referred to as the second pixels 421 hereinafter.

The second pixel 421 is a pixel for pupil division in the X direction and is used for an object having a luminance distribution in the X direction, that is, an object having a vertical-striped pattern. To the contrary, a third pixel 422 is a pixel for pupil division in the Y direction and is used for an object having a luminance distribution in the Y direction, that is, an object having a lateral-striped pattern. The third pixel 422 also includes four photoelectric conversion units 422a to 422d segmented in the Y direction. The pattern is equivalent to that of the second pixel 421 rotated by 90°, and a detailed description thereof will be omitted. The connection shape of the photoelectric conversion units is square in all of the first to third pixels. A suitable one of the second pixel 421 and the third pixel 422 is used in accordance with the luminance distribution pattern of a focus detection target object, thereby reducing the probability that focus detection is impossible.

The image sensor of the third embodiment is especially suitable when the change in the exit pupil distance of the applied photographing optical system is small. When the change in the exit pupil distance of the photographing optical system, which occurs at the time of lens exchange or the zoom operation, is small, the relative decentering amount between the photoelectric conversion units and the exit pupil at the periphery of the image capturing region described with reference to FIGS. 11 to 13 of the first embodiment is also small. Hence, the signals for focus detection can reliably be obtained even when the number of segments of the second pixel 421 is smaller. Decreasing the number of segments allows to decrease the amount of information to be read and further speed up pixel signal read. In addition, since the pixel structure is simple, the manufacturing process becomes simple, and the variation in the characteristics can effectively be reduced.

Note that in the third embodiment, a 3D image can be created basically using the same addition method as that described with reference to FIGS. 22A to 22C of the second embodiment, and a detailed description thereof will be omitted.

As described above, according to the third embodiment, the number of segments of photoelectric conversion units is minimized in the second and third pixels. This allows to decrease the information amount and thus speed up signal read. In addition, since the second and third pixels have a simple pixel structure, the yield in the manufacturing process can be improved, and the variation in the characteristics of the image sensor can be reduced.

In the above-described first to third embodiments, the first pixel is divided into two or three parts in the X direction and two parts in the Y direction. However, the present invention is not limited to this. The number of segments need not always be 2 or 3 and can be any integer larger than 1.

In the above-described first to third embodiments, the number of segments of the second and third pixels is 4 or 6. However, the present invention is not limited to this. The number of segments only need be at least twice the smaller one of the numbers of X- and Y-direction segments of the first pixel.

In the above-described first to third embodiments, the image sensor includes the first, second, and third pixels. However, to widen the focus detectable defocus range and improve the detection accuracy in the near in-focus state, the image sensor may be provided with only one of the second pixel group and the third pixel group, and the other group may be replaced with the first pixels. For example, when the third pixels are replaced with the first pixels, the irregularity of the pixel array is reduced, resulting in a simpler image sensor structure. In addition, since the ratio of the first pixels rises, the number of pixels to be interpolated upon creating a 3D image decreases, and the accuracy of 3D information can be improved. On the other hand, the absence of the third pixels may lower the focus detection capability in a largely blurred scene. However, since the final in-focus determination can be done using the first pixels, the in-focus accuracy does not lower.

<Fourth Embodiment>

In the above first to third embodiments, the segmentation pattern of the photoelectric conversion units of each pixel and the method of selecting the photoelectric conversion units at the time of focus detection have been described. The fourth embodiment to be described below is configured to improve the in-focus accuracy using an image sensor of the present invention.

Figure 24:
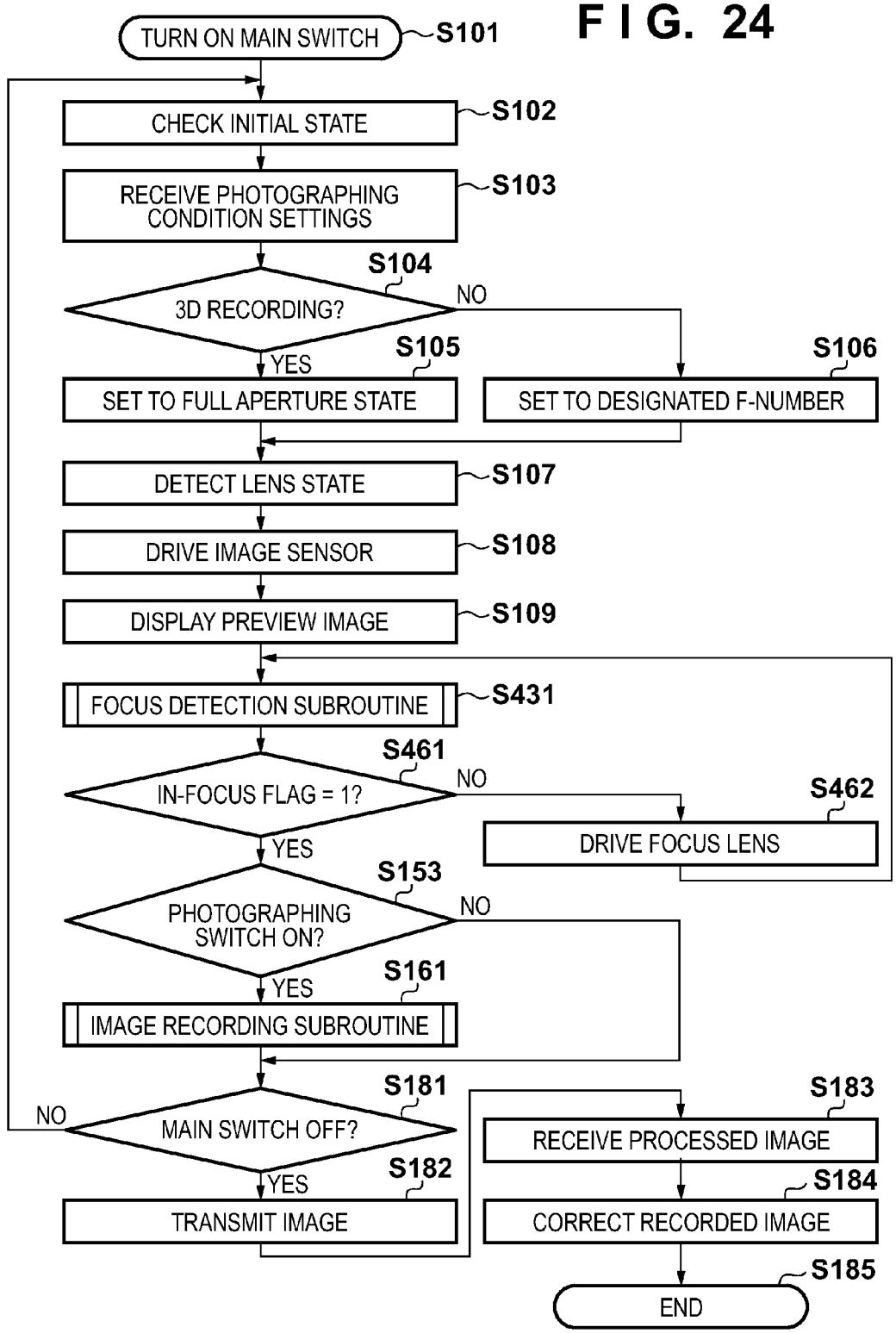
FIG. 24 is a flowchart showing the main procedure of a camera at the time of photographing according to a fourth embodiment.
Figure 25:
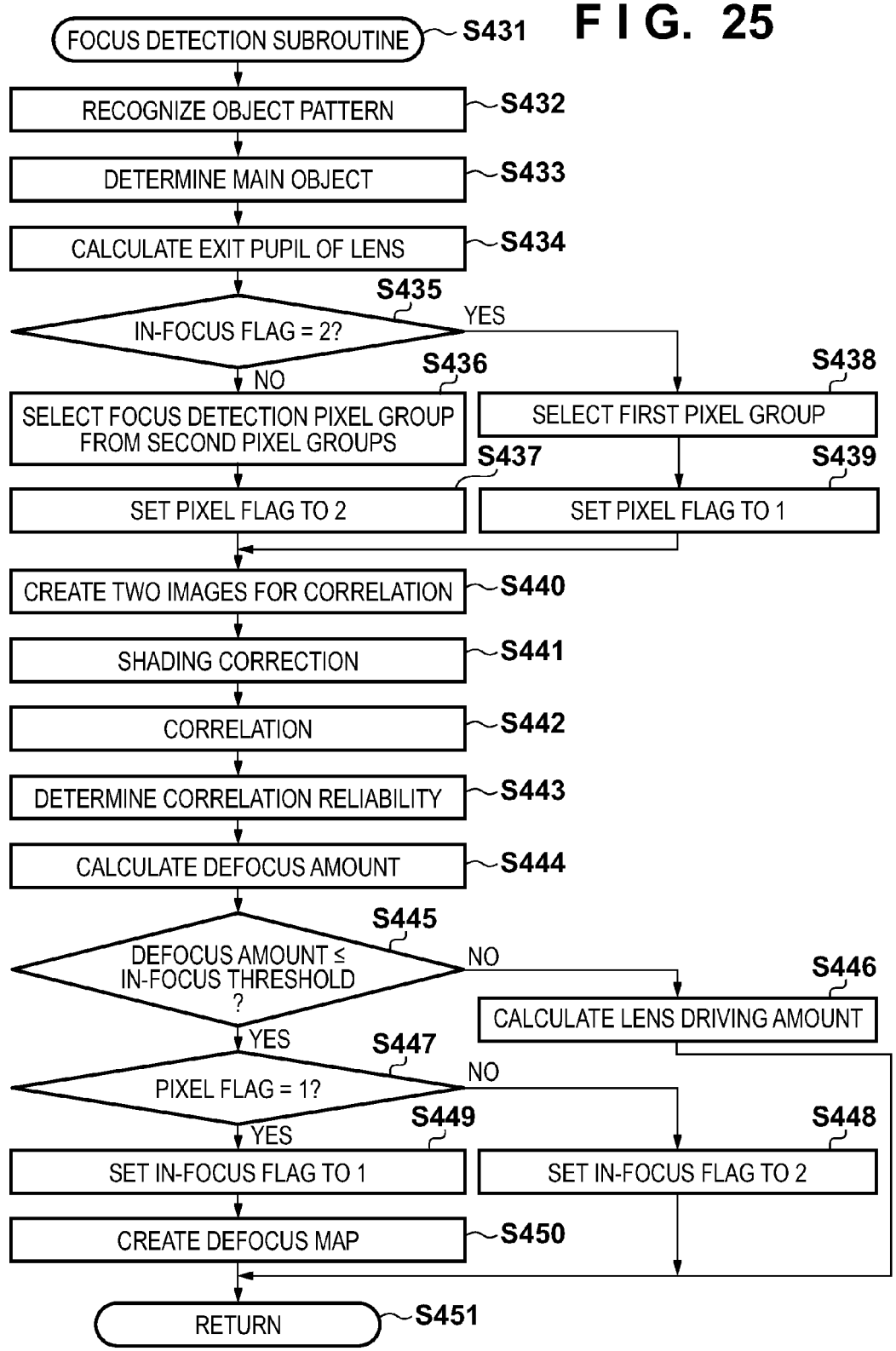
FIG. 25 is a flowchart of a focus detection subroutine according to the fourth embodiment.

FIG. 24 is a flowchart of the main procedure representing a procedure of photographing processing according to the fourth embodiment. FIG. 25 is a flowchart of a focus detection subroutine to be performed in step S431 of FIG. 24. In the fourth embodiment, an image sensor 107 having the same arrangement as that of the first embodiment described with reference to FIGS. 1 to 17B is used. However, the image sensor of the second or third embodiment may be used. The main procedure and the focus detection subroutine of the photographing processing are partially different from the main procedure in FIG. 18 and the focus detection subroutine in FIG. 19 described in the first embodiment. Hence, the same step numbers denote the same parts, and a detailed description thereof will be omitted.

The main procedure of photographing processing will be described. In the main procedure shown in FIG. 24, the user turns on the power switch of the camera in step S101. In steps S102 to S109, a CPU 121 performs operation check of the members in the camera, initialization, photographing condition setting, and the like. In step S431, the focus detection subroutine shown in FIG. 25 is executed.

In step S461, in-focus flag state determination corresponding to in-focus determination is done. The in-focus flag represents whether the defocus amount calculated by focus detection calculation is equal to or smaller than a threshold at which the state can be regarded as in-focus. The in-focus flag can take three values "0", "1", and "2". The in-focus flag is first initialized to "0". As will be described later in the focus detection subroutine shown in FIG. 25, when focus detection is performed using a first pixel group 211, and the in-focus state is determined, "1" is stored in the in-focus flag. If focus detection is performed using one of second pixel groups 221 to 223, and the in-focus state is determined, "2" is stored in the in-focus flag. In the fourth embodiment, only when "1" is stored in the in-focus flag, the process can advance from step S461 to step S153. On the other hand, the state of the in-focus flag is determined in step S461, and if the value is determined to be "0" or "2", the focus lens is driven in step S462. Then, the process returns to the focus detection subroutine of step S431 to repetitively perform focus detection.

If the in-focus flag is determined to be "1", that is, the in-focus state is determined in step S461, the process advances to step S153 to determine whether the photographing switch is turned on. If the photographing switch is turned on, image recording is executed in step S161. If the photographing switch is not turned on, the process advances to step S181 without executing step S161. In step S181, the CPU 121 determines the state of the main switch. If the main switch remains on, steps S102 to S461 are repetitively executed. If the main switch is off, steps S182 to S184 are executed, and photographing ends.

The difference between the first embodiment and the fourth embodiment will be described. In the first embodiment shown in FIG. 18, as can be seen from the flow of steps S131 to S153, even if the focus detection result indicates out-of-focus, the process directly advances to step S153 after execution of focus lens driving. Hence, as far as the photographing switch is turned on in step S153, the process can advance to photographing, that is, the image recording subroutine of step S161 even if the in-focus state is not guaranteed. To the contrary, in the fourth embodiment shown in FIG. 24, as can be seen from the flow of steps S431 to S153, if the focus detection result indicates out-of-focus, the process returns to the focus detection subroutine after execution of focus lens driving. As a result, the process advances to the image recording subroutine of step S161 after the in-focus state is confirmed in the focus detection subroutine.

The focus detection subroutine will be described with reference to FIG. 25. In step S432, the object pattern is recognized from the preview image, and face image determination, contrast analysis of the entire photographing screen, and the like are performed. In step S433, the main object to be in focus is determined based on the recognition result in step S432. In step S434, the exit pupil of the photographing optical system is calculated based on the lens information acquired in step S107 of FIG. 24. More specifically, the size of the exit pupil and its distance from the image plane are calculated, and vignetting for each image height is calculated.

In step S435, the in-focus flag is determined. The in-focus flag represents the in-focus state at the time of in-focus operations, as described concerning step S461 of FIG. 24. The in-focus flag is defined to store "0" if the in-focus state is not obtained, "1" if the in-focus state is obtained using the first pixel group 211, and "2" if the in-focus state is obtained using one of the second pixel groups 221 to 223 at the time of step S461. If step S435 is executed for the first time in the series of in-focus operations, the process advances to step S436 because the in-focus flag has been initialized to "0". In step S436, a pixel group which is less affected by vignetting and suitable for focus detection is selected in each focus detection area based on the exit pupil information calculated in step S434. In this case, the pixel group is selected from the second pixel groups 221 to 223. For example, one of the second pixel groups 221, 222, and 223 is selected as described with reference to FIGS. 11 to 13 used in the first embodiment. In step S437, a flag representing the type of the pixel group selected for focus detection is set. Since one of the second pixel groups 221 to 223 is selected, the pixel flag is set to "2". In step S440, a pair of images to be used for correlation is created using the outputs of two photoelectric conversion units to the center in each pixel of the selected second pixel group.

In step S441, so-called shading correction is performed for the created focus detection signals to reduce the unbalance of the light amounts caused by vignetting. This allows to reduce the strength difference between two images and improve the focus detection accuracy. In step S442, correlation is performed to calculate a lateral shift amount u of the two images that have undergone the shading correction. In step S443, the reliability of the image shift detection result is determined based on the level of matching between the two images calculated in the correlation process of step S442. A value with a low reliability is not employed.

In step S444, the defocus amount is calculated using equation (1) from the reliable image shift amount u obtained in steps S442 and S443 and base-line lengths θ of the pixels used for focus detection.

In step S445, it is determined whether the defocus amount calculated in step S444 is equal to or smaller than an in-focus threshold. As the in-focus threshold, normally, the permissible depth on the image plane is employed. Let δ be the size of the permissible circle of confusion, and F be the f-number of the photographing optical system. In this case, a value calculated by F×δ is generally used as the permissible depth, that is, the in-focus threshold. Hence, if the defocus amount exceeds the in-focus threshold, the process advances from step S445 to step S446 to calculate the focus lens driving amount. The process then returns from step S451 to the main routine.

The operation of the main routine after the return will be explained. When the process returns to the main routine shown in FIG. 24 after execution of the focus detection subroutine of step S431, the in-focus flag is determined in step S461. At this point of time, the in-focus flag is "0". Hence, the focus lens is driven to cancel the detected defocus amount, and the focus detection subroutine of step S431 is executed again.

Upon determining in step S445 that the defocus amount is equal to or smaller than the in-focus threshold, the process advances to step S447. In step S447, the pixel flag is determined. That is, the type of the pixel group used in the focus detection immediately before is determined. The pixel flag is "2" because one of the second pixel groups 221 to 223 is selected in the first focus detection. Hence, the process advances from step S447 to step S448 to set the in-focus flag to "2". That is, it is determined at this point of time that the in-focus state is obtained as the result of the in-focus operation using one of the second pixel groups 221 to 223. The process thus returns to the main routine via step S451.

The operation of the main routine after the return will be explained again. When the process returns to the main routine shown in FIG. 24 after execution of the focus detection subroutine of step S431, the in-focus flag is determined in step S461. At this point of time, the in-focus flag is "2". Hence, the process advances to step S462. In this case, the defocus amount is equal to or smaller than the in-focus threshold, that is, a state regarded as in-focus has been obtained as the result of focus detection using one of the second pixel groups 221 to 223. Hence, the focus lens driving instruction is actually neglected. The process returns to step S431 to execute the focus detection subroutine again.

An operation of executing the focus detection subroutine when the in-focus flag is "2" will be described next. Steps S431 to S434 are executed, and the in-focus flag is determined in step S435. Since the in-focus flag is "2", the process advances to step S438. In step S438, the first pixel group 211 is selected as the focus detection pixels. In step S439, the flag representing the type of the pixel group selected for focus detection is set. Since the first pixel group 211 is selected, the pixel flag is set to "1". In step S440, the outputs of two photoelectric conversion units adjacent in the Y-axis direction are added in each pixel of the first pixel group 211 to create a pair of images that divides the pupil in the X direction for correlation.

In step S441, so-called shading correction is performed for the created focus detection signals to reduce the unbalance of the light amounts caused by vignetting. This allows to reduce the strength difference between two images and improve the focus detection accuracy. In step S442, correlation is performed to calculate the lateral shift amount u of the two images that have undergone the shading correction. In step S443, the reliability of the image shift detection result is determined based on the level of matching between the two images calculated in the correlation process of step S442. A value with a low reliability is not employed. In step S444, the defocus amount is calculated using equation (1) from the reliable image shift amount u obtained in steps S442 and S443 and the base-line lengths θ of the pixels used for focus detection. In step S445, it is determined whether the defocus amount calculated in step S444 is equal to or smaller than the in-focus threshold. If the defocus amount exceeds the in-focus threshold, the process advances from step S445 to step S446 to calculate the focus lens driving amount. The process then returns from step S451 to the main routine.

On the other hand, upon determining in step S445 that the defocus amount is equal to or smaller than the in-focus threshold, the process advances to step S447. In step S447, the pixel flag is determined. That is, the type of the pixel group used in the focus detection immediately before is determined. The pixel flag is "1" because the first pixel group 211 is selected. Hence, the process advances from step S447 to step S449 to set the in-focus flag to "1". That is, it is determined at this point of time that the in-focus state is obtained as the result of the in-focus operation using the first pixel group 211. In step S450, the defocus map in the entire photographing region is created. The process returns to the main routine via step S451.

The operation of the main routine after the return will be explained. When the process returns to the main routine shown in FIG. 24 after execution of the focus detection subroutine of step S431, the in-focus flag is determined in step S461. At this point of time, the in-focus flag is "1". Hence, the process can advance to step S153. In step S153, the state of the photographing switch is determined. If the switch is on, the image recording subroutine is executed in step S161. Steps S182 to S184 are further executed, and the photographing operation ends.

As described above, according to the fourth embodiment, focus detection is performed first using the second pixel group with a small base-line length in pupil division and also a small pupil width. Hence, focus detection is possible even when the defocus amount is large in the initial state. Next, focus detection is performed using the first pixel group with a large base-line length in pupil division. Hence, more accurate focus detection is possible. In the first pixel group, the pupil area at the time of focus detection is large, and a sufficient light amount can be obtained. For this reason, accurate focus detection can be performed even for a low-luminance object.

In addition, since image recording is permitted after the in-focus state is confirmed using the first pixel group, a high definition image in focus can be obtained.

Note that in the above-described fourth embodiment, one of the second pixel groups 221 to 223 is used. However, if it is determined as the result of object pattern recognition of step S432 that the object has a luminance difference in the vertical direction like a lateral-striped pattern, third pixel groups 224 to 226 may be used in place of the second pixel groups 221 to 223. When one of the third pixel groups 224 to 226 is used, "2" may be used as the pixel flag, or "3" may newly be set. In addition, "2" may be used as the in-focus flag, or "3" may newly be set. In either case, the same processing is possible.

<Fifth Embodiment>

In the above-described fourth embodiment, focus detection is performed first using one of the second pixel groups 221 to 223 having a small base-line length, and then performed using the first pixel group 211 having a large base-line length. In the fifth embodiment to be described below, a plurality of focus detection results obtained using pixel groups having different base-line lengths are multiplied by weighting coefficients based on the reliability of the results and composited, or a reliable result is time-serially employed from a plurality of results.

FIGS. 26A and 26B explain a plurality of base-line lengths of an imaging pixel according to the fifth embodiment. An image sensor 107 used in the fifth embodiment has the same arrangement as that of the image sensor of the first embodiment except the photoelectric conversion unit selection method in the focus detection procedure.

FIG. 26A shows the photoelectric conversion units of a first pixel 211. FIG. 26B shows the photoelectric conversion units of a second pixel 222. Referring to FIG. 26A, when performing focus detection by dividing the pupil in the X-axis direction, a pair of images for correlation is created using the sum signal of the photoelectric conversion units corresponding to pupil projected images EP1a and EP1b and the sum signal of the photoelectric conversion units corresponding to pupil projected images EP1c and EP1d. The base-line length at this time (more strictly, angle converted value viewed from the image plane) is θ2.

On the other hand, referring to FIG. 26B, a pair of images for correlation is created from the photoelectric conversion units corresponding to pupil projected images EP22b and EP22c. The base-line length at this time is θ1. A pair of images for correlation can also be created from the photoelectric conversion units corresponding to pupil projected images EP22a and EP22d. The base-line length at this time is θ3. That is, in the fifth embodiment, three kinds of focus detection signals having different base-line lengths are used for focus detection. The base-line lengths of the signals hold a relationship represented by $$\theta 1 < \theta 2 < \theta 3 \quad (5)$$

Note that although FIG. 26B illustrates the photoelectric conversion units of the second pixel 222, the first pixel 211 and a third pixel 225 also have the same relationship except the pupil division direction, and the output signals of these pixels can be processed like the second pixel 222.

The advantages and disadvantages of the three kinds of focus detection signals and weighting coefficients set based on them will be described next.

In general, when the base-line length in pupil division is large, the relative lateral shift amount of the pair of images for the unit defocus amount is large. Hence, the focus detection accuracy is high. On the other hand, when the base-line length is large, the lateral shift amount between the two images in the large defocus state is excessive, and the probability that focus detection is impossible also rises. In addition, when the base-line length is large, a level difference readily occurs between the two images due to vignetting of the photographing optical system. A focus detection error occurs depending on the degree of vignetting.

FIG. 27A shows weighting coefficients corresponding to f-numbers for the results obtained from the three kinds of focus detection signals. DEF(θ1) to DEF(θ3) represent defocus amounts calculated from the focus detection signals having the three kinds of base-line lengths described with reference to FIGS. 26A and 26B. F2.8 to F11 are f-numbers of the photographing optical system at the time of focus detection. Numbers 0 to 7 in the table represent weighting coefficients C(FN) for the combinations of the defocus amounts and the f-numbers. In the fifth embodiment, three kinds of defocus amounts are obtained. The three weighting coefficients corresponding to the defocus amounts are set such that the sum of the weighting coefficients is 10 for every f-number. The smaller the f-number is, that is, the larger the exit pupil of the photographing optical system is, the larger the weighting coefficient for a focus detection result with a large base-line length is. Conversely, the larger the f-number is, that is, the larger the vignetting of the photographing optical system is, the larger the weighting coefficient for a focus detection result with a small base-line length is.

FIG. 27B shows weighting coefficients corresponding to defocus amounts for the results obtained from the three kinds of focus detection signals. In the fifth embodiment, the defocus amounts calculated from the focus detection signals are divided into four sections by the magnitude of the absolute value. The sections are shown in the uppermost line of the table. |Def| represents the absolute value of a detected defocus amount. Numbers 0 to 7 in the table represent weighting coefficients C(DF) in the sections to which the three kinds of defocus amounts DEF(θ1) to DEF(θ3) belong. In FIG. 27B as well, the coefficients are set such that the sum of the coefficients is 10 in each defocus section. When the defocus amount is small, the weighting of the result obtained by photoelectric conversion units having a large base-line length is set large. Conversely, since the larger the defocus amount is, the larger the relative lateral shift amount of two images is, the weighting of the focus detection result with a small base-line length is set large.

A final defocus amount DEF is calculated by multiplying the three defocus amounts obtained from the pairs of focus detection signals with different base-line lengths by the weighting coefficients defined in the above-described manner using $$DEF = DEF(\theta 1) \times C1(FN) \times C1(DF) + \\ DEF(\theta 2) \times C2(FN) \times C2(DF) + DEF(\theta 3) \times C3(FN) \times C3(DF) \quad (6)$$

Focus lens driving or in-focus determination is done based on the defocus amount DEF.

Figure 28:
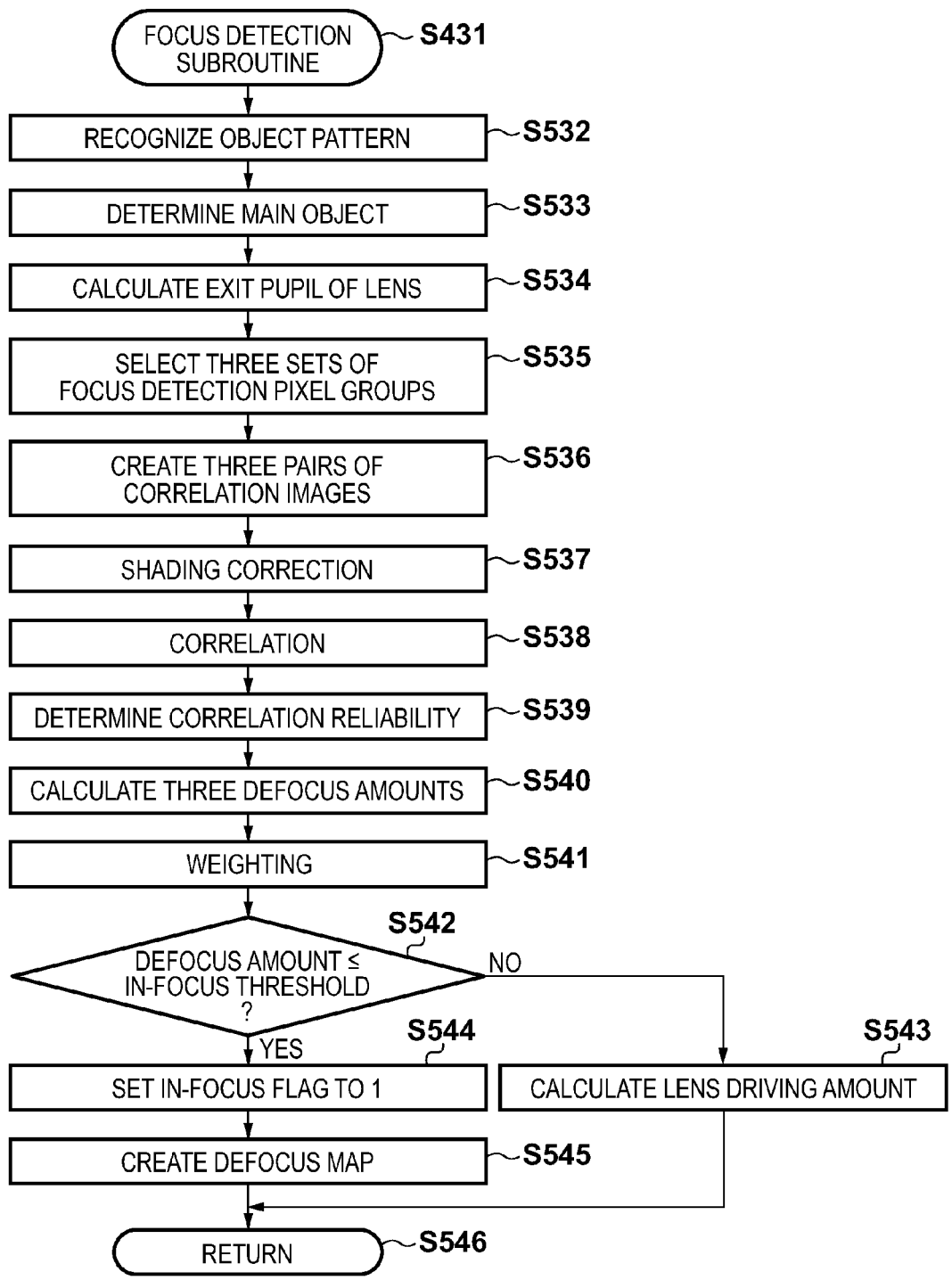
FIG. 28 is a flowchart of a focus detection subroutine according to the fifth embodiment.

FIG. 28 is a flowchart of a focus detection subroutine according to the fifth embodiment. Note that in the fifth embodiment, the same camera and image sensor as those of the first to fourth embodiments are used. The main procedure at the time of photographing of the camera is the same as in FIG. 24 described in the fourth embodiment, and a description of the same parts will be omitted.

In the focus detection subroutine of FIG. 28, first, in step S532, the object pattern is recognized from the preview image, and face image determination, contrast analysis of the entire photographing screen, and the like are performed. In step S533, the main object to be in focus is determined based on the recognition result in step S532. In step S534, the exit pupil of the photographing optical system is calculated based on the lens information acquired in step S107 of FIG. 24. More specifically, the size of the exit pupil and its distance from the image plane are calculated, and vignetting for each image height is calculated.

In step S535, three sets of focus detection pixel groups that are present in the focus detection area are selected. The three sets indicate the photoelectric conversion unit output groups corresponding to the three kinds of base-line lengths described with reference to FIGS. 26A and 26B. In step S536, three pairs of images for correlation are created from the outputs of the photoelectric conversion units of the selected pixels.

In step S537, so-called shading correction is performed for the created three pairs of focus detection signals to reduce the unbalance of the light amounts caused by vignetting. This allows to reduce the strength difference between two images and improve the focus detection accuracy. In step S538, correlation is performed to calculate a lateral shift amount u of the two images that have undergone the shading correction. In step S539, the reliability of the image shift detection result is determined based on the level of matching between the two images calculated in the correlation process of step S538. In step S540, three defocus amounts are calculated using equation (1) from the image shift amount u obtained in step S538 and base-line lengths θ of the pixels used for focus detection. In step S541, weighting by equation (6) is performed for the three obtained defocus amounts, thereby obtaining the final defocus amount.

In step S542, it is determined whether the defocus amount calculated in step S541 is equal to or smaller than an in-focus threshold. If the defocus amount exceeds the in-focus threshold, the process advances from step S542 to step S543 to calculate the focus lens driving amount. The process then returns from step S546 to the main routine.

On the other hand, upon determining in step S542 that the defocus amount is equal to or smaller than the in-focus threshold, the process advances to step S544 to set the in-focus flag to "1". In step S545, the defocus map is created. In step S546, the process returns to the main routine.

The operation of the main routine after the return will be explained. When the process returns to the main routine shown in FIG. 24 after execution of the focus detection subroutine of FIG. 28, the in-focus flag is determined in step S461. If the in-focus flag is not "1", that is, represents out-of-focus, the focus lens is driven in step S462. Then, the process returns to step S431 to execute the focus detection subroutine again.

On the other hand, upon determining in step S461 that the in-focus flag is "1", the process advances to step S153 to perform image recording, image transmission, or the like, and the photographing operation ends.

As described above, according to the fifth embodiment, a plurality of defocus amounts are calculated from a plurality of kinds of focus detection signals having different base-line lengths. The defocus amounts are weighted based on the photographing conditions such as the f-number of the photographing optical system or the focus state such as the calculated defocus amounts, thereby calculating the final defocus amount. Since focus detection calculation can be done while emphasizing focus detection signals having a base-line length suitable for the photographing conditions and the focus state, accurate focus detection can be performed always.

<Modifications of Fifth Embodiment>

In the above-described fifth embodiment, a result obtained by weighting a plurality of focus detection signals is used as final focus detection information. In modifications of the fifth embodiment to be described below, a result assumed to be most reliable is alternatively selected from a plurality of focus detection results.

FIG. 29 shows examples of weighting coefficients according to a modification and corresponds to FIG. 27A described above. In FIG. 27A, the weighting coefficients of the three kinds of focus detection signals are finely set in accordance with the f-number of the photographing optical system. In the modification shown in FIG. 29, one weighting coefficient of the three kinds of signals is set to "1", and the remaining two coefficients are set to "0", thereby alternatively selecting a result assumed to be most reliable. In this modification, since the alternative selection can be done before the phase difference detection calculation of the pair of images, no wasteful calculation need be performed. Hence, the focus detection calculation speeds up, and the calculation program becomes simpler.

FIG. 30 shows examples of weighting coefficients according to another modification and corresponds to FIG. 27B described above. In FIG. 27B, the weighting coefficients of the three kinds of focus detection signals are finely set in accordance with the calculated defocus amount. In the modification shown in FIG. 30, one weighting coefficient of the three kinds of signals is set to "1", and the remaining two coefficients are set to "0", thereby alternatively selecting a result assumed to be most reliable. In this modification as well, since the weighting is simplified, the focus detection calculation speeds up, and the calculation program becomes simpler.

In the fifth embodiment and the modifications thereof, the signals of pixels corresponding to three kinds of base-line lengths are used. Using one of them may be omitted, and only two desired kinds of signals may be used. Conversely, the arrangement may be applied to an embodiment including pixels corresponding to four or more kinds of base-line lengths. For example, in the example described above with reference to FIG. 26B, use of the photoelectric conversion units having the base-line length θ3 in the second pixel group 221 may be prohibited.

<Sixth Embodiment>

In the above-described fourth embodiment, focus detection is performed first using the second pixel groups 221 to 223 having a small base-line length, and then performed using the first pixel group 211 having a large base-line length. In the sixth embodiment to be described below, this concept is expanded so that a plurality of focus detection results obtained with different base-line lengths are time-serially appropriately selected or composited even when the number of base-line lengths exceeds 2.

FIG. 31 shows examples of weighting coefficients according to the sixth embodiment. In the sixth embodiment, the weighting coefficients are switched for the results obtained from the three kinds of focus detection signals in accordance with the number of times of focus detection.

DEF(θ1) to DEF(θ3) represent defocus amounts calculated from the focus detection signals having the three kinds of base-line lengths described with reference to FIGS. 26A and 26B. In addition, "first time" to "third time" represent the number of times of focus detection performed until an in-focus state is obtained. Numbers 0 and 1 in the table represent weighting coefficients C(SN) for the focus detection counts. A final defocus amount DEF is calculated by multiplying the three defocus amounts obtained from the pairs of focus detection signals with different base-line lengths by the weighting coefficients defined in the above-described manner using $$DEF = DEF(\theta 1) \times C1(SN) + DEF(\theta 2) \times C2(SN) + DEF(\theta 3) \times C3(SN) \quad (7)$$

In the sixth embodiment, the weighting coefficient is 0 or 1. Hence, a predetermined one of the plurality of pieces of focus detection information is alternatively selected in focus detection of a predetermined time. That is, the focus detection signals by the base-line length θ1 are selected in the first focus detection, the focus detection signals by the base-line length θ2 are selected in the second focus detection, and the focus detection signals by the base-line length θ3 are selected in the third focus detection.

Figure 32:
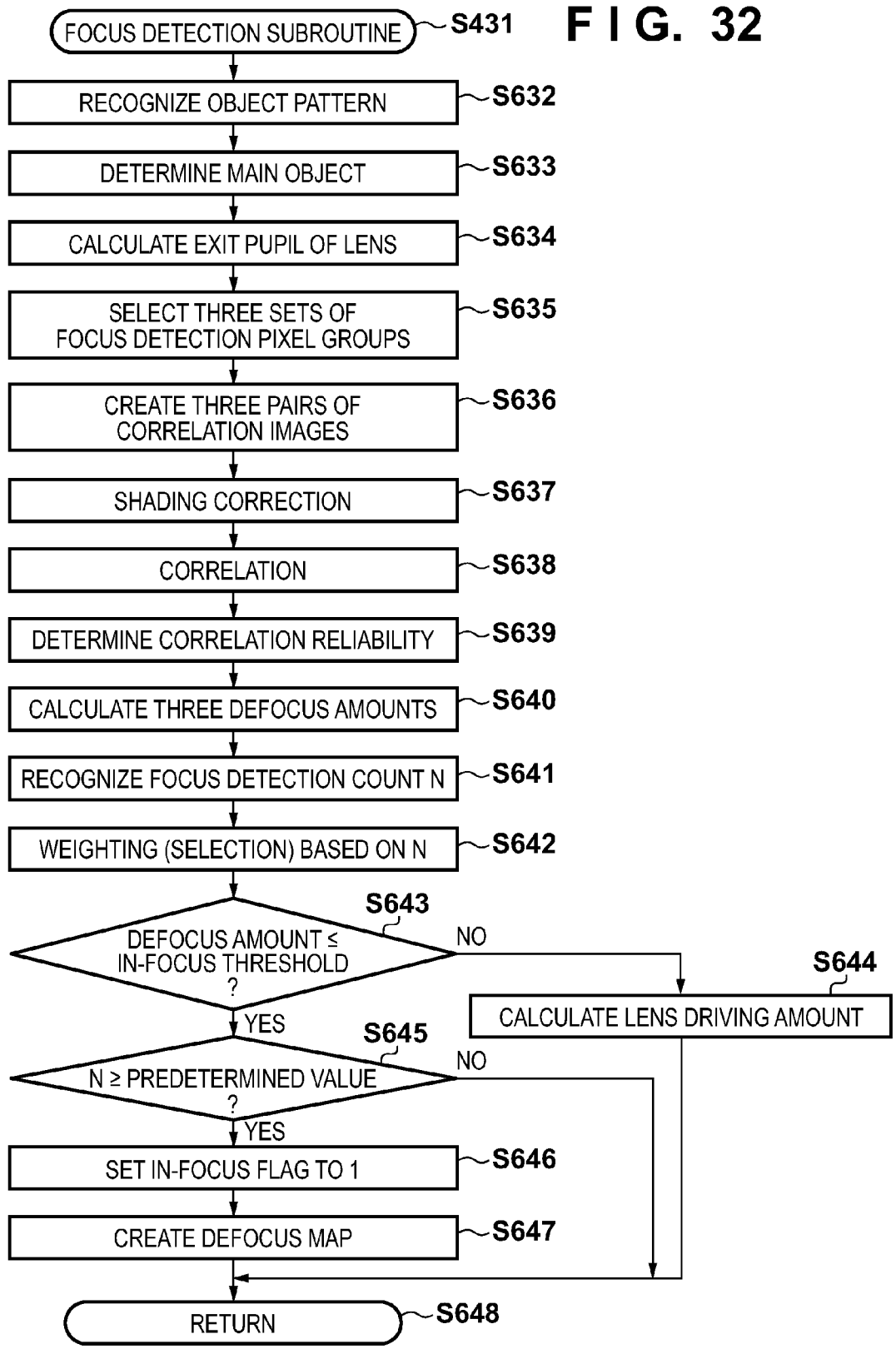
FIG. 32 is a flowchart of a focus detection subroutine according to the sixth embodiment.

FIG. 32 is a flowchart of a focus detection subroutine according to the sixth embodiment. Note that in the sixth embodiment, the same camera and image sensor as those of the first to fifth embodiments are used. The main procedure at the time of photographing of the camera is the same as in FIG. 24 described in the fourth embodiment, and a description of the same parts will be omitted.

In the focus detection subroutine of FIG. 32, first, in step S632, the object pattern is recognized from the preview image, and face image determination, contrast analysis of the entire photographing screen, and the like are performed. In step S633, the main object to be in focus is determined based on the recognition result in step S632. In step S634, the exit pupil of the photographing optical system is calculated based on the lens information acquired in step S107 of FIG. 24. More specifically, the size of the exit pupil and its distance from the image plane are calculated, and vignetting for each image height is calculated.

In step S635, three sets of focus detection pixel groups that are present in the focus detection area are selected. The three sets indicate the photoelectric conversion unit output groups corresponding to the three kinds of base-line lengths described with reference to FIGS. 26A and 26B. In step S636, three pairs of images for correlation are created from the outputs of the photoelectric conversion units of the selected pixels.

In step S637, so-called shading correction is performed for the created three pairs of focus detection signals to reduce the unbalance of the light amounts caused by vignetting. This allows to reduce the strength difference between two images and improve the focus detection accuracy. In step S638, correlation is performed to calculate a lateral shift amount u of the two images that have undergone the shading correction. In step S639, the reliability of the image shift detection result is determined based on the level of matching between the two images calculated in the correlation process of step S638. In step S640, three defocus amounts are calculated using equation (1) from the image shift amount u obtained in step S638 and base-line lengths θ of the pixels used for focus detection. In step S641, an execution count N of focus detection calculation until the in-focus state is obtained in the series of in-focus operations is recognized. The execution count is defined to be 1 when all three sets of focus detection calculations for the three kinds of base-line lengths have been executed.

In step S642, weighting by equation (7) is performed for the three obtained defocus amounts, thereby obtaining the final defocus amount.

In step S643, it is determined whether the defocus amount calculated in step S642 is equal to or smaller than an in-focus threshold. If the defocus amount exceeds the in-focus threshold, the process advances from step S643 to step S644 to calculate the focus lens driving amount. The process then returns from step S648 to the main routine.

On the other hand, upon determining in step S643 that the defocus amount is equal to or smaller than the in-focus threshold, the process advances to step S645. In step S645, the value of the focus detection count N is determined. In the sixth embodiment, the process branches to YES when N has reached 3, and NO when N is 2 or less. That is, in the sixth embodiment, focus detection is performed for the three kinds of base-line lengths, and the detection results are employed sequentially from that obtained by signals with a small base-line length. Hence, when the three times of focus detection are completed, and the defocus amount is equal to or smaller than the in-focus threshold, the in-focus flag is set to "1" in step S646. In step S647, the defocus map is created. In step S648, the process returns to the main routine.

The operation of the main routine after the return will be explained next. When the process returns to the main routine shown in FIG. 24 after execution of the focus detection subroutine of FIG. 32, the in-focus flag is determined in step S461. If the in-focus flag is not "1", that is, represents out-of-focus, the focus lens is driven in step S462. Then, the process returns to step S431 to execute the focus detection subroutine again.

On the other hand, upon determining in step S461 that the in-focus flag is "1", the process advances to step S153 to perform image recording, image transmission, or the like, and the photographing operation ends.

As described above, according to the sixth embodiment, focus detection is performed first using pixels having a small base-line length, then performed using pixels having an intermediate base-line length, and finally performed using pixels having a large base-line length in the history of focus detection up to the in-focus state. Since signals suitable for each state from a large defocus amount to a small defocus amount are used, no wasteful calculation is performed, and accurate focus detection is possible.

<Modification of Sixth Embodiment>

In the above-described sixth embodiment, predetermined signals are alternatively selected in accordance with the number of times (history) of focus detection. In the modification of the sixth embodiment to be described below, weighting coefficients according to the history are set for a plurality of focus detection results, and the plurality of results are composited.

FIG. 33 shows examples of weighting coefficients according to the modification and corresponds to FIG. 31 described above. In FIG. 31, a predetermined result is alternatively used in accordance with the focus detection history. In the modification shown in FIG. 33, at least two of the three kinds of signals are used with predetermined weights. In this case, even if focus detection using a base-line length assumed to be optimum is impossible, the defocus amount can be calculated if focus detection using another base-line length is possible. This allows to prevent a phenomenon that the number of times of focus detection until the in-focus state is obtained unnecessarily increases.

In the sixth embodiment and the modification thereof, the signals of pixels corresponding to three kinds of base-line lengths are used. Using one of them may be omitted, and only two desired kinds of signals may be used. Conversely, the arrangement may be applied to an embodiment including pixels corresponding to four or more kinds of base-line lengths.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2011-118397 filed on May 26, 2011 and 2012-045788 filed on Mar. 1, 2012, which are hereby incorporated by reference herein in their entirety.

What is claimed is:

1. An image sensor comprising:
a first imaging pixel and a second imaging pixel each of which detects an object image formed by a photographing optical system and generates a recording image,
wherein said first imaging pixel comprises a plurality of photoelectric conversion units segmented in a first direction and said second imaging pixel includes four photoelectric conversion units segmented in the first direction,
the plurality of photoelectric conversion units configured to photoelectrically convert a plurality of images formed by split light beams passing through the photographing optical system and outputting focus detection signals used to detect a phase difference,
a base-line length of photoelectric conversion units used to detect the phase difference out of the plurality of photoelectric conversion units included in said first imaging pixel is longer than a base-line length of photoelectric conversion units used to detect the phase difference out of the plurality of photoelectric conversion units included in said second imaging pixel, and
images detected by two photoelectric conversion units at a center out of the photoelectric conversion units of each of the second imaging pixels are photoelectrically converted to output the focus detection signals used to detect the phase difference,
wherein the base-line length is a separation distance between gravity centers of portions of the photoelectric conversion units included in each of said first and second imagining pixels, the portions being extracted in an exit pupil range of the photographing optical system.

2. The image sensor according to claim 1, wherein in a case where a defocus amount obtained is not more than a predetermined threshold, the phase difference is detected using the first imaging pixel, and in a case where the defocus amount exceeds the predetermined threshold, the phase difference is detected using the second imaging pixel.

3. The image sensor according to claim 1, wherein after the phase difference is detected using the second imaging pixel, the phase difference is detected using the first imaging pixel.

4. The image sensor according to claim 1, wherein each of the photoelectric conversion units of said first imaging pixel is segmented into a plurality of parts in a second direction orthogonal to the first direction, and the number of photoelectric conversion units included in the first imaging pixel equals the number of photoelectric conversion units included in the second imaging pixel.

5. The image sensor according to claim 1, wherein
the second imaging pixel includes 2n (n is an integer not less than 2) photoelectric conversion units segmented in the first direction.

6. An image capturing apparatus including an image sensor as claimed in claim 1.

7. The image sensor according to claim 5, wherein after the phase difference is detected using two photoelectric conversion units having a first base-line length and arranged inside out of the 2n photoelectric conversion units included in the second imaging pixel, the phase difference is detected using two photoelectric conversion units having a second base-line length out of the plurality of photoelectric conversion units included in the first imaging pixel, and the phase difference is then detected using two photoelectric conversion units having a third base-line length and arranged outside the two photoelectric conversion units having the first base-line length out of the 2n photoelectric conversion units included in the second imaging pixel, and the first base-line length is smaller than the second base-line length, and the second base-line length is smaller than the third base-line length.

\* \* \* \* \*